(12) United States Patent
Sekiya

(10) Patent No.: US 7,553,375 B2
(45) Date of Patent: *Jun. 30, 2009

(54) FABRICATION OF FUNCTIONAL DEVICE MOUNTING BOARD MAKING USE OF INKJET TECHNIQUE

(75) Inventor: Takuro Sekiya, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/064,125

(22) Filed: Feb. 23, 2005

(65) Prior Publication Data

US 2005/0140709 A1    Jun. 30, 2005

Related U.S. Application Data

(63) Continuation of application No. 10/386,056, filed on Mar. 12, 2003, now Pat. No. 6,918,666.

(30) Foreign Application Priority Data

Mar. 13, 2002 (JP) ............................. 2002-068033
Oct. 30, 2002 (JP) ............................. 2002-316419

(51) Int. Cl.
*B05C 11/00* (2006.01)
*B05B 15/12* (2006.01)
*B41J 2/035* (2006.01)
*B41J 2/393* (2006.01)

(52) U.S. Cl. .................... 118/62; 118/621; 118/634; 118/326; 118/681; 118/682; 118/697; 347/102; 347/68; 347/37; 347/19

(58) Field of Classification Search ................. 118/300, 118/46, 326, 634, 620, 621, 58, 323, 62, 118/63, DIG. 7, 671–681, 696–698, 631; 347/9–11, 102, 104, 106, 107, 37, 68, 19; 454/50, 53, 55; 55/DIG. 4
See application file for complete search history.

(56) References Cited

U.S. PATENT DOCUMENTS 3,060,429 A    10/1962    Winston (Continued)

FOREIGN PATENT DOCUMENTS

EP    0 753 766    1/1997

(Continued)

OTHER PUBLICATIONS

C. W. Tang, et al., "Organic Electroluminescent Diodes" Sep. 21, 1987 Appl. Phys. Lett, vo. 51, No. 12, pp. 913-915.

(Continued)

*Primary Examiner*—Yewebdar T Tadesse
(74) *Attorney, Agent, or Firm*—Oblon, Spivak, McClelland, Maier & Neustadt, P.C.

(57) ABSTRACT

An apparatus for fabricating a functional device mounting board comprises a holder for holding a substrate on which functional devices are to be formed, a jet head for ejecting a droplet containing a functional material onto the substrate, and a data input unit for supplying droplet ejection information to the jet head. The jet head ejects the droplets onto the substrate based on the droplet ejection information so as to form the functional device in the functional device forming area. The functional device is formed by allowing a volatile ingredient of the droplet, while allowing a solid component of the droplet to remain on the substrate.

16 Claims, 38 Drawing Sheets

U.S. PATENT DOCUMENTS

| | | | |
|---|---|---|---|
| 3,298,030 A | | 1/1967 | Lewis et al. |
| 3,416,153 A | | 12/1968 | Hertz et al. |
| 3,596,275 A | | 7/1971 | Sweet |
| 3,747,120 A | | 7/1973 | Stemme |
| 4,122,457 A | * | 10/1978 | Erikson et al. ............... 347/73 |
| 4,591,869 A | * | 5/1986 | Katerberg et al. ............ 347/21 |
| 5,293,182 A | | 3/1994 | Sekiya et al. |
| 5,420,618 A | | 5/1995 | Sekiya et al. |
| 5,461,403 A | * | 10/1995 | Wallace et al. ............... 347/10 |
| 5,610,637 A | | 3/1997 | Sekiya et al. |
| 5,657,060 A | | 8/1997 | Sekiya et al. |
| 5,729,257 A | | 3/1998 | Sekiya et al. |
| 5,754,202 A | | 5/1998 | Sekiya et al. |
| 5,877,786 A | | 3/1999 | Sekiya et al. |
| 5,939,130 A | * | 8/1999 | Shiraishi et al. ............... 427/9 |
| 6,039,425 A | | 3/2000 | Sekiya et al. |
| 6,193,348 B1 | | 2/2001 | Sekiya et al. |
| 6,207,948 B1 | * | 3/2001 | Yokoi et al. ............... 250/226 |
| 6,224,201 B1 | | 5/2001 | Shigemura |
| 6,227,639 B1 | | 5/2001 | Sekiya et al. |
| 6,258,405 B1 | * | 7/2001 | Yamaguchi et al. ......... 427/168 |
| 6,331,384 B1 | * | 12/2001 | Satoi ........................ 430/347 |
| 6,338,545 B1 | * | 1/2002 | Sekiya ........................ 347/47 |
| 6,430,325 B1 | * | 8/2002 | Shimoda ..................... 385/14 |
| 6,676,238 B2 | * | 1/2004 | Fujimura et al. ............. 347/11 |
| 6,723,835 B1 | * | 4/2004 | Millard et al. ............. 534/772 |
| 6,742,859 B2 | * | 6/2004 | Yonekubo et al. ............ 347/27 |
| 2001/0022637 A1 | | 9/2001 | Yu |
| 2001/0024227 A1 | | 9/2001 | Sekiya |
| 2002/0057310 A1 | | 5/2002 | Sekiya |
| 2002/0071001 A1 | | 6/2002 | Sekiya |
| 2002/0075353 A1 | | 6/2002 | Sekiya |
| 2002/0135625 A1 | * | 9/2002 | Iwasaki et al. ................ 347/9 |
| 2003/0016269 A1 | | 1/2003 | Sekiya |
| 2003/0184613 A1 | | 10/2003 | Nakamura et al. |
| 2004/0017411 A1 | | 1/2004 | Usuda |
| 2005/0140709 A1 | | 6/2005 | Sekiya |

FOREIGN PATENT DOCUMENTS

| | | | |
|---|---|---|---|
| EP | 754553 A2 | * | 1/1997 |
| EP | 0 756 932 | | 2/1997 |
| EP | 0 895 101 | | 2/1999 |
| EP | 0 976 570 | | 2/2000 |
| EP | 0 989 778 A1 | | 3/2000 |
| EP | 1 122 560 | | 8/2001 |
| JP | 03-207663 | | 9/1991 |
| JP | 04-212864 | | 8/1992 |
| JP | 2000-323276 | | 11/2000 |
| JP | 2001-060493 | | 3/2001 |
| JP | 2001-257081 | | 9/2001 |
| JP | 2001-330720 | | 11/2001 |
| JP | 2001-331120 | | 11/2001 |
| JP | 2002-22924 | | 1/2002 |
| WO | WO 01/70506 | | 9/2001 |
| WO | WO 03/023878 | | 3/2003 |

OTHER PUBLICATIONS

U.S. Appl. No. 11/063,897, filed Feb. 23, 2005, Sekiya.
U.S. Appl. No. 11/064,125, filed Feb. 23, 2005, Sekiya.
U.S. Appl. No. 11/338,692, filed Jan. 25, 2006, Sekiya et al.

* cited by examiner

FIG.36
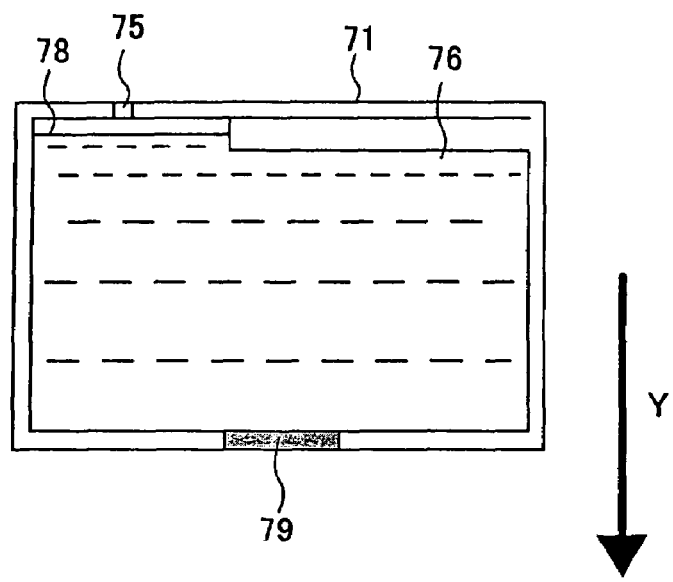
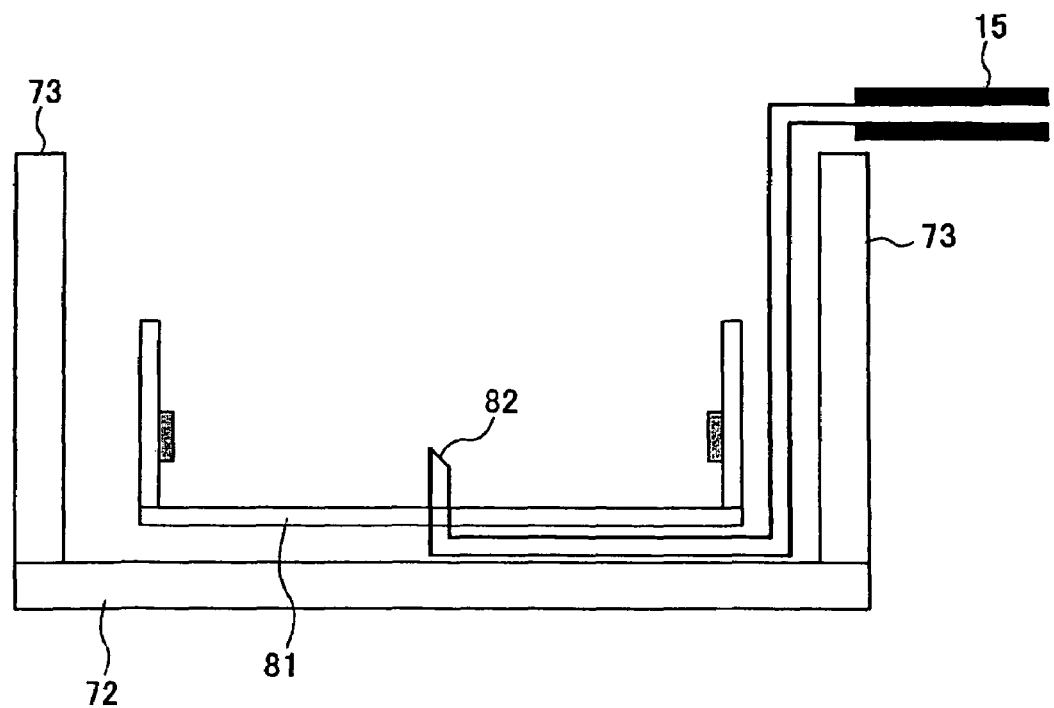

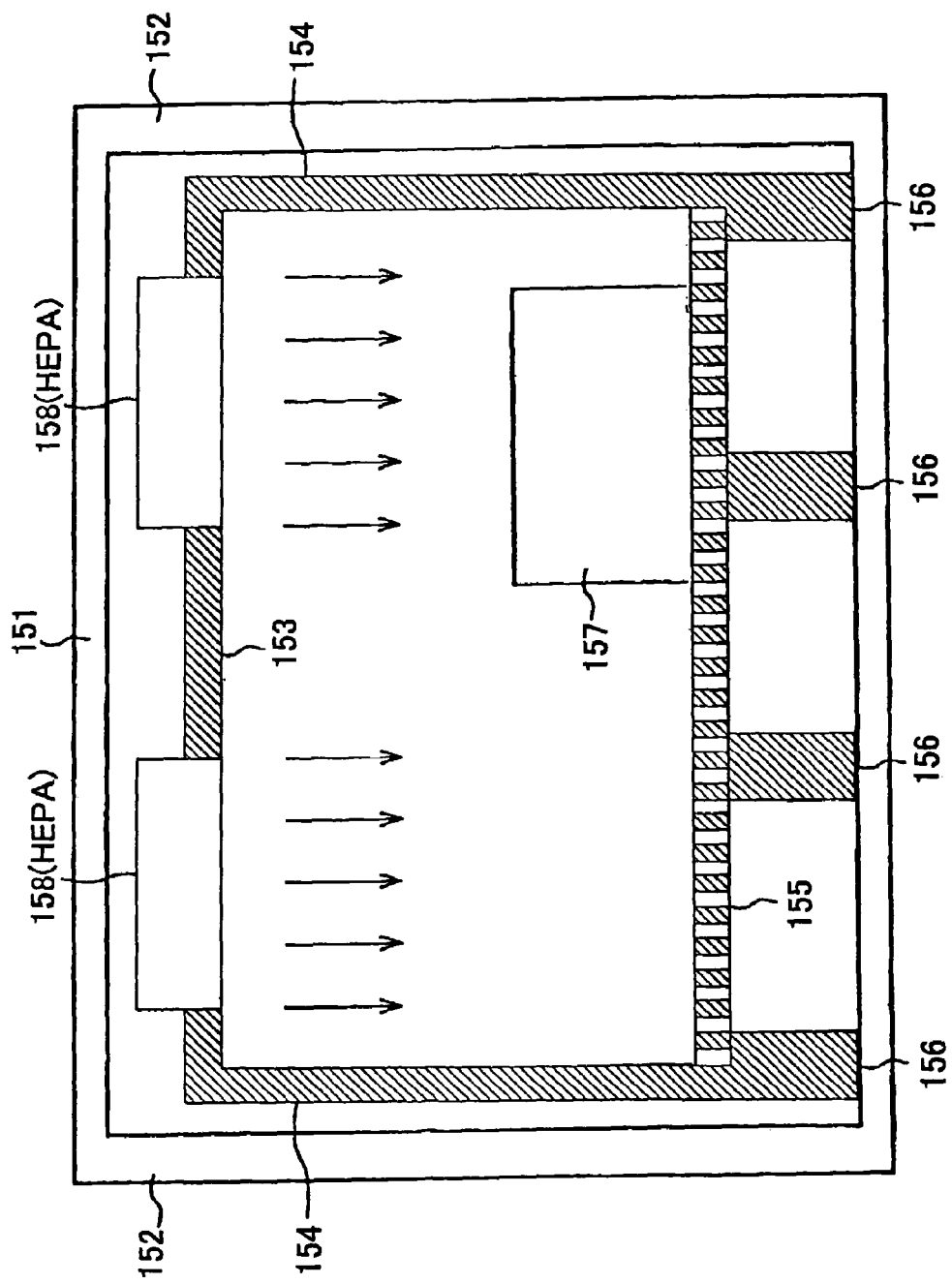

FABRICATION OF FUNCTIONAL DEVICE MOUNTING BOARD MAKING USE OF INKJET TECHNIQUE

CROSS-REFERENCE TO RELATED APPLICATIONS

This application is a continuation application of, and claims priority to, Ser. No. 10/386,056 filed Mar. 12, 2003 now U.S. Pat. No. 6,918,666 and claims priority to Japanese Patent Application 2002-068033, filed Mar. 13, 2002 and Japanese Patent Application 2002-316419, filed Oct. 30, 2002, the entire contents of which are incorporated herein by reference.

BACKGROUND OF THE INVENTION

1. Field of the Invention

The present invention generally relates to fabrication of a functional device mounting board, using an ejector to form a functional device on a substrate. More particularly, the present invention relates to an apparatus and a system for fabricating the functional device mounting board, as well as a functional device mounting board itself fabricated using the apparatus or the system.

2. Description of the Related Art

In recent years, luminescent devices (or light-emitting devices) using organic materials have been developed for use in a spontaneous luminescent display, which has been spreading in place of a liquid crystal display. In general, the luminescent device is formed using a photolithography technique to pattern a layer of a functional material into a predetermined shape. For example, it is known that an organic electroluminescent (hereinafter, referred to as "organic EL") device is fabricated by forming a layer of a low molecular-weight material by vapor deposition (or vacuum evaporation), and then patterning the layer by photolithography. See "Organic Electroluminescent Diodes", C. W. Tang and S. A. VanSlyke, Appl. Phys. Lett. 51, 913 (1987). To fabricate a color organic EL device, different luminescent materials are formed on prescribed pixels by vapor deposition. However, since vacuum evaporation and photolithography are high-cost processes requiring a number of steps, it is disadvantageous to employ these techniques to fabricate luminescent devices over a wide area.

To overcome this problem, the applicant has come across an idea that inkjet droplet ejection means can be used to place a functional material at a desired position, without employing high-cost processes, such as vacuum evaporation and photolithography. Inkjet droplet ejection means are disclosed in U.S. Pat. Nos. 3,060,429, 3,298,030, 3,596,275, 3,416,153, 3,747,120, and 5,729,257. It is expected that a technique of inkjet droplet ejection can be replaced for photolithography, and that the inkjet technique can realize more stable formation of a functional device at low cost and a high yield rate.

For example, when fabricating an organic EL device as an example of the functional device, a pattern of a hole-transporting layer and a light-emissive layer can be formed on a transparent electrode substrate by ejecting a solution, in which a hole-transporting material and a luminescent material are dissolve or dispersed in a solvent, from the inkjet head.

The same idea is disclosed in JPA2000-323276 and JAP2001-60493. However, these publications only discuss the materials for organic EL devices suitable to the inkjet method, and do not sufficiently refer to either an apparatus for forming such a functional device on a substrate using an inkjet technique, or a functional device mounting board fabricated using the inkjet technique.

Applying the inkjet technique to fabrication of functional devices is not easy because the conventional inkjet technique is limited to ejecting ink onto paper. There are still many unsolved factors concerning how to eject a solution containing a functional material onto a substrate in a stable manner. Especially, a great deal of work is required to realize a group of functional devices formed on a substrate at highly precise patterns efficiently.

SUMMARY OF THE INVENTION

Therefore, it is an object of the present invention to provide a novel apparatus for fabricating a group of functional devices on a substrate at low cost using a simple technique. This apparatus is capable of fabricating the functional devices at high precision, and accordingly, it can produce a high-quality functional device mounting board.

It is another object of the invention to guarantee safe operation even if a solution containing the functional material leaks out due to an unexpected accident.

It is still another object of the invention to prevent undesirable clog in the jet head in order to guarantee reliable ejecting operation.

It is yet another object of the invention to provide a system for fabricating a functional device mounting board.

It is yet another object of the invention to provide a functional device mounting board with a precise pattern of functional device array.

It is yet another object of the invention to provide an image display apparatus using the functional device mounting board.

To achieve the objects, in one aspect of the invention, an apparatus for fabricating a functional device mounting board is provided. The apparatus comprises (a) a holder for holding a substrate on which a functional device is to be formed, (b) a jet head for ejecting a droplet containing a functional material onto the substrate so as to form the functional device in a functional device forming area of the substrate by allowing the volatile ingredient of the droplet to vaporize, while allowing the solid component to remain on the substrate, and (c) a data input unit for supplying droplet ejection information to the jet head. The jet head ejects the droplet onto the substrate based on the droplet ejection information so as to form the functional device in the functional device forming area.

With this apparatus, functional device mounting boards can be fabricated at high precision using a simple structure.

The apparatus further has a driving unit that moves at least one of the jet head and the holder relatively to the other so as to define a droplet ejecting area of the jet head broader than the functional device forming area of the substrate. tion.

Preferably, the jet head ejects the droplet using a mechanical displacement force so that the droplet becomes spherical immediately before the droplet reaches the substrate.

Alternatively, the jet head ejects the droplet using a mechanical displacement force so that the droplet has an elongated shape along the ejecting direction without a trailing droplet, and so that the length of the elongated droplet does not exceed three times the diameter of the droplet.

These arrangements allow the apparatus to form a prescribed pattern of the functional device at a desired position on the substrate precisely.

The apparatus further comprises a reservoir positioned under the substrate for containing a solution of the functional material, and a flexible tube connecting the reservoir to the jet head.

This arrangement is advantageous as a safeguard preparing for unexpected leakage of the solution.

The apparatus further comprises maintenance equipment positioned outside the holder. The maintenance equipment caps the droplet ejecting face of the jet head, and evacuates the solution containing the functional material from the jet head.

This arrangement effectively prevents the solution containing the functional material from blocking in the jet head.

The jet head may be comprised of a set of multi-nozzle jet heads arranged apart from each other. In this case, each of the multi-nozzle jet heads has a row of nozzles, and is capable of ejecting a droplet of a different type of solution of, the functional material. The jet head is mounted on a carriage driven by the driving unit, so that the row of nozzles of each of the multi-nozzle jet heads is not parallel to a carriage moving direction.

For example, each of the multi-nozzle jet heads ejects a different type of solution containing an organic electroluminescent material that emits light of a different color.

Preferably, droplet ejection speed is faster than the relative moving speed between the jet head and the substrate.

In another aspect of the invention, a system for fabricating functional device mounting boards is provided. The system comprises (a) a fabrication apparatus that fabricates a functional device mounting board by ejecting a droplet of a solution containing a functional material from a jet head toward a substrate held on a holder, while moving the jet head relatively to the substrate, based on droplet ejection information supplied to the jet head; and (b) a clean air supply unit that supplies clean air to the droplet ejection area on the substrate.

In still another aspect of the invention, a functional device mounting board, which is fabricated by the above-described apparatus or system, is provided. The functional device mounting board comprises (a) a substrate having a top face and a rear face, (b) a group of functional devices arranged in a matrix in a functional device forming area defined on the top face of the substrate, and (c) an information pattern formed outside the functional device forming area on the top face of the substrate. Each of the functional devices is formed as a dot image formed by one or more droplets of a solution containing a functional material.

The information pattern is also formed as a dot image, and includes, for example, an identification pattern of the functional device mounting board, or a performance check pattern.

Each of the functional devices is formed of a different type of the solution containing an organic electroluminescent material that emits light of a different color.

In yet another aspect of the invention, a functional device mounting board comprises (a) a substrate having a top face and a rear face, and (b) a group of functional device arranged in a matrix in a functional device forming area defined on the top face. The roughness of the top face is at or below 0.5 s. Each of the functional devices is formed as a dot image formed by one or more droplets of a solution containing a functional material.

Preferably, the roughness of the rear face of the substrate is greater than that of the top face.

A groove or a ridge may be formed on the rear face of the substrate.

These arrangements prevent the substrate from being stuck on the substrate holder of a fabrication apparatus.

At least one of the corners of the substrate are chamfered or rounded. Alternatively, the edges of the substrates are chamfered. This arrangement allows easy and safe handling of the substrate.

In yet another aspect of the invention, an image display apparatus using the functional device mounting board is provided. The image display apparatus comprises (a) a functional device mounting board having a group of functional devices arranged in a functional device forming area on a first face of a substrate, and (b) a cover plate facing the functional device mounting board. Each of the functional devices and the information pattern are formed as a dot image formed by one or more droplets of a solution containing a functional material.

Preferably, the thickness of the cover plate is greater than that of the functional device mounting board.

The cover plate is made of, for example, reinforced glass.

In yet another aspect of the invention, an image display apparatus comprises (a) a functional device mounting board having a group of functional devices arranged in a functional device forming area on the first face of the substrate, and (b) a holder having a curved groove. Each of the functional devices is formed as a dot imaged formed by one o more droplets of a solution containing a functional material. The holder holds the functional device mounting board in the curved groove so that the first face of the functional device mounting board is bent with respect to a viewer.

BRIEF DESCRIPTION OF THE DRAWINGS

Other objects, features, and advantages of the present invention will become more apparent from the following detailed description when read in conjunction with the accompanying drawings, in which:

FIG. 36 illustrates how the solution supply cartridge is used in the fabrication apparatus;

FIG. 49 illustrates an example of the system for fabricating a functional device mounting board, the system including the fabrication apparatus;

DETAILED DESCRIPTION OF THE EMBODIMENTS

The details of the present invention will now be described with reference to the attached drawings.

Figure 1:
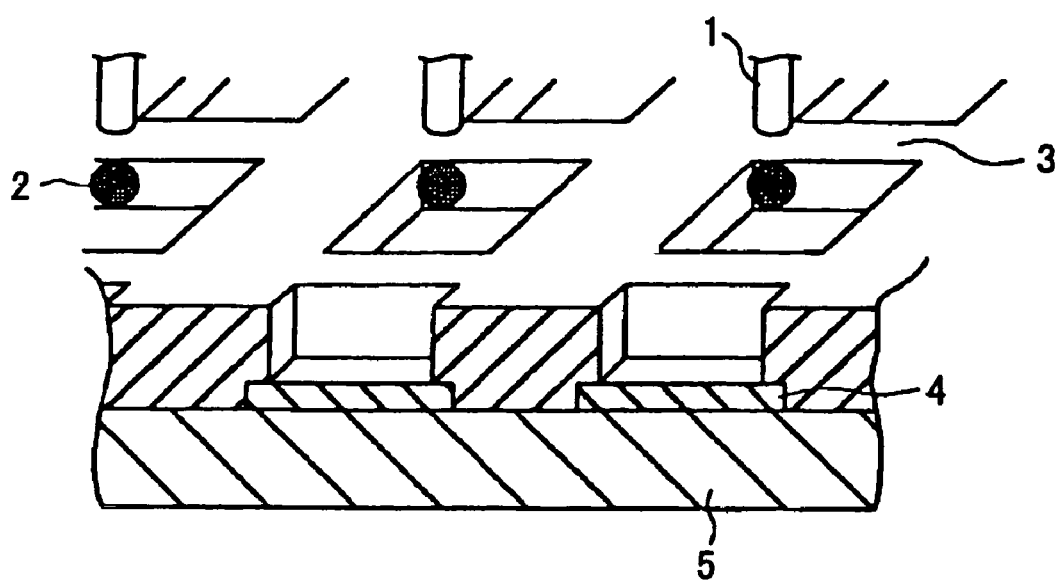
FIG. 1 schematically illustrates, in a perspective view, ejection of the solution containing a functional material onto an ITO transparent electrode on the glass substrate.

FIG. 1 illustrates fabrication of organic EL devices as an example of the functional devices. In this example, solution 2, in which organic EL material that emits light of red, green, or blue is dissolved, is ejected from a nozzle 1 onto an ITO (indium tin oxide) transparent electrode patterns 4 formed on glass substrate 5. The glass substrate 5 has a barrier wall 3 that defines an array of the transparent electrode pattern 4, and the organic EL devices of the corresponding colors of red, green, and blue are arranged as a mosaic pattern. The composition of the solution 2 is as given below:

Solvent: dodecylbenzene/dichlorobenzene (1/1, volume ratio)
Red: polyfluorene/perylene dye (98/2, weight ratio)
Green: polyfluorene/coumarin dye (98.5/1.5, weight ratio)
Blue: polyfluorene The ratio of the solid material to solvent is given as 0.4% (weight/volume). The substrate on which such solution has been applied is heated at, for example, 100° C. to remove the solvent. Then, an appropriate metallic mask is formed on the substrate, and an aluminum layer is formed by vapor deposition up to the thickness of 200 nm (not shown in the drawings). Lead wires are extended out from ITO and aluminum, whereby a device having an ITO anode electrode and an aluminum cathode is completed. Under the application of voltage of approximately 15 volts, the device emits light of red, green or blue.

The electrodes may be formed on the substrate in advance, prior to ejecting droplets of the solution. The functional device is formed by letting the volatile ingredient of the solution vaporize such that solid ingredients remain on the substrate.

By placing a transparent cover plate made of glass or plastic over the substrate opposing the functional devices, and then enclosing (packaging) it, an image display device, such as a spontaneous luminous organic EL display, can be provided.

The functional device is not limited to an organic EL device. For example, an organic transistor or the like may also be suitably fabricated as the functional device by applying the techniques of the present invention. Resist can also be used as the solution containing a functional material applied onto the substrate in forming the barrier wall 3 of the above-described example.

In the present invention, inkjet techniques are applied as means for applying the solution containing a functional material. Specific examples of application of the inkjet techniques will be described below.

Figure 2:
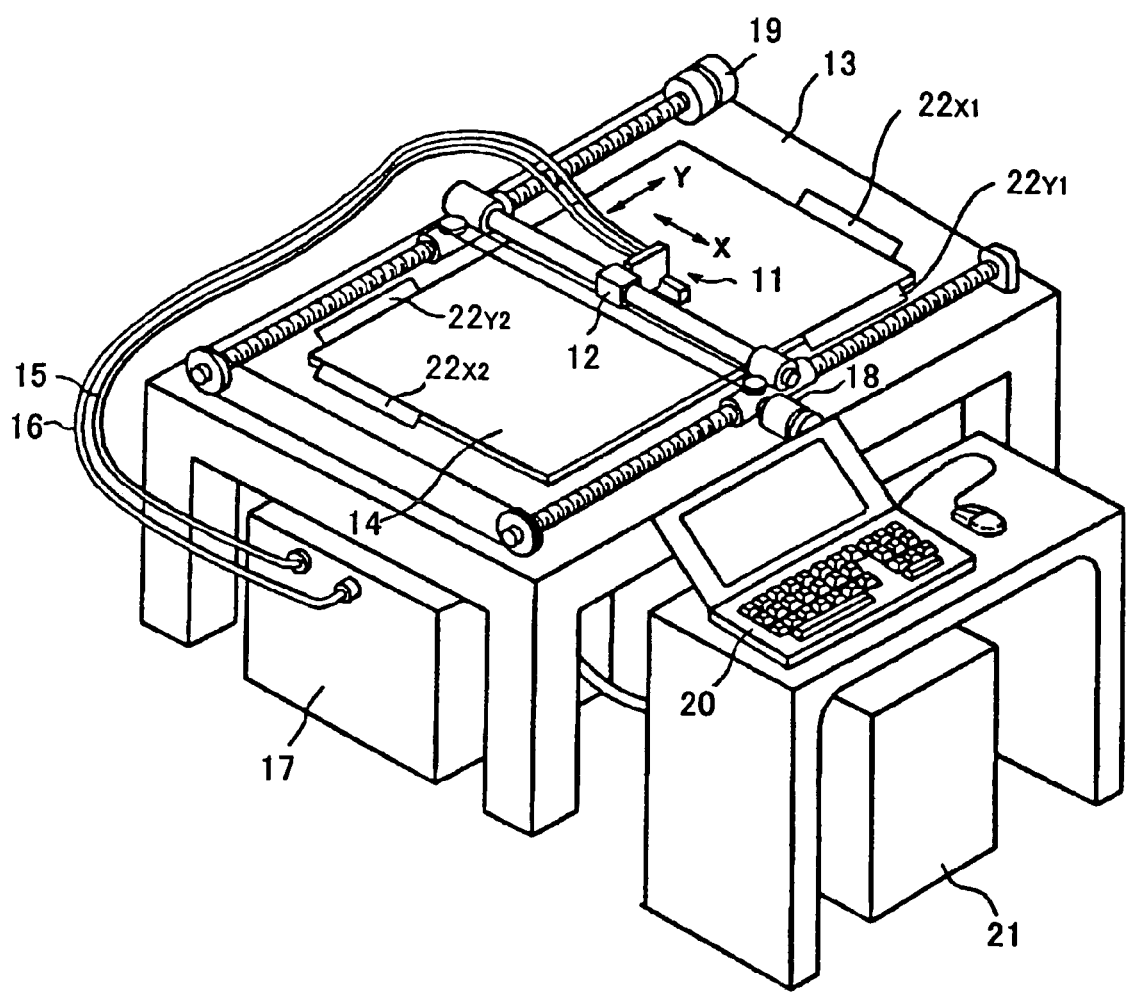
FIG. 2 illustrates the overall structure of a fabrication apparatus for a functional device: mounting board according to an embodiment of the invention.

FIG. 2 is a diagram for describing an embodiment of the fabrication apparatus for the functional device mounting board of the present invention. In this diagram, reference numeral 11 denotes a jet head unit (jet head); 12 denotes a carriage; 13 denotes a substrate support bench (or a substrate holder); 14 denotes a substrate on which a functional device is to be formed; 15 denotes a supply tube for the solution that includes functional material; 16 denotes a signal supply cable; 17 denotes a jet head control box; 18 denotes an X-direction scanning motor for the carriage 12; 19 denotes a Y-direction scanning motor for the carriage 12; 20 denotes a computer; 21 denotes a control box; and 22 ($22X_1$, $22Y_1$, $22X_2$, $22Y_2$) denotes substrate positioning/holding means.

Figure 3:
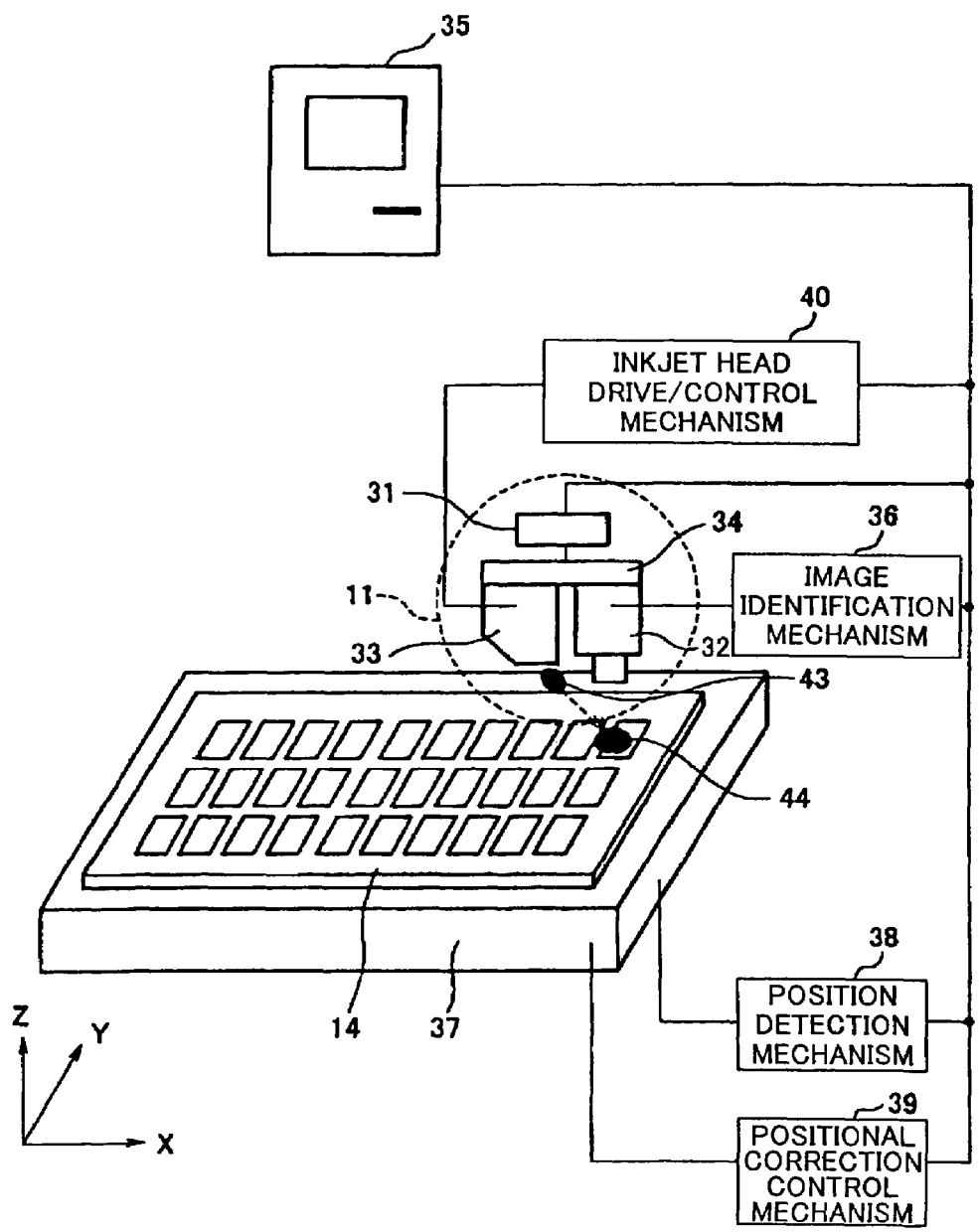
FIG. 3, illustrates a droplet ejecting apparatus used to form a functional device on a substrate according to an embodiment of the invention.
Figure 4A:
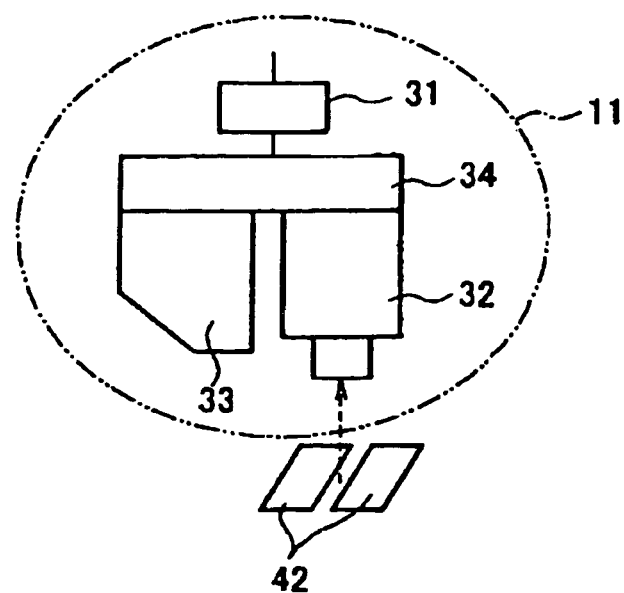
FIG. 4A and FIG. 4B illustrate the jet head unit used in the droplet ejecting apparatus shown in FIG. 3.
Figure 4B:
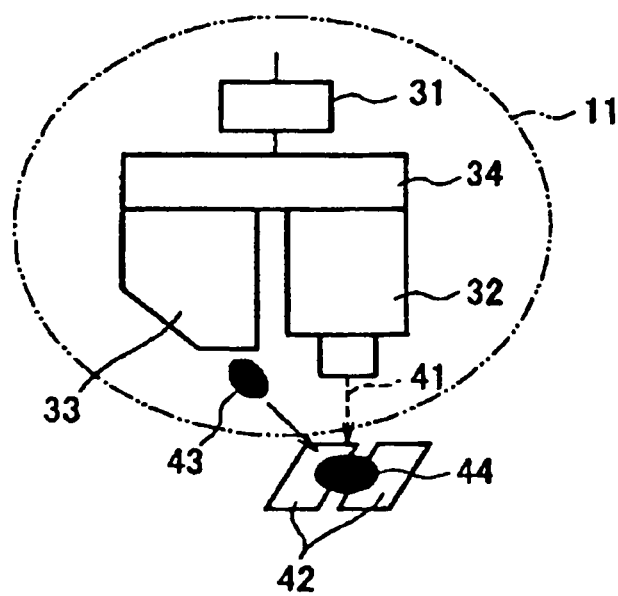

FIG. 3 is a schematic diagram illustrating the configuration of a droplet applicator used to fabricate the functional device mounting board of the present invention; and FIG. 4 is a schematic diagram of the principle parts of the droplet applicator jet head unit in FIG. 3. The configuration in FIG. 3 differs from that in FIG. 2, where a functional device group is formed on the substrate by making the substrate 14 side move. In FIG. 3 and FIG. 4, a jet head unit 31 is a head alignment control mechanism, 32 is a detection optical system, 33 is an inkjet head, 34 is a fine head alignment mechanism, 35 is a control computer, 36 is an image identification mechanism, 37 is an XY direction scan mechanism, 38 is a position detection mechanism, 39 is a positional correction control mechanism, 40 is an inkjet head drive/control mechanism, 41 is an optical axis, 42 are device electrodes, 43 is a droplet, and 44 is a location for droplet impact. Any appropriate mechanism may be used as the droplet applicator (inkjet head 33) in the jet head unit 11 as long as it can eject fixed quantities of arbitrary droplets, however, a mechanism based on inkjet techniques that is capable of forming droplets ranging from several to several hundreds pl is especially preferable.

There are many inkjet methods. For example, an electrical signal is applied to a piezoelectric vibrator so as to convert the electrical signal into mechanical vibration of a piezoelectric vibrator, which causes a droplet to be ejected from a minute nozzle. This method is disclosed in U.S. Pat. Nos. 3,683,212 (Zoltan method), U.S. Pat. No. 3,747,120 (Stemme method), and U.S. Pat. No. 3,946,398 (Kyser method). This is generally known as a drop-on-demand method.

Another method (the Sweet method) is disclosed in, for example, U.S. Pat. Nos. 3,596,275 and 3,298,030. In this method, a droplet of a recording fluid containing a controlled amount of electrostatic charge is produced using a continuous vibration generating technique. The produced droplet of the recording fluid flies between polarizing electrodes under the application of a uniform electric field, so as to reproduce images on a recording member. This is generally called the continuous flow method, or charge control method.

Yet another method is disclosed in Japanese Patent Publication after Examination (Koukoku) No. 56-9429. In this method, air bubbles are generated in the fluid, and the bubbles act on the fluid so as to cause a droplet to be ejected from a minute nozzle. This technique is generally called the thermal inkjet method or bubble inkjet method.

Among these methods, including the drop-on-demand, the continuous flow method, and the thermal inkjet method, any appropriate method can be chosen in accordance with needs. According to the present invention, an apparatus for fabricating a functional device mounting board (FIG. 2) is used. The holding position of the substrate 14 is fixed by the substrate positioning/holding means 22 for adjusting and determining the substrate holding position. As shown simplified in FIG. 2, the substrate positioning/holding means 22 makes contact with each side of the substrate 14, and is capable of making fine adjustments on the order of microns in the X-direction and the Y-direction. The substrate positioning/holding means 22 is connected to a jet head control box 17, computer 20, and control box 21, thereby allowing for constant feedback of the substrate positioning information, as well as fine adjustment displacement information, droplet positioning information, and ejection timing.

Moreover, in addition to the X/Y direction position adjustment mechanism, the fabrication apparatus for the functional device mounting board has a rotational position adjustment mechanism although it is not shown in the drawings (because it is positioned beneath the substrate 14). In connection with this, the shape of the functional device mounting board and array of the functional device group will be described first.

Any of silica glass, glass with a reduced impurity content of Na or the like, blue plate glass, a glass substrate with a $SiO_2$ layer, or a ceramics substrate of alumina may be used as the substrate of the functional device mounting board of the present invention. Furthermore, various types of plastic substrates including PET may also be suitably used for the purpose of reducing the weight and increasing flexibility. In any case, the substrate is rectangular, unlike silicon wafers, in view of economical production and supply, and of practical use of the final product (that is, functional device mounting board). Accordingly, the substrate has two vertical sides parallel to each other and two horizontal sides parallel to each other, which configures a rectangular shape. A vertical side and a horizontal side make a right angle.

Figures 31B, 31C:
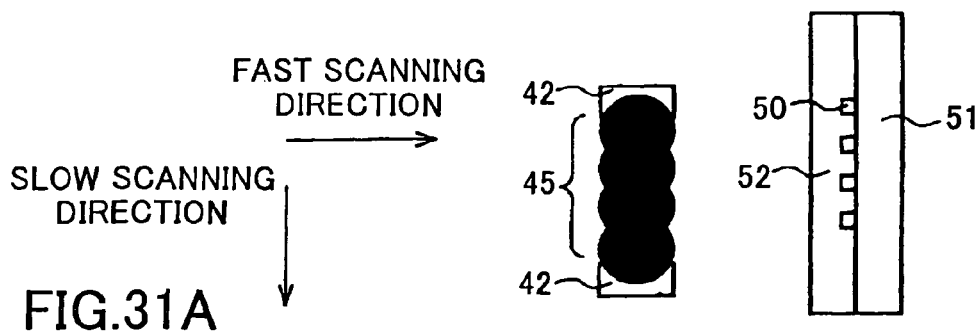
FIG. 31A is a plan view of the functional device mounting board having a group of functional devices in the functional device forming area, while some figures are formed outside the functional device forming area. An example of the functional device is shown in FIG. 31B formed by the jet head shown in FIG. 31C.
Figure 31A:
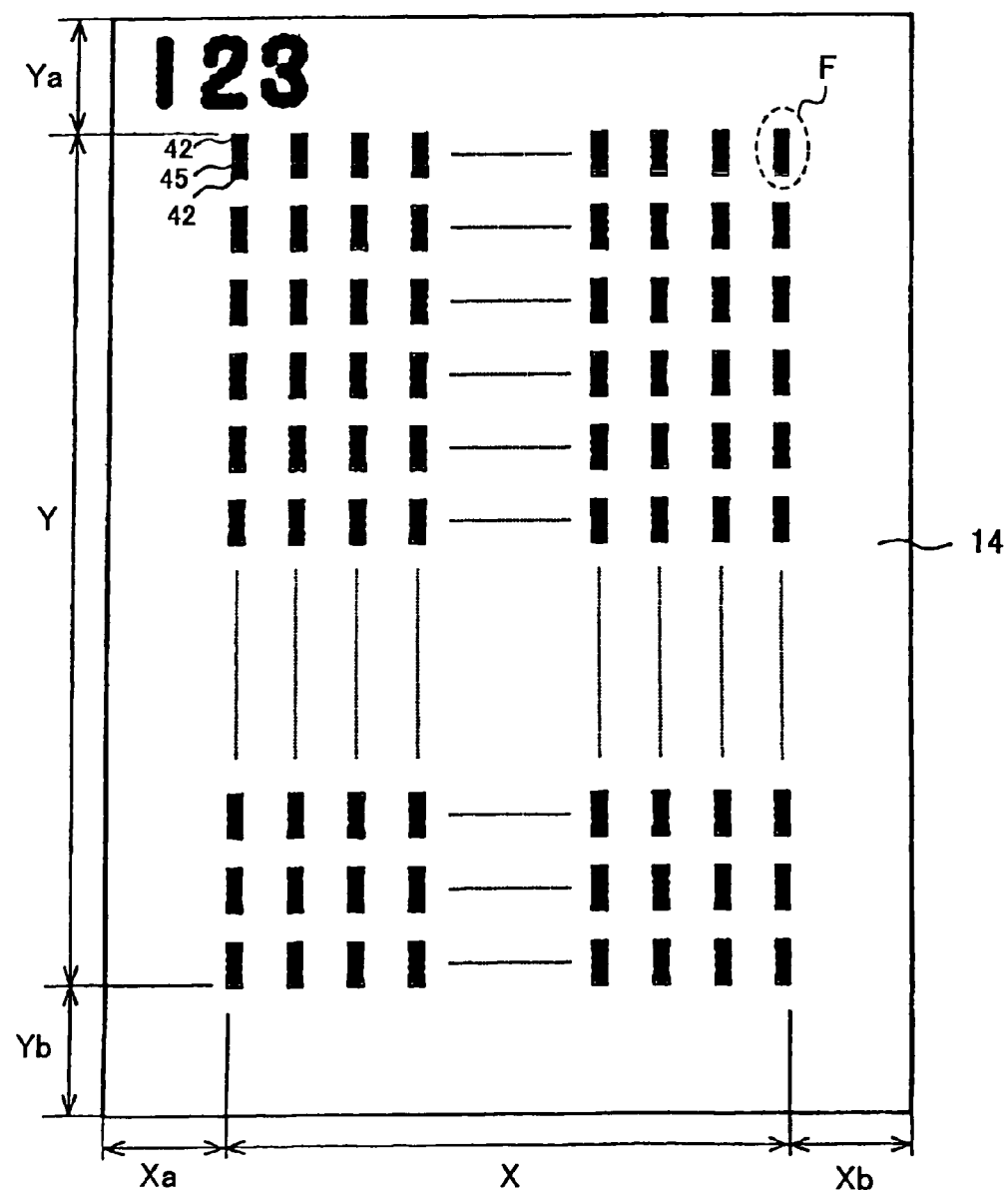
Figure 32:
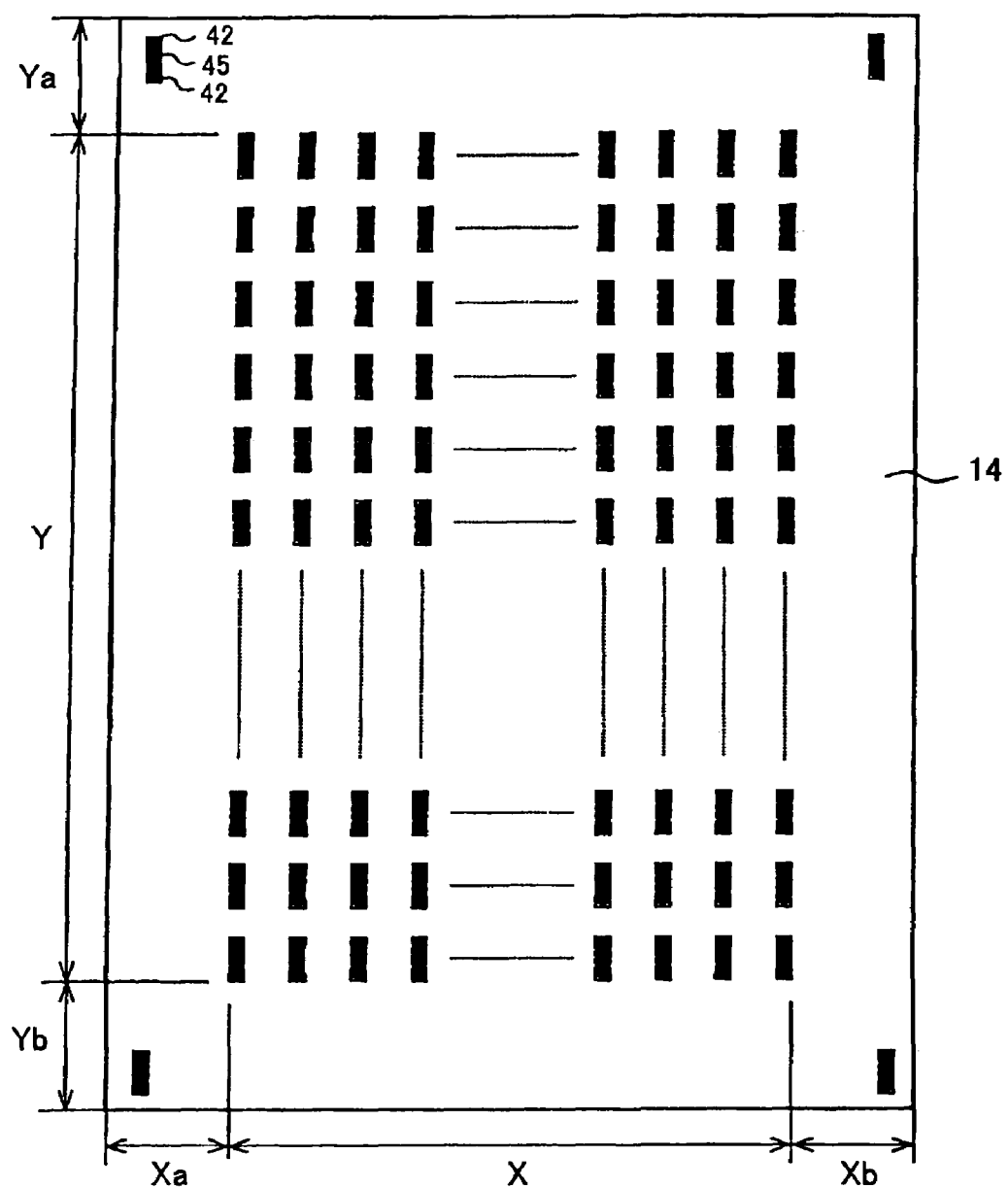
FIG. 32 is a plan view of another example of the functional device mounting board having a group of functional devices in the functional device forming area, while a performance check pattern is formed outside the functional device forming area.
Figure 33:
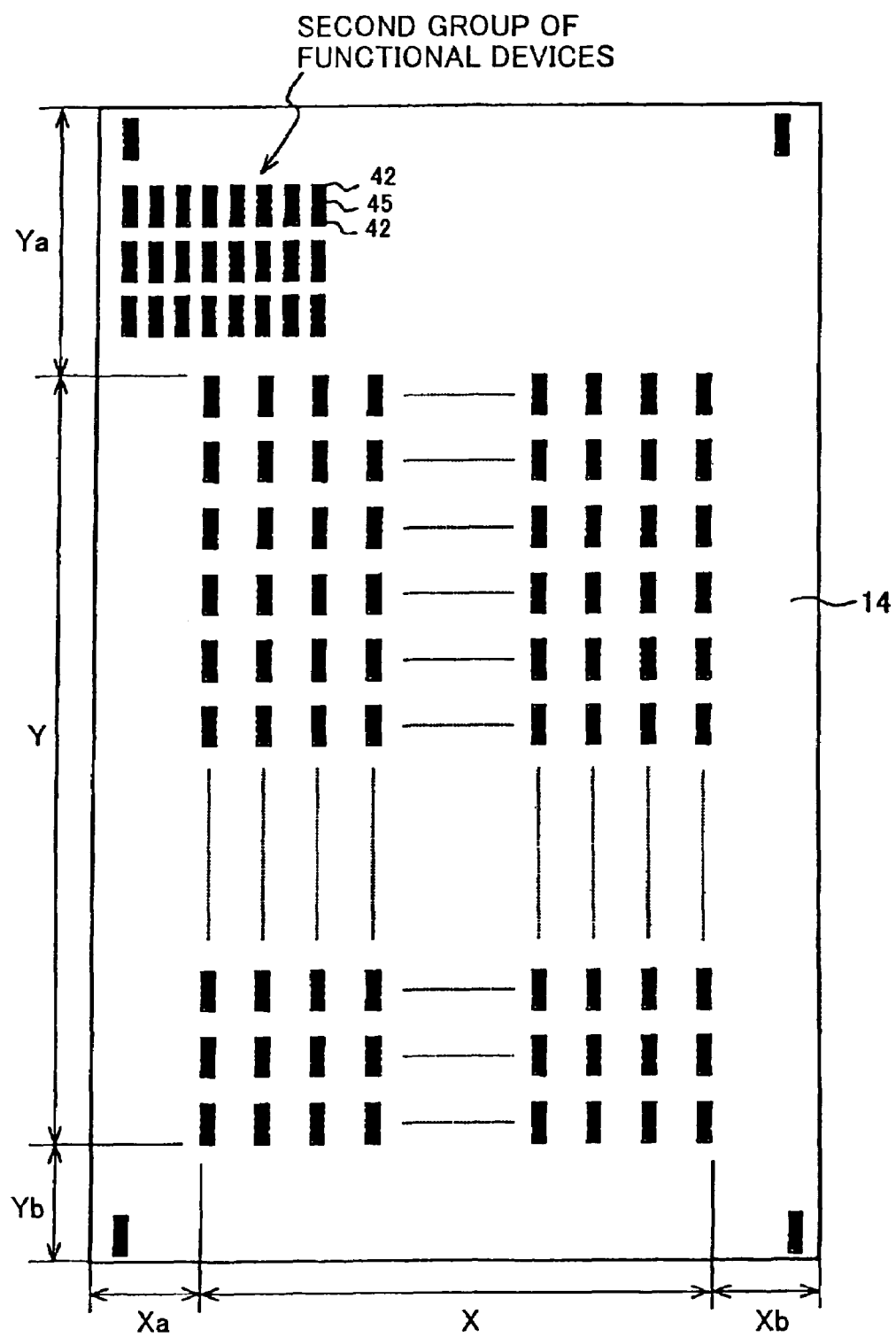
FIG. 33 is a plan view of still another example of the functional device mounting board having a group of functional devices in the functional device forming area, while a second group of functional devices is formed outside the functional device forming area.

A group of functional devices are arranged in a matrix on the rectangular substrate so that the two mutually orthogonal directions of this matrix are parallel to the directions of the vertical sides and the horizontal sides of this substrate, respectively (see FIG. 31 through FIG. 33). The reasons for this arrangement (i.e., arraying the functional devices in a matrix and making the vertical and horizontal sides of the substrate parallel with the two orthogonal directions of that matrix) will be explained below.

As illustrated in FIG. 2 or FIG. 3, once the position of the solution ejecting surface of the jet head unit 11 with respect to the substrate 14 is determined, no particular positional control is required. The jet head unit 11 ejects the solution (for example, photoresist material, a solution of dissolved organic EL material, or conductive material), while moving in the X and Y directions relative to the substrate so as to keep parallel to the functional device forming surface with a fixed distance from the substrate 14. Basically, the X-direction and Y-direction are two mutually orthogonal directions. By setting the vertical side or the horizontal side of the substrate parallel to the Y-direction or X-direction during the positioning, a group of functional devices can be formed precisely using a mechanism of ejecting the solution and a mechanism of causing relative displacement, because the two directions of the matrix array of the functional device are also parallel to the sides of the substrate. In other words, using a rectangular substrate and the relative displacement mechanism in the X and Y directions, and setting the array of the functional devices so that the sides of the array are parallel to the sides of the substrate, allow a matrix of functional devices to be formed at high precision by accurately positioning the substrate prior to ejecting droplets onto the substrate.

The rotational position adjustment mechanism mentioned earlier is now described. As previously mentioned, the present invention aims to provide a highly-precise functional device matrix array by accurately positioning the substrate before the ejection of droplets onto the substrate, and by causing relative displacement in the X and Y directions without executing additional control operations. When carrying out initial positioning of the substrate, there may be an offset (or positional shift) existing in the rotational direction about the Z-axis perpendicular to the plane defined by the X and Y directions. In order to compensate for this rotational offset, a rotational position adjustment mechanism (not shown in the drawings since it is positioned beneath the substrate 14) is provided to the fabrication apparatus. By compensating the rotational deviation and by correctly positioning the substrate, a highly precise matrix array of functional devices can be obtained simply by the relative displacement in the X and Y directions.

In the above-described example, the rotational position adjustment mechanism has been described as a separate mechanism from the substrate positioning/holding means 22 ($22X_1$, $22Y_1$, $22X_2$, $22Y_2$) of FIG. 2 (not visible since positioned beneath the substrate 14). However, the substrate positioning/holding means 22 may include the rotational position adjustment mechanism. For example, the substrate positioning/holding means 22 makes contact with the sides of the substrate 14, and the whole substrate positioning/holding means 22 is made capable of adjusting the position in the X-direction and Y-direction. In this case, angle adjustment can be conducted by providing two screws positioned apart from each other and movable independently of each other to each of the substrate positioning/holding means 22 that receive one of the sides of the substrate 14. The rotational position control information is supplied to the jet head control box 17, computer 20, and control box 21, together with the X, Y direction positioning information and fine adjustment displacement information. This arrangement allows for constant feedback of droplet positioning information and ejection timing information to the substrate positioning mechanism.

Next, another configuration of the positioning means will be described. The substrate positioning/holding means 22 of the above description makes contact with the sides of the substrate 14, and the entirety of the substrate positioning/holding means 22 is capable of adjusting the position of the substrate in the X-direction and Y-direction. Instead of making use of the sides of the substrate, strip-shaped patterns extending in two perpendicular directions may be formed on the substrate 14. As previously mentioned, the functional device array is formed as a matrix. Accordingly, the strip-shaped patterns extending in two perpendicular directions are set parallel to the two mutually orthogonal sides of the matrix. Such patterns can be easily formed on the substrate using a photofabrication technique.

Instead of forming the strip-shaped patterns separately only for the purpose of positioning, device electrodes 42 (FIG. 4) or the wiring patterns extending in the X-direction and Y direction may be used as the positioning strip patterns. Such strip-shaped patterns can be detected by a detection optical system 32 using a CCD camera and lens, which will be described with reference to FIG. 4 below, and the detected information can be fed back to the positional adjustment.

Concerning the Z direction perpendicular to the X-Y plane, the positional control is not particularly necessary in the Z direction once the positional relationship between the solution ejecting face of the jet head unit 11 and the substrate 14 is initially determined. Namely, the jet head unit 11 ejects the solution containing a functional material, while it moves relative to the substrate 14 in the X and Y directions maintaining a fixed distance from the substrate 14. Positional control of the jet head unit 11 in the Z direction is not performed during the ejection to prevent the associated mechanisms and the control system from becoming complex. In addition, if positional adjustment is carried out in the Z direction during the ejection, it takes a longer time to form the functional device on the substrate through application of droplets, resulting in reduced productivity.

Instead of performing positional control in the Z direction during the ejection, the levelness of the substrate 14 and the substrate support means is improved, as well as improving the precision of a carriage mechanism that drives the jet head unit 11 relative to the substrate 14 in the X, Y directions. The productivity is enhanced by increasing the rate of the relative displacement between the jet head unit 11 and substrate 14 in the X, Y directions, even without performing positional control in the Z direction during ejection. To give an example, fluctuation in distance between the substrate 14 and the solution ejecting surface of the jet head unit 11 during the ejection of the droplets is kept within 5 mm (in the case where the size of the substrate 14 is at least 200 mm×200 mm and smaller than 4000 mm×4000 mm).

A plane defined by the X and Y directions is generally held horizontal. However, if the substrate 14 is small (for example, when smaller than 500 mm×500 mm), the X-Y plane is not necessarily held horizontal, but should be set so that the positional relationship makes the substrate 14 be located most efficiently for that device.

FIG. 3 illustrates another example of the present invention. The present invention is not limited to this example. Unlike in FIG. 2, the substrate 14 is driven relative to the fixed jet head unit 31 when fabricating a functional device mounting board. FIG. 4 is an enlarged diagram of the jet head unit 11 shown in FIG. 3. To begin with, in FIG. 3, reference numeral 37 denotes the XY direction scan mechanism upon which the functional device mounting board 14 is placed and held. The functional device formed on the substrate 14 has the same configuration as that shown in FIG. 1. Each functional device is configured by the glass substrate 5 (equivalent to the substrate 14), the barrier wall 3, and the ITO transparent electrodes 4, as in FIG. 1. The jet head unit 11 for ejecting droplets is positioned above the substrate (or functional device mounting board) 14. In this example, the jet head unit 11 is fixed. By moving the functional device mounting board 14 to an arbitrary position by the XY direction scan mechanism, relative displacement between the jet head unit 11 and functional device mounting board 14 is implemented.

FIG. 4 illustrates the configuration of the jet head unit 11. In FIG. 4, reference numeral 32 denotes the detection optical system that takes in the image information of the top face of the substrate 14. The detection optical system 32 is adjacent to the inkjet head 33 that ejects the droplet 43, and is arranged so that the optical axis 41 and focal point of the detection optical system 32 coincides with the location of impact 44 of the droplet 43 through the inkjet head 33. In this case, the positional relationship between the detection optical system 32 and inkjet head 33 illustrated in FIG. 3 can be precisely adjusted via the fine head alignment mechanism 34 and head alignment control mechanism 31. Furthermore, a CCD camera and lens are used for the detection optical system 32.

In FIG. 3, the reference numeral 36 denotes the image identification mechanism, which identifies the image information detected by the detection optical system 32. The image identification mechanism 36 converts image contrast into binary data, and calculates the center of balance of a specific portion of the binary contrast. Specifically, the high-resolution image recognition device VX-4210 manufactured by Keyence Corporation may be used. A position detection mechanism 14 provides the position information existing on the substrate 14 to the image information obtained by the image identification mechanism. Length measuring equipment, such as a linear encoder, furnished in the XY direction scan mechanism 37 may be utilized here. The positional correction control mechanism 39 performs positional correction based upon the positional information on the functional device mounting board 14 and image information, whereby movement of the XY direction scan mechanism 37 is corrected. The inkjet head 33 is driven by the inkjet head control/drive mechanism 40, whereby the droplet is applied onto the functional device mounting board 14. Each of the control mechanisms mentioned thus far are centrally controlled by the control computer 35.

In this example, the jet head unit 11 is fixed, while relative displacement between the jet head unit 11 and functional device mounting board 14 is implemented through the motion of the functional device mounting board 14 to an arbitrary position by means of the XY direction scan mechanism. Needless to say, however, as illustrated in FIG. 2, the functional device mounting board 14 may be fixed, while driving the jet head unit 11 in the X and Y directions. Particularly in cases of applying in manufacture of midsize substrates 200 mm×200 mm to large size substrates of 2000 mm×2000 mm or larger, the latter structure is preferable, where the functional device mounting board 14 is fixed, while driving the jet head unit 11 scans in the two orthogonal X and Y directions. In this case, droplets of the solution are also ejected along the X direction and Y direction.

In contrast, if a light plastic substrate is utilized, or if the size of the substrate is relatively small (100 mm×100 mm through 800 mm×800 mm), paper feeding for a inkjet printer may be used. In this case, the jet head unit 11 mounted on the carriage 12 scans only in the X direction (or only in the Y direction), while the substrate is moved in the Y direction (or X direction). This arrangement can greatly improve the productivity.

In cases where substrate size is 200 mm×200 mm or smaller, the jet head unit for ejecting droplet is designed as a large-array multi-nozzle jet head unit capable of covering a range of 200 mm, so as to allow the relative displacement between the jet head unit and the substrate in only one direction (for example, only the X direction), instead of moving in two orthogonal directions (X and Y directions). This arrangement can achieve high mass productivity. If the substrate size exceeds 200 mm×200 mm, it is difficult to manufacture such a large-array multi-nozzle jet head unit capable of covering the range beyond 200 mm from the standpoint of the cost and the technical aspect. In this case, the jet head unit 11 is designed so as to scan in the two orthogonal X and Y directions to eject droplets of the solution in X and Y directions alternately.

Particularly, when manufacturing a substrate smaller than 200 mm×200 mm by cutting a large substrate of 400 mm×400 mm through 2000 mm×2000 mm or larger, the array of the functional devices is formed on such a large substrate using the inkjet technique. Accordingly, it is preferable for the jet head unit 11 to scan in the two orthogonal X and Y directions alternately to eject solution droplets onto predetermined positions on the substrate.

As material for the droplet 43, apart from the previously mentioned organic EL material, polyphenylene vinylene based elements (poly (para-phenylenevinylene), based derivatives), polyphenylene based derivatives, or otherwise material such as low molecular weight organic EL material soluble in benzene derivatives, high molecular weight organic EL material, or polyvinyl carbazole, for example, may be used. Rubrene, perylene, 9,10-diphenyl anthracene, tetraphenyl butadiene, Nile red, coumarin 6, quinacridone, polythiophene derivatives and the like can be given as specific examples of the organic EL material. Furthermore, charge carrying and hole carrying type material, which is peripheral material in organic EL display, is utilized as the functional material for manufacturing the functional device of the present invention.

Otherwise, a precursor of the silicon glass for interlayer insulating film used in semiconductor devices, or silica glass forming material can be given as additional examples of the functional material for manufacturing the functional device of the present invention. Polysilazane (manufactured by Tonen Corporation, for example), organic SOG material and the like may be given as examples of this precursor. An organic metallic compound may also be alternatively used. Moreover, color filter material may be given as yet another example. Specifically, sublimated dye such as Sumikaron Red B (trade name, dye manufactured by Sumitomo Chemical Co., Ltd.), Kayalon Fast Yellow GL (trade name, dye manufactured by Nippon Kayaku Co., Ltd.) and Diethylene Fast Brilliant Blue B (trade name, dye manufactured by Mitsubishi Kasei Corporation) and the like may be used.

Regarding the solution composition of the present invention, it is preferable that the boiling point of the benzene derivatives be 150° C. or higher. o-dichlorobenzene, m-dichlorobenzene, 1,2,3-trichlorobenzene, o-chlorotoluene, p-chlorotoluene, 1-chloronaphthalene, bromobenzene, o-dibromobenzene, and 1-dibromonaphthalene can be given as specific examples of such solvent. Sublimation of the solvent can be prevented by using these solvents, thus are preferable. These solvents have a high degree of solubility in aromatic compounds, thus they are preferable. Furthermore, it is preferable that the solution composition of the present invention includes dodecylbenzene. N-dodecylbenzene independently or an isomeric compound thereof may also be used as the dodecylbenzene.

This solvent has the characteristics of a boiling point at 300° C. or higher, and viscosity of 6 cp or greater (at 20° C.). The solvent may be used individually, or alternatively, it may be added to another solvent. In the latter case, sublimation of another solvent may be effectively prevented. Furthermore, since the viscosity of the above solvents with the exception of dodecylbenzene is relatively small, the viscosity may be adjusted by adding this solvent, and it is thus suitable. According to the present invention, after such solution composition is applied onto the substrate using the jet head, the substrate is processed at a temperature higher than the ejection temperature to make the droplets of the solution into a stable film of the functional material. The ejection temperature is generally room temperature, and therefore, the substrate bearing the solution droplets is heated. The heating process allows the ingredient educed due to evaporation of the droplet during the ejection or a fall of the temperature, to be re-dissolved, and therefore, a homogeneous, uniform functional film can be obtained.

It is preferable to heat the substrate bearing the droplet of the functional material under pressure. Heating under pressure delays evaporation of the solvent, and promotes re-dissolving of the educed ingredient. Consequently, a homogeneous and uniform functional film can be obtained. Furthermore, with the manufacturing method of the above functional film, it is preferable to reduce the pressure immediately after high-temperature processing of the aforementioned substrate. Reducing the pressure immediately after the heating process can prevent phase separation of the solvent during the solidification of the solvent.

With any one of the above-mentioned materials or functional devices, the present invention performs device formation by evaporating the volatile component in the solution so as to leave the solid content on the substrate. This solid component exhibits the functions of the associated devices. The solvent (volatile component) is a vehicle for allowing the solution to be ejected using the inkjet technique.

In order to apply the droplet 43 onto a desired device electrode through the jet head unit (jet head) 11, the target position is measured by the detection optical system 32 and image identifying device 36. Then, the corrected coordinates are generated based on the measured data, the distance from the ejection outlet surface of the jet head unit (jet head) 11 to the functional device mounting board 14, and the carriage moving speed. The jet head unit (jet head) 11 is moved across the functional device mounting board 14 in the X and Y directions in accordance with these corrected coordinates, while ejecting the droplets. A CCD camera and the like may be used in combination with a lens as the detection optical system 32. A commercially available device that can convert an image into binary data so as to obtain the center of balance of the image may be used as the image identifying device 36.

As can be clearly understood from the above description, the functional device mounting board of the present invention is fabricated by ejecting the solution containing a functional material through the air onto the substrate using the inkjet technique.

Next, another feature of the present invention will be described. Especially, explanation will be made on the characteristics of the substrate required to fabricate a functional device mounting board at high precision using the fabrication apparatus described above, as well as the handling of such a substrate.

In order to precisely form a functional device in a reliable manner, dot formation on the substrate is important. It is necessary to form a clear and round dot having a designed diameter on the substrate, without spreading or running of the droplet on the substrate.

Generally with the inkjet recording technique for ejecting ink on paper, special inkjet recording paper, so-called coated paper, coated with silica or similar material is used for the purpose of forming a round dot on the paper to obtain a dot with intended clear dimensions. The present invention concerns functional device mounting boards, rather than recording paper, and therefore, the structure of inkjet recording paper cannot be employed as it is.

Nonetheless, inspired by special inkjet recording paper, the inventors believe that with the functional device mounting board of the present invention, the condition of the substrate surface prior to depositing the droplet containing a functional material using the inkjet technique greatly affects the shape (or the roundness) and size of the dot on the substrate. Especially, the roughness of the substrate surface is an important factor.

As previously mentioned, glass or ceramics is used as the substrate. If the glass surface is in a condition similar to ground glass, upon the application of the droplet of solution containing a functional material onto the substrate through the inkjet technique, the solution spreads rapidly due to the capillary phenomenon. The droplet cannot maintain the desired round shape.

Focusing attention on this phenomenon, through variously changing the roughness of the surface of the substrate utilized for the present invention, the inventors experimentally considered what degree of roughness is optimum so as to prevent the droplet spreading, avoiding a spread-out state. Results thereof are given hereinafter.

Silica glass plates and alumina substrates with $SiO_2$ deposited on the surface (referred to as $SiO_2$ alumina substrate) were prepared for the experiment. With the former one (silica glass), the surface roughness was varied ranging from a mirror-smooth state to a ground-glass state. With the latter one ($SiO_2$ alumina substrate), the surface roughness of the alumina substrate was set as smooth as possible, and the volume condition of the $SiO_2$ to be sputtered on the alumina surface was changed so as to vary the surface roughness of the $SiO_2$ layer. The surface roughness was measured with a surface profiler manufactured by Dektak.

These substrates have been examined for conditions of favorable dot formation, using the fabrication apparatus illustrated in FIG. 2 to eject a droplet of solution containing a functional material by the inkjet technique.

The conditions for the solutions and the jet head used in the experiment are given below.

The solution was a mixed solution of o-dichlorobenzene and dodecylbenzene, mixed with 0.1 weight percent poly (hexyl-oxiphenylene vinylene).

The jet head used in the experiment is a drop-on-demand type inkjet head (see FIG. 41 and FIG. 42) utilizing piezo elements. The nozzle diameter was set at 23 μm; the input voltage for the piezo element was set at 27 V; and drive frequency was set at 12 kHz. The initial speed of the jet was 8 m/s. The mass of a droplet was 5 pl. The carriage scanning rate (in the X direction) was set at 5 m/s. The distance between the jet head nozzle and substrate was set at 3 mm.

A droplet was ejected under the same conditions as the actual device formation, while changing the waveform of the driving pulse. Then the shape of the flying droplet was observed. The driving waveform was controlled such that that shape of the flying droplet was nearly round immediately before reaching the substrate surface. When a perfectly round spherical shape was not obtained, and instead, the droplet was elongated in the flying direction, then the drive waveform was controlled to keep the length of the elongated droplet within three times the diameter. Furthermore, drive conditions (drive waveform) were chosen so as not to produce minute trailing drops behind the flying droplet.

After the functional device if formed on the substrate through the ejection of droplets, aluminum was sputtered over the functional device and, the substrate. Lead wires were extended from the ITO electrode and the aluminum layer, and a voltage of 10 volts was applied between the ITO anode and aluminum cathode to estimate the device performance. Table 1 shows the evaluation result.

In the table, the circle marked for the dot shape (or the dot spreading state) on the substrate represents satisfactory formation (clear dot without spreading) of dots, and therefore, the good formation of a functional device. The cross mark represents unsatisfactory formation of a functional device due to slight spreading of the solution, causing the unclear outline of the dot. The circle marked for the device performance represents good emission of orange-color light at a prescribed shape, and the cross mark represents non-emission or partial emission of orange-color light. The devices having such imperfect light emission cannot be used as actual products.

TABLE 1

| Test No. | Substrate type | Substrate surface roughness (S) | Dot formation state upon substrate | Device performance |
|---|---|---|---|---|
| 1 | Silica glass | 0.05 | ○ | ○ |
| 2 | Silica glass | 0.1 | ○ | ○ |
| 3 | Silica glass | 0.3 | ○ | ○ |
| 4 | Silica glass | 0.5 | ○ | ○ |
| 5 | Silica glass | 0.8 | x | x |
| 6 | Silica glass | 1.3 | x | x |
| 7 | Silica glass | 2 | x | x |
| 8 | PET film | 0.2 | ○ | ○ |
| 9 | PET film | 0.3 | ○ | ○ |
| 10 | PET film | 0.5 | ○ | ○ |
| 11 | PET film | 0.8 | x | x |
| 12 | PET film | 1.3 | x | x |
| 13 | PET film | 2 | x | x |
| 14 | $SiO_2$ alumina | 0.2 | ○ | ○ |
| 15 | $SiO_2$ alumina | 0.5 | ○ | ○ |
| 16 | $SiO_2$ alumina | 0.8 | x | x |
| 17 | $SiO_2$ alumina | 1.2 | x | x |

From the evaluation result, it is understood that, irrespective of substrate type, the dot formation on the substrate and the associated device performance greatly depend on the surface roughness of the area in which the dots of the solution are formed. When the surface roughness of the substrate is 0.5 s or smaller, satisfactory shape of dots can be obtained on the substrate to form a functional device (an organic EL device, for example) suitable to practical use. On the other hand, if the surface roughness exceeds 0.5 s, dot formation on the substrate becomes unfavorable, causing a spread-out dot, and the resultant functional device is dissatisfactory and unsuitable for practical use.

It is understood that the surface roughness of the surface should be set to 0.5 s or less in order to form a favorable functional device; however, there are a few problems.

The first problem is cost. In order to obtain such an extremely smooth surface, the substrate needs to be polished with high precision. The same applies to the $SiO_2$ alumina substrate having a sputtered $SiO_2$ layer on the alumina surface. It is necessary to take sufficient time to form a $SiO_2$ layer with a smooth surface, which causes the fabrication cost to increase.

Incidentally, through consideration of the functional device mounting board of the present invention, the functional devices are formed on a single side of the substrate. This means that only one side of the substrate requires a smooth surface, on which the functional devices are to be formed. As long as the device forming surface of the substrate has a roughness determined by the above-described experiment, the roughness of the rear face of the substrate may be greater than the above-described value. By setting the surface roughness of only the device forming surface of the substrate at a prescribed range, a pattern of the functional devices can be formed very precisely, while maintaining the fabrication cost low.

The second problem is tight contact between the fabrication apparatus and the substrate during the fabrication of a functional device mounting board. If the substrate is held on the fabrication apparatus too tightly, the functional device mounting board cannot be detached from the fabrication apparatus easily. In the first problem, the surface roughness is discussed from the viewpoint of the fabrication cost. In the second problem, the surface roughness is again focused on from the viewpoint of handling the substrate when removing the functional device mounting board from the fabrication apparatus. During the experiment using the fabrication apparatus shown in FIG. 2, a problem arose where the substrate adhered to the substrate support bench (or the substrate holder) 3 when the rear surface of the substrate was too smooth.

This problem resembles the principle of ringing where two block gauges adhere to each other making use of the smoothness of the surfaces. Through the experiment, it is known that if the back surface of the substrate is too smooth, it adheres to the substrate support bench 13 and is difficult to remove, requiring extra efforts to remove the substrate from the apparatus. In this case, not only the production yield is reduced, but also the operator or the worker may get hurt or otherwise, the functional device mounting board may be damaged, during the forcible removal of the functional device mounting board.

Then, another experiment was made by varying the surface roughness of the back surface of the respective substrates (i.e., silica glass, PET film, and a $SiO_2$ alumina substrate) used in the previous experiment to clarify at what degree of surface roughness removal of the substrate is facilitated without causing too tight contact between the substrate and the substrate support bench 13. The results are given in Table 2.

In Table 2, the circle marked for the easiness of removal/replacement of the substrate represents the case in which the substrate can be removed easily without undesirable contact between the substrate and the apparatus. The cross mark represents tight contact between the substrate and the apparatus, with difficulty in removal. The substrate support bench 13 used in the apparatus has a surface obtained by grinding and polishing SUS304. The back surface of the $SiO_2$ alumina substrate is not covered with a $SiO_2$ film, and the alumina surface is exposed.

TABLE 2

| Test No. | Substrate type | Substrate back surface roughness (S) | Easiness of removal/replacement of Substrate |
| --- | --- | --- | --- |
| 1 | Silica glass | 0.1 | x |
| 2 | Silica glass | 0.5 | x |
| 3 | Silica glass | 1 | o |
| 4 | Silica glass | 1.5 | o |
| 5 | Silica glass | 3 | o |
| 6 | PET film | 0.5 | x |
| 7 | PET film | 1 | o |
| 8 | PET film | 1.5 | o |
| 9 | PET film | 3 | o |
| 10 | $SiO_2$ alumina | 0.5 | x |
| 11 | $SiO_2$ alumina | 1 | o |
| 12 | $SiO_2$ alumina | 1.5 | o |
| 13 | $SiO_2$ alumina | 3 | o |

As is clear from the experiment result, irrespective of substrate type, setting the roughness of the back surface of the substrate at 1 s or greater can overcome the problem of undesirable tight contact between the substrate and the apparatus, which may cause the removal or the replacement of the substrate to be difficult.

The problem of tight contact can also be resolved by other measures. One reason for the tight contact is a vacuum state caused between the back surface of the substrate and the substrate support bench 13, which also resembles the principle of ringing (where two block gauges used in precise measurement are attached together). To avoid the too tight contact, the vacuum state between the substrate and the substrate support bench 13 has to be avoided. FIG. 5 illustrates how the vacuum state is prevented.

Figure 5A:
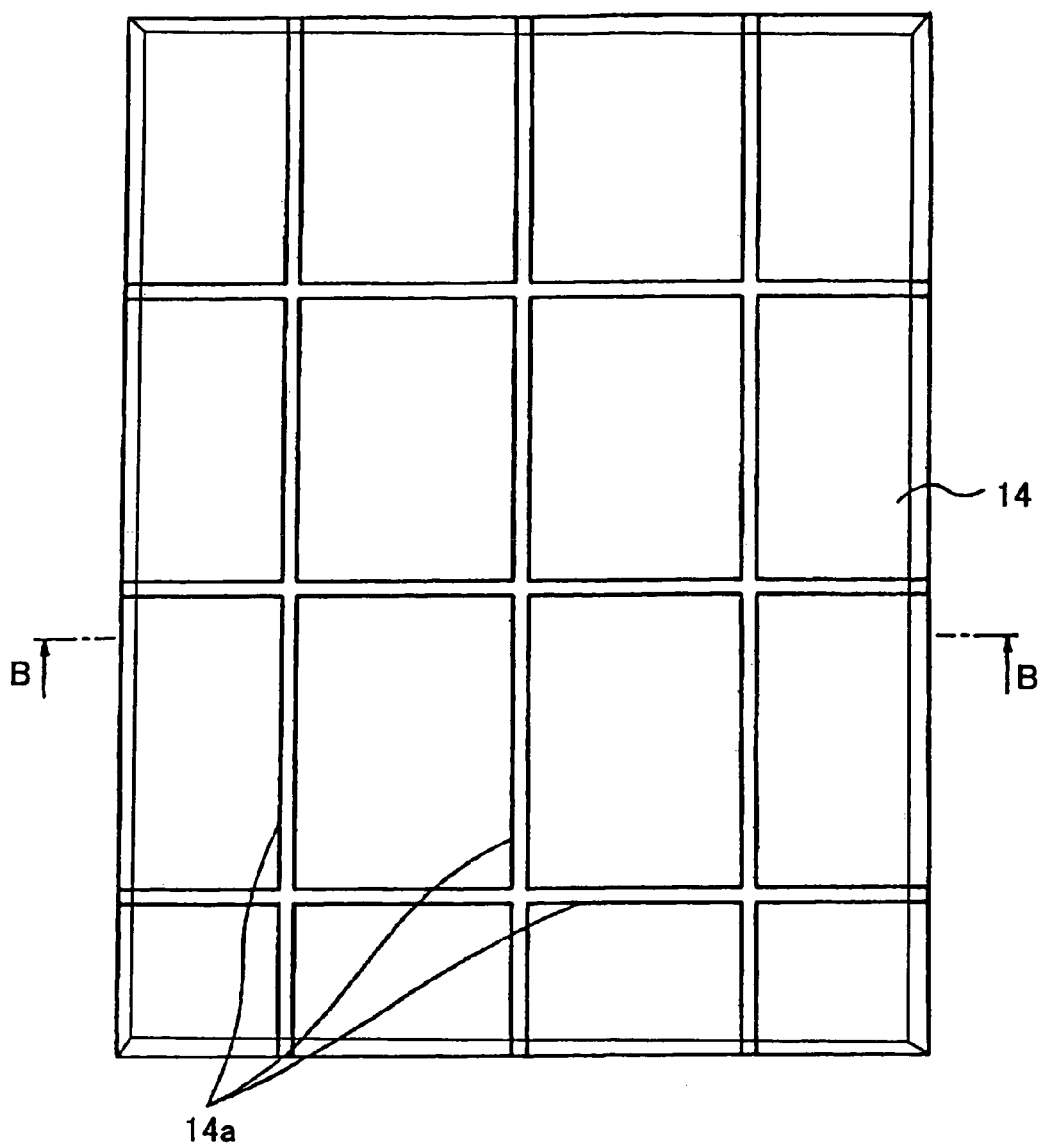
FIGS. 5A and 5B illustrate an example of the substrate on which functional devices are formed, the substrate having a U-shaped groove on the rear face of the substrate.
Figure 5B:
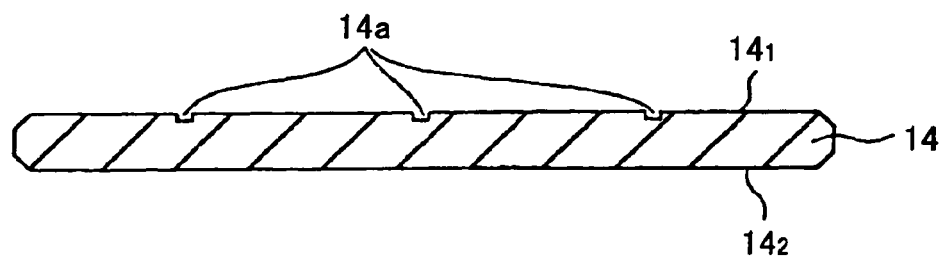

FIG. 5A shows the back surface of the substrate (or the functional device mounting board) 14, and FIG. 5B is a cross sectional view taken along the B-B line shown in FIG. 5A. In this example, linear groves 14a are formed in the back surface $14_1$ of the substrate 14, which is opposite to the front surface $14_2$ on which a group of functional devices are formed. Each of the grooves 14a extends from one end to the other end of the substrate, forming cross stripes. In the example shown in FIG. 5, three grooves extend in each the vertical and horizontal directions. The grooves 14a function as air inlet channels that produce an air layer between the substrate support bench 13 of the fabrication apparatus and the functional device mounting board. This arrangement can prevent the vacuum state.

Figure 6A:
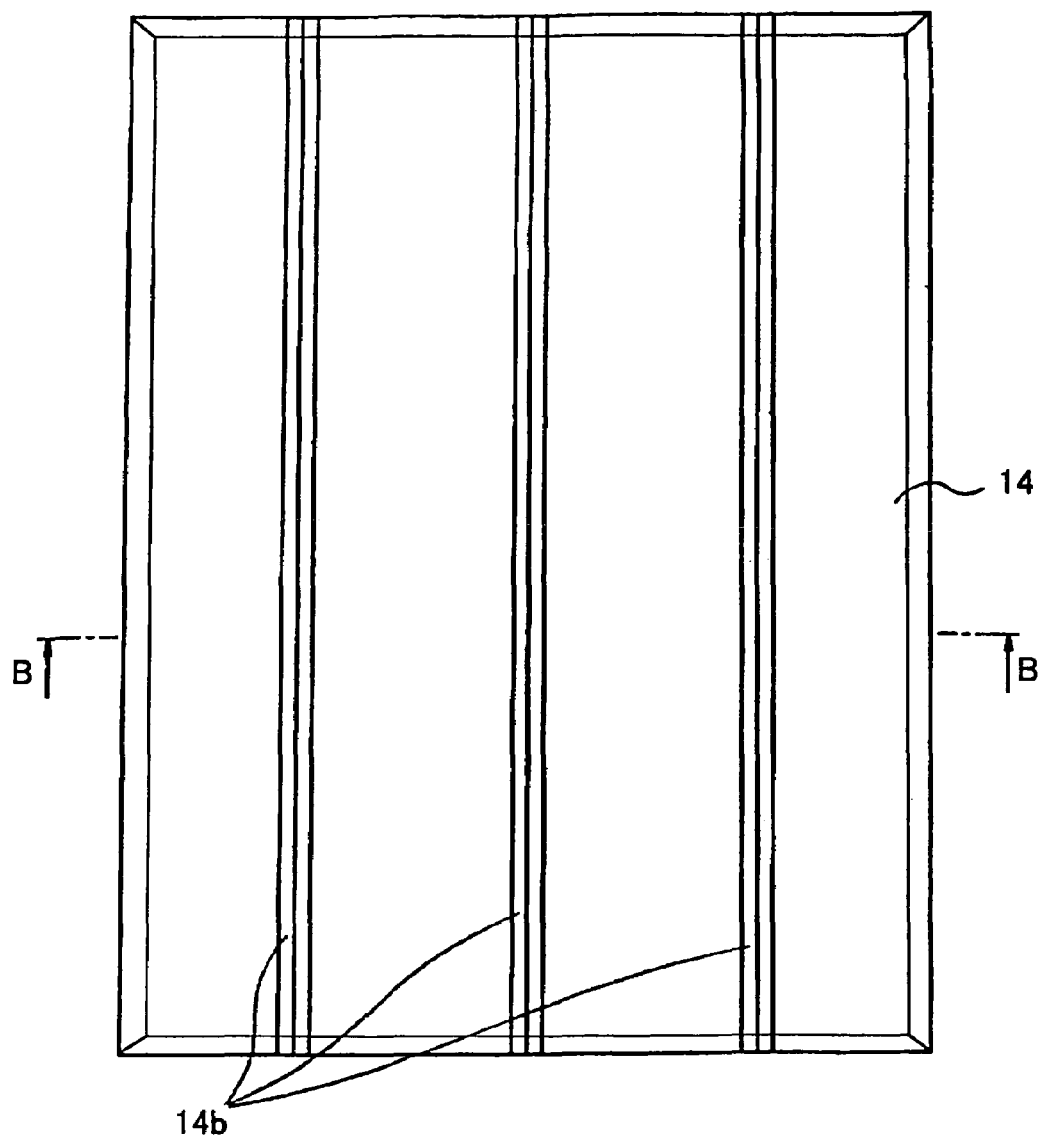
FIG. 6A and FIG. 6B illustrate another example of the substrate having a V-shaped groove on the rear face of the substrate.
Figure 6B:
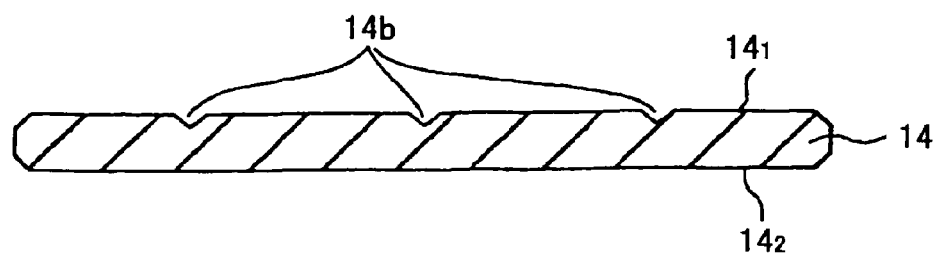

FIG. 6 shows another example of the groove. FIG. 6A is a top view of the back surface of the functional device mounting board 14, and FIG. 6B is a cross sectional view taken along the B-B line shown in FIG. 6A. In this example, the groove has a V-shaped cross section, instead of a U-shaped cross section. Furthermore, only three vertical grooves are formed. The groove may have any shape in the present invention, as long as it functions as an air inlet channel to prevent tight contact between the substrate 14 and the substrate support bench 13.

The groove can be formed in the back surface of the substrate using a dicing saw or the like, as a secondary process. The cross-section of the groove depends on the shape of the dicing blade, and therefore, the cross-sectional shape of the groove is arbitrary, including V-shape, U-shape, concave, or rectangular recess. A single process of forming linear grooves using a simple tool, such as a diamond cutter, may also be employed, which is an even easier secondary process.

Besides the mechanical secondary process using a dicing saw or the like, etching through a chemical process may be employed as the secondary process when a glass substrate is used.

Since the groove can be formed in the back surface of the substrate very easily by a mechanical method with a simple tool, such as a diamond cutter or the like, or by a chemical process, such as etching, the cost for fabricating a functional device mounting board easy to handle can be maintained low.

When using ceramics substrates, such as $Al_2O_3$ (alumina) or SiC substrates, the grooves may be formed through baking, by implementing preparation for the groove prior to the baking process. In this case, the groove can be formed simultaneously with the production of the ceramic substrate. The simultaneous formation of the grooves can also be applied to a glass substrate. In this case, physical linear grooves are formed simultaneously when the external shape of the substrate is defined using a press machine or a stamping machine. Such simultaneous formation of the grooves carried out during the process of forming a substrate allows the process cost to be maintained low.

It is preferable to form several grooves in the substrate. A single groove does not exhibit sufficient effect. Multiple grooves can enhance the effect of producing the air path between the substrate and the apparatus. Arranging the grooves in cross stripes as shown in FIG. 5 is preferable. However, the grooves do not necessarily need to cross each other at right angles.

In the examples illustrated in FIG. 5 and FIG. 6, the grooves extend parallel to the sides of the substrate. However, the groove may extend obliquely at a certain angle with respect to the side of the substrate. In addition, the groove does not necessarily extend straight, and it may be curved. In any case, it is preferable for the groove to extend from one end to the other end of the substrate to let the air efficiently pass through the groove.

Regarding the dimensions of the groove, the depth and width may be nearly the same. If the groove is too shallow, it becomes difficult for the groove to perform the function of the air inlet channel. If the groove is too deep, the substrate is likely to be damaged due to concentration of the stress on the groove.

In view of the above points, another experiment was conducted to examine the groove depth. The substrate used in the experiment is Pyrex (registered trademark) glass. The back surface of the Pyrex glass was finished to a roughness of 0.05 s, which is nearly a mirror surface. A groove was formed in the mirror surface using a diamond cutter, while changing the depth. The substrate holder equivalent to the actual substrate support bench used in the apparatus is a SUS340 substrate, which was finished to a roughness of 0.05 s having a nearly mirror surface. The degree of easiness to place the substrate on the substrate holder (or the smooth slide of the substrate on the substrate holder) was observed. Three types of substrates having thickness of 2 mm, 4 mm, and 10 mm were prepared. The corresponding sizes are 420 mm×300 mm, 1200 mm×800 mm, and 3500 mm×1800 mm, respectively. Each of the substrates has three rectangular grooves extending vertically and three rectangular grooves extending horizontally, which grooves are arranged at a uniform interval, as illustrated in FIG. 5. The observation result is given below in Table 3, where groove width is set equal to the groove depth.

In the table, the circle represents smooth sliding of the substrate on the SUS340 substrate, which is a pseudo substrate support bench, without causing the substrate to be stuck on the SUS340 substrate. The cross mark represent the case where the substrate is stuck on the SUS340, or where the glass substrate is broken due to slight vibration during the experiment or transportation because the groove is too deep, causing the mechanical strength of the glass substrate to be degraded.

TABLE 3

| Thickness t (mm) | Groove depth d (mm) | t/d | Evaluation results |
|---|---|---|---|
| 2 | 0.02 | 100 | x (stuck) |
|  | 0.04 | 50 | ○ |
|  | 0.1 | 20 | ○ |
|  | 0.2 | 10 | ○ |
|  | 0.3 | 6.7 | ○ |
|  | 0.4 | 5 | ○ |
|  | 0.5 | 4 | x (damage) |
|  | 1 | 2 | x (damage) |
| 4 | 0.04 | 100 | x (stuck) |
|  | 0.06 | 67 | x (stuck) |
|  | 0.08 | 50 | ○ |
|  | 0.1 | 40 | ○ |
|  | 0.5 | 8 | ○ |
|  | 0.8 | 5 | ○ |
|  | 1 | 4 | x (damage) |
|  | 2 | 2 | x (damage) |
| 10 | 0.04 | 250 | x (stuck) |
|  | 0.08 | 125 | x (stuck) |
|  | 0.2 | 50 | ○ |
|  | 0.5 | 20 | ○ |
|  | 1 | 10 | ○ |
|  | 1.3 | 7.8 | ○ |
|  | 2 | 5 | ○ |
|  | 3 | 3.3 | x (damage) |
|  | 5 | 2 | x (damage) |

According to the evaluation result, the lower limit of the groove depth d should be at or greater than one fiftieth (1/50) of the thickness t of the substrate. Below one fiftieth, the substrate will be stuck on the substrate holder.

Regarding the upper limit, the groove depth d should be at or smaller than one fifth (1/5) of the thickness t of the substrate. If exceeding the one fifth of the thickness t, the substrate is likely to be damaged and is not suitable for practical use.

Instead of forming a groove in the substrate, a ridge or a projection may be formed on the back surface of the substrate, as illustrated in FIG. 7.

Figure 7A:
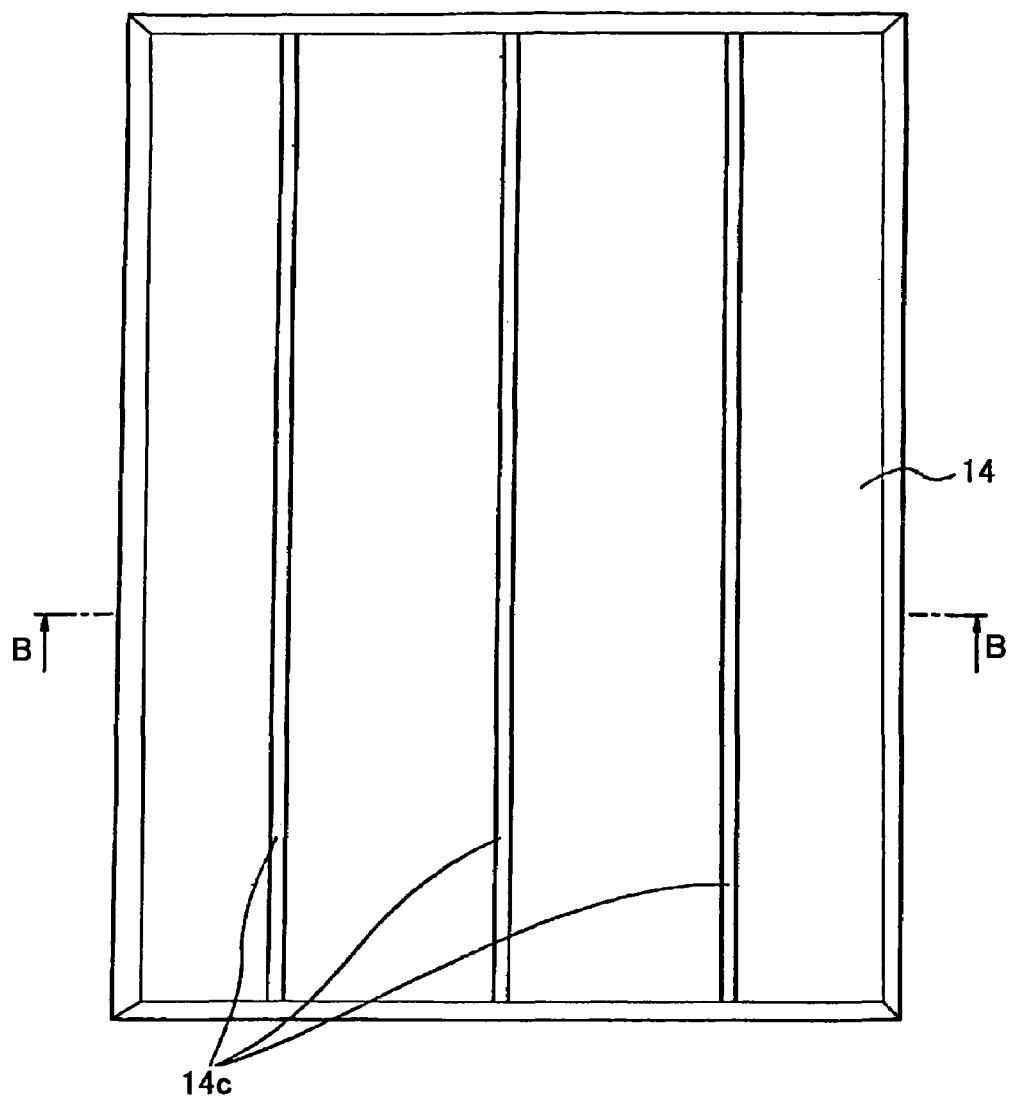
FIG. 7A and FIG. 7B illustrate still another example of the substrate having a ridge on the rear face of the substrate.
Figure 7B:
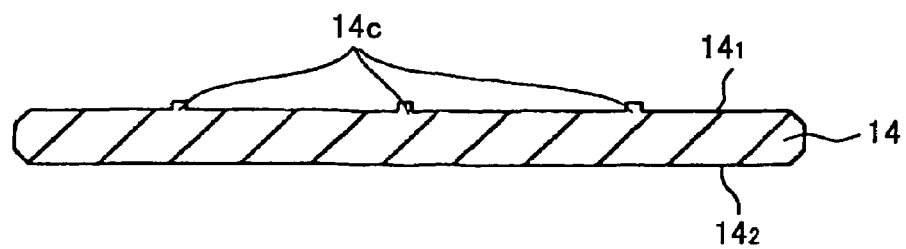

FIG. 7A is a top view of the back surface of the functional device mounting board 14, and FIG. 7B is a cross-sectional view taken along the B-B line shown in FIG. 7A. With this arrangement, the substrate 14 is supported above the substrate support bench 13 by means of ridges 14c extending in the back surface plane $14_1$. Accordingly, a thin layer of air exists between the substrate 14 and the substrate support bench 13. In this manner, the substrate 14 can be prevented from being stuck onto the substrate support bench 13. The cross-sectional shape of the ridge $14_c$ may be rectangular as in FIG. 7, or may be of any shape, such as triangular or semicircular.

The substrate 14 having a ridge or a protrusion $14_c$ may be easily formed through the aforementioned simultaneous formation of the substrate, as explained in conjunction with the groove formed in the back surface of the substrate. Namely, in the case of using ceramics such as $Al_2O_3$ (alumina) or SiC as the substrate, the ridge or the protrusion can be simultaneously formed during the baking of the substrate by performing pre-treatment of the substrate so as to create the ridge during the baking process. The simultaneous formation of the ridges or the protrusions can also be applied to the glass substrate. In this case, physical linear protrusions are formed simultaneously when the external shape of the substrate is defined using a press machine or a stamping machine. Such simultaneous formation of the protrusion during the process of forming a substrate allows the process cost to be maintained low.

By forming a groove or a protrusion in the back surface of the substrate, which is used to produce a functional device mounting board, a thin layer of air is created between the substrate and the substrate support bench (or the substrate holder) to prevent the substrate from being stuck on the bench (holder). This arrangement can facilitate placing or removing the substrate onto or from the substrate support bench, while effectively preventing the tight contact or vacuum contact between the substrate and the substrate support bench.

Next, yet another feature of the present invention will be described with reference to FIG. 8 through FIG. 13, where the shape of the corner or the edge of the substrate is modified. As has been described above, the functional device mounting board of the present invention employs a rectangular substrate made of silica glass, impurity-reduced glass with reduced amount of Na or other impurities, blue plate glass, a glass substrate with $SiO_2$ layer on the top surface, a ceramic (including alumina) substrate with a $SiO_2$ layer on the top surface, or any other suitable material. The two parallel vertical sides and the two parallel horizontal sides configure the rectangular shape. The vertical and horizontal sides make a right angle.

Figure 8A:
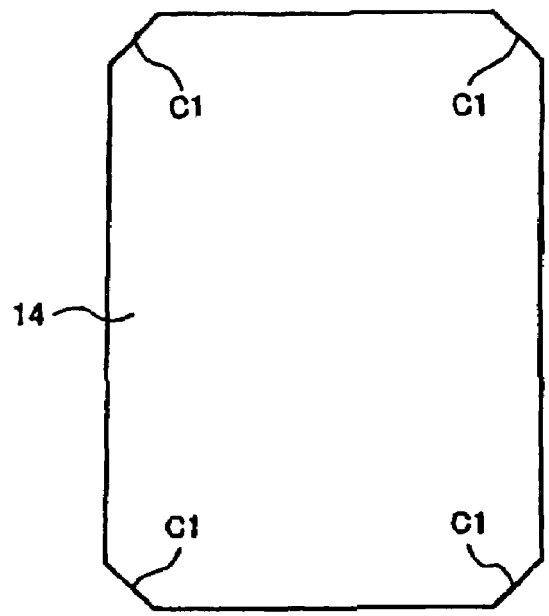
FIG. 8A illustrates an examples of the rectangular substrate having chamfered corners.
Figure 8B:
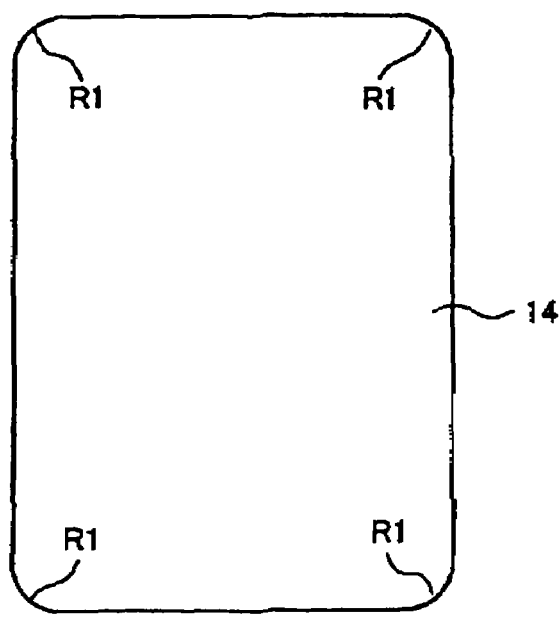
FIG. 8B illustrates another example of the rectangular substrate having rounded corners.

Incidentally, such a rectangular substrate has four corners each with an angle of 90°. Since the substrate is made of glass, ceramics or a similar material, workers often accidentally get hurt during the process of fabricating the functional device mounting board. Consequently, with the present invention as illustrated in FIG. 8, corners of the substrate are chamfered as indicated by C1 in FIG. 8A, or rounded as indicated by R1 in FIG. 8B. Preferably, the chamfer is at or greater than C1 or R1 illustrated in FIG. 8 so as to reduce the sharpness of the corner. This arrangement can prevent the workers from being hurt on the job (when transporting the substrate, removing or placing the substrate from or onto the fabrication apparatus). The corners can be chamfered easily through a grinding process using a grinder containing abrasive grains, such as carborandom or emery.

Figure 9:
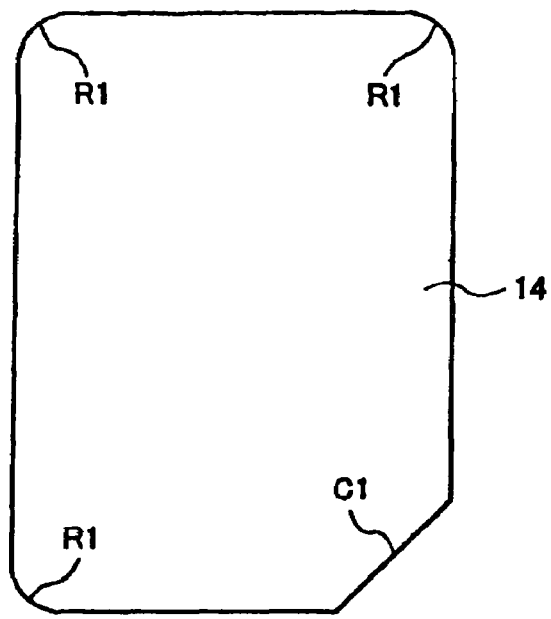
FIG. 9 illustrates still another example of the rectangular substrate having a chamfered corner and three rounded corners.

FIG. 9 illustrates another example of the chamfered substrate. In this example, the right bottom corner C1 of the substrate 14 has a different shape of chamfer from the other three corners R1. This arrangement allows the orientation of the substrate to be easily determined when installing the substrate 14 onto the substrate support bench 13 of the fabrication apparatus (see FIG. 2). By differing the shape of at least one corner (the angular portion) so as to be distinguishable from the other corners, the workers can easily recognize the orientation of the substrate during the fabrication of the functional device mounting board, and install the substrate correctly. It is preferable to set the size and the shape of each corner distinguishable from the other corners so as to allow a worker to recognize by touch. Such an arrangement can improve the efficiency in substrate installation, while greatly reducing operational errors.

Figure 10:
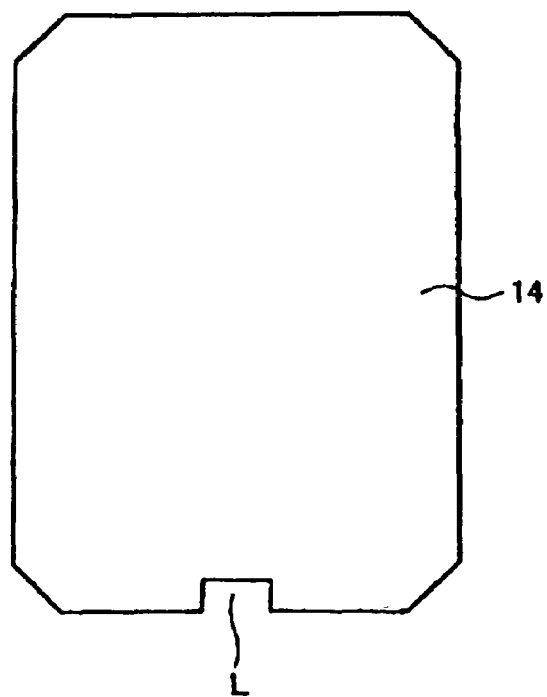
FIG. 10 illustrates yet another example of the rectangular substrate having chamfered corners and an indentation on a side of the rectangle.

FIG. 10 illustrates yet another example of the substrate. In this example, at least one of the four sides of the substrate 14 is provided with a notch or a cutaway L. Such a cutaway L also allows the orientation of the substrate to be correctly set when installing the substrate 14 onto the substrate support bench 13 of the fabrication apparatus shown in FIG. 2. The workers can determine the orientation of the substrate when installing the substrate onto the fabrication apparatus by simply touching the cutaway or the notch. This arrangement improves the reliability of the substrate installation, while greatly reducing operational errors. Although not shown in FIG. 2, a substrate stopper may be provided to the substrate support bench 13 shown in FIG. 2, so as to receive the cutaway L when the substrate is placed on the substrate support bench 13. Such arrangement secures accurate installation or accurate positioning of the substrate.

FIG. 11 illustrates yet another example of the substrate. This example focuses on safe handling of the substrate, which is in favor of the workers during the process of fabricating the functional device mounting board.

The functional device mounting board of the present invention uses, as previously mentioned, silica glass, impurity-reduced glass with a reduced amount of Na and the like, blue plate glass, a glass substrate with a $SiO_2$ layer deposited on the surface, a ceramic substrate of alumina or the like with a $SiO_2$ layer deposited on the surface, or various types of plastic substrates including PET. When handling such a substrate to install the substrate on the fabrication apparatus (see FIG. 2 and FIG. 3), to transport the substrate, or to incorporate the functional device mounting board into an image display apparatus (which will be described later), accidents often occur involving the workers, for example, cutting themselves on the edge of the substrate. This is because the material is glass or ceramics, and the edge or the rim of the substrate works as a sharp blade. Accordingly, the edges of the substrate are chamfered so as to reduce the sharpness in the example shown in FIG. 11.

Figure 11A:
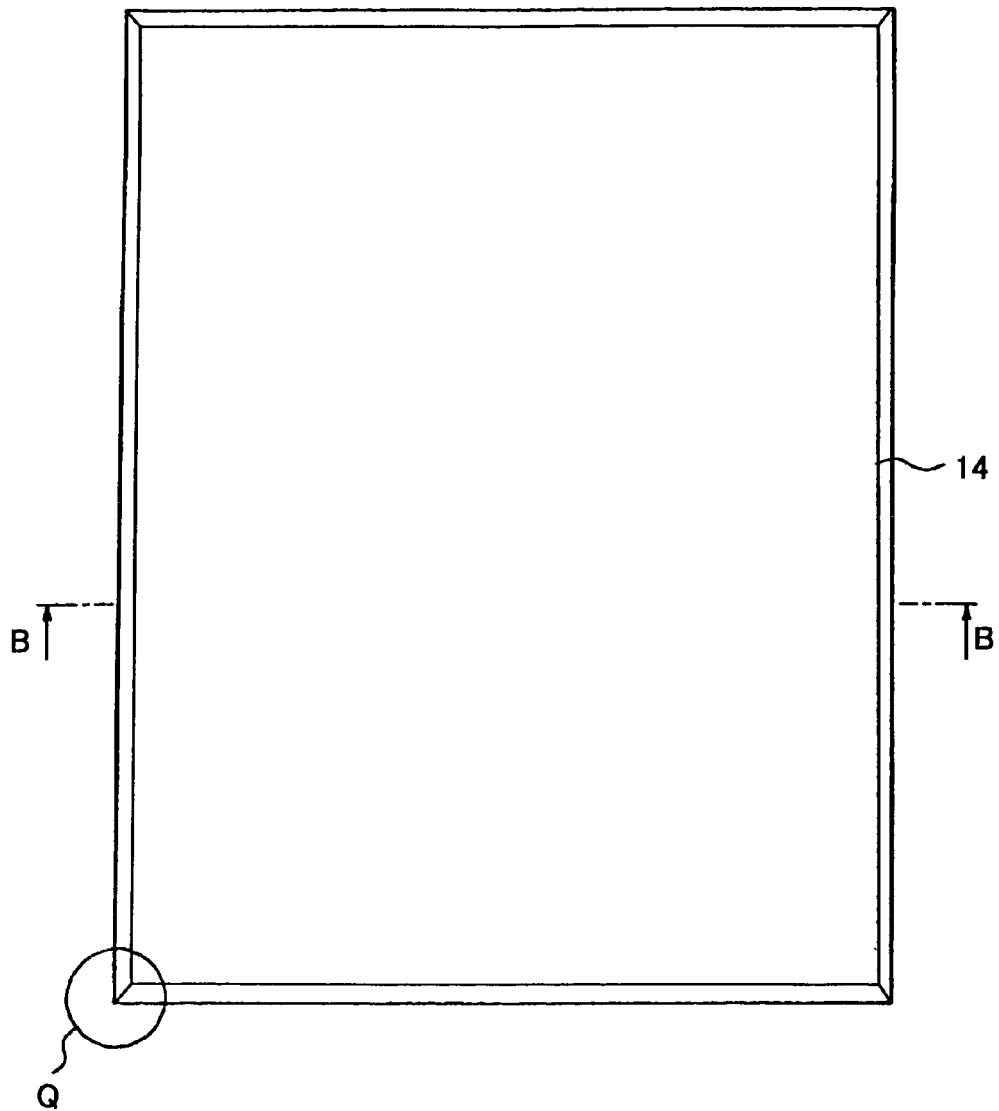
FIG. 11A and FIG. 11B illustrate yet another example of the rectangular substrate with chamfered edge lines.
Figure 11B:
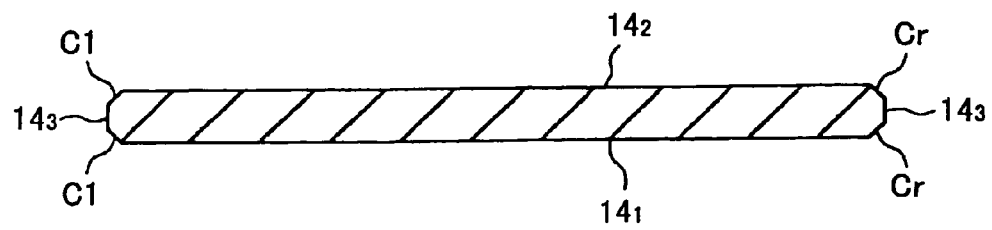

FIG. 11A is a top view of the substrate 14, and FIG. 11B is a cross-sectional view taken along the B-B line shown in FIG. 11A. Reference numeral 14 denotes a substrate on which a group of functional devices are to be formed, and is made of Pyrex (registered trademark) glass in this case. How the edges (i.e., the regions along the thickness of the substrate) are processed for the safe handling is clearly illustrated in the cross section of FIG. 11B. In this example, the edges (or the ridge lines) formed between the top surface $14_2$ on which the functional devices are to be formed and the edge face $14_3$ along the thickness of the substrate are chamfered as indicated by C1 and Cr. Similarly, the ridge lines formed between the back surface $14_1$, and the edge surfaces $14_3$ along the thickness are chamfered as indicated by C1 and Cr.

As for the chamfer, the ridgelines are chamfered by specifying the degrees c_ in mechanical drawings in the example shown in FIG. 11B; however, the chamfer may be defined by specifying the radius of curvature RXX in mechanical drawings. The edges (ridgelines) can be chamfered into any shape as long the edge of a right angle can be eliminated so as to prevent the edge from functioning as a sharp edge. This arrangement can effectively protect the workers from cutting themselves when touching the edges.

Figure 12:
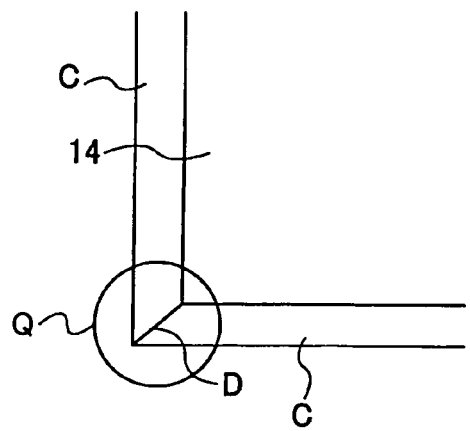
FIG. 12 illustrates the corner of the substrate having the chamfered edge lines.

FIG. 12 is an enlarged diagram of the corner edge Q of the substrate shown in FIG. 11A. At the corner edge Q, two perpendicular chamfered edges C meet with each other to create an edge line D.

Figure 13A:
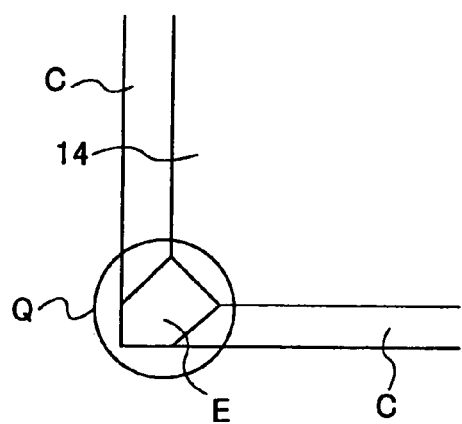
FIG. 13A and FIG. 13B illustrates yet other examples of the substrates having a chamfered corner formed on the chamfered edge lines.
Figure 13B:
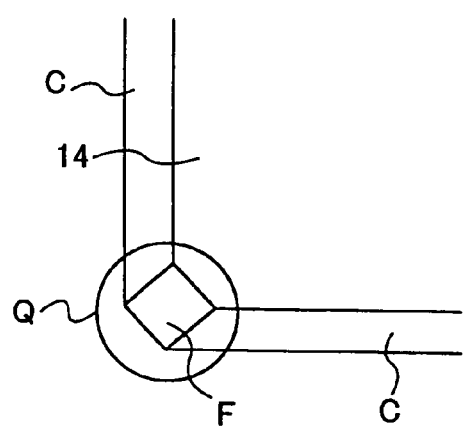

FIG. 13A and FIG. 13B illustrate yet other examples of edge configurations. In the example shown in FIG. 13A, the corner edge Q shown in FIG. 12, at which the two perpendicular (vertical and horizontal) chamfered edges meet with one another along the edge line D, is further chamfered to create a pentagonal chamfer E. In the example shown in FIG. 13B, the corner edge Q is further chamfered to create a quadrangular chamfer F at each of the four corners of the substrate 14.

By chamfering the substrate 14, accidents where workers cut their hands with the edges of the substrate during the fabrication process of the functional device mounting board (including transporting, replacing, and removing the substrate onto or from the fabrication apparatus) can be reduced.

As illustrated in FIG. 13, not only the side edges of the substrate, but also the corner edges are chamfered to eliminate sharp edges, and accordingly, the safe operation of the workers is further guaranteed. In addition, the substrate with the side edges and the corner edges chamfered as in the present invention is hardly damaged, unlike the conventional substrate with sharp edges made at a right angle, even when the corner of the substrates hits against something hard. Consequently, the manufacturing yield is improved.

The side edges and the corner edges are easily chamfered or rounded off by using abrasive material such as emery or carborandom #100 through #2000 or the like, or a grinding stone (grinder) made from these abrasive materials pressed by a binder. If the shape of the edge portions is rounded at a specific radius of curvature indicated by rXX in mechanical drawings, the grinder is shaped into a corresponding round shape in advance so that the object (that is, the corner edge of the substrate) becomes a desired curvature. In this case, the target edge is simply rubbed against the rounded face of the grinder.

As to the surface roughness of a chamfered processed portion, it is preferable to make the chamfered surface rougher than the surface roughness of the top face of the substrate, on which a group of functional devices are formed. The functional device forming surface is generally polished into a mirror-surface in order to guarantee the formation of precise and minute patterns. On the other hand, no functional device is formed at the chamfered portion, and therefore, it is unnecessary to make the chamfered portion excessively smooth. Rather, it is preferable to leave the chamfered portion rougher than the functional device forming area for the purpose of reducing the fabrication cost. Generally, the surface roughness of this chamfered portion is set from 0.5 s to 5 s.

As can be clearly understood from the above description, the functional device mounting board of the present invention prevents accidents, and improves the yield during manufacturing by chamfering the side edges and/or the corner edges of the original substrate.

The foregoing is about the processing of the edges of the functional device mounting board; however, the edge processing is equally applied to the cover plate that covers the functional device mounting board when manufacturing a display apparatus. It is also desirable to reduce accidents when the cover plate is handled during assemble of the display apparatus. The cover plate is generally formed by glass or plastic, and preferably, the side edges and/or the corner edges of the cover plate are chamfered in the same manner as the functional device mounting board.

The workers are protected from unexpected accidents by chamfering the edges extending along the sides of the top face or the edges extending along the sides of the back face of the cover platelate, and surfaces along the thickness and perpendicular to that front surface. The surface roughness of that chamfered portion of the cover plate is made rougher than that of the top and back surfaces of the cover plate for the purpose of reducing the cost.

Since the cover plate is likely to receive external impacts, it requires rigidity and durability. In the present invention, the thickness of the cover plate is made thicker than that of the functional device mounting board in order to avoid damage to the functional device mounting board due to accidental impact, which may be produced when hitting the display apparatus against something hard. It is also preferable to use reinforced glass to increase the durability of the cover plate, which will be described later.

Figure 14:
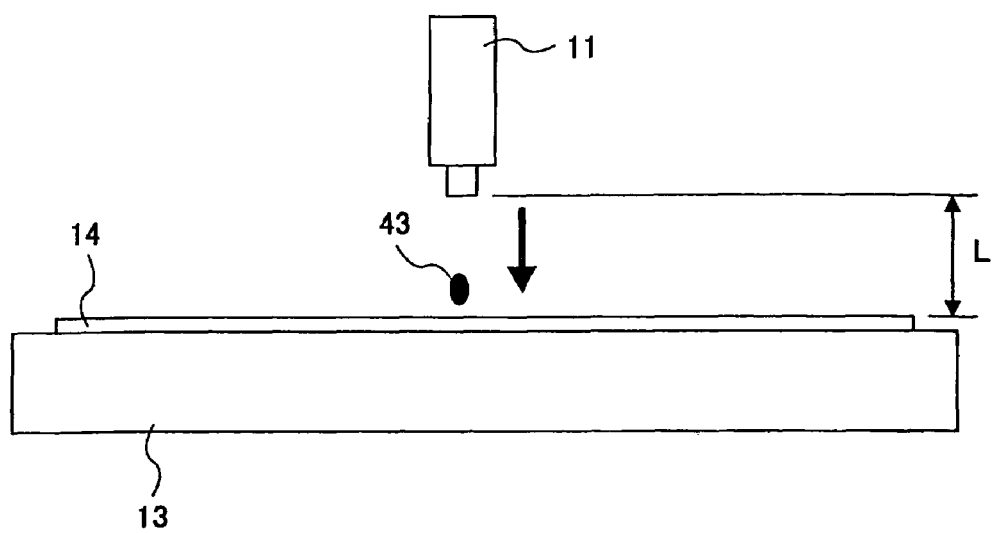
FIG. 14 illustrates the positional relation between the jet head of the droplet ejecting apparatus and the substrate on which functional devices are to be formed.

FIG. 14 illustrates another feature of the present invention. This example shows how the substrate 14 is held on the substrate support bench (or the substrate holder) 13 of the fabrication apparatus during the fabrication of the functional device mounting board. The substrate 14 is held horizontally (at approximately 90 degrees with respect to the vertical direction in which gravity force works) with the top face facing upward. The jet head 11 is placed above the substrate at distance L from the top face of the substrate 14 so that droplet 43 of the solution containing a functional material reaches the substrate 14 along the direction of gravity force, as indicate by the arrow. This arrangement is desired to preserve stable flying of the droplets and to guarantee accurate positioning of the droplets onto the substrate during application of the solution droplets. By placing the substrate face up, while setting the flying direction of the droplets ejected from the jet head 11 in the direction of the gravity force, stable flying of droplets 43 is achieved, allowing each droplet to reach the intended location on the substrate 14.

In order to apply droplets accurately onto the target position on the substrate, the precision and the mechanical strength of the large-screen substrates, to which the present invention is applied, have also to be maintained. To this end, the thickness of the substrate used in the present invention is set to 2 mm or greater.

As described earlier, a glass substrate such as silica glass, glass with reduced impurities (e.g., sodium (Na)), blue plate glass; or glass substrates covered with a $SiO_2$ layer, a ceramics-based substrate such as alumina covered with a $SiO_2$ layer, or a similar substrate may be used as the substrate 14. In general, these materials are fragile, as compared with metals, and easily damaged. Accordingly, the substrate made of these materials needs to have a certain degree of thick, otherwise the substrate may be broken during transportation or shipping.

Generally, blue plate glass has a bending strength of about 500 $kg/cm^2$. It is preferable to produce reinforced glass having a bending strength of approximately 1500 $kg/cm^2$, using a glass strengthening technique called air-cooling reinforcement, and to use such a reinforced glass plate as the substrate 14. This technique is effectively applied to a glass plate with a thickness ranging from 2 mm to 15 mm to increase the bending strength up to approximately 1500 $kg/cm^2$. If the thickness of the glass plate is less than 2 mm, bending strength of 1500 $kg/cm^2$ cannot be achieved; however, semi-reinforced glass can be produced by air-cooling reinforcement. The method for reinforcing the glass plate is not limited to air-cooling reinforcement, and any other technique, such as chemical reinforcement for giving compression strain to the surface of the glass plate through ion substitution, may be effectively used.

Since the functional device mounting board of the present invention is applicable to a high-quality and high-resolution image display apparatus, the accuracy in positioning the droplet at a precise position on the substrate is important. In order to achieve the highly precise positioning of droplet, deformation or warping of the substrate 14 must be eliminated. Such deformation or warping also prevent the substrate 14 from being transported correctly.

The present invention may be favorably applied to medium screen (approximately 300 mm×450 mm) and large screen (approximately 2000 mm×3000 mm) image display apparatuses. In these applications, degradation of the accuracy of the functional device due to deformation must be prevented. In view of this requirement, it is preferable to set the thickness of the substrate ranging from 2 mm to 15 mm. The lower limit of 2 mm is the thickness that guarantees stable fabrication of a reinforced glass plate in an ordinary manner.

Figure 15:
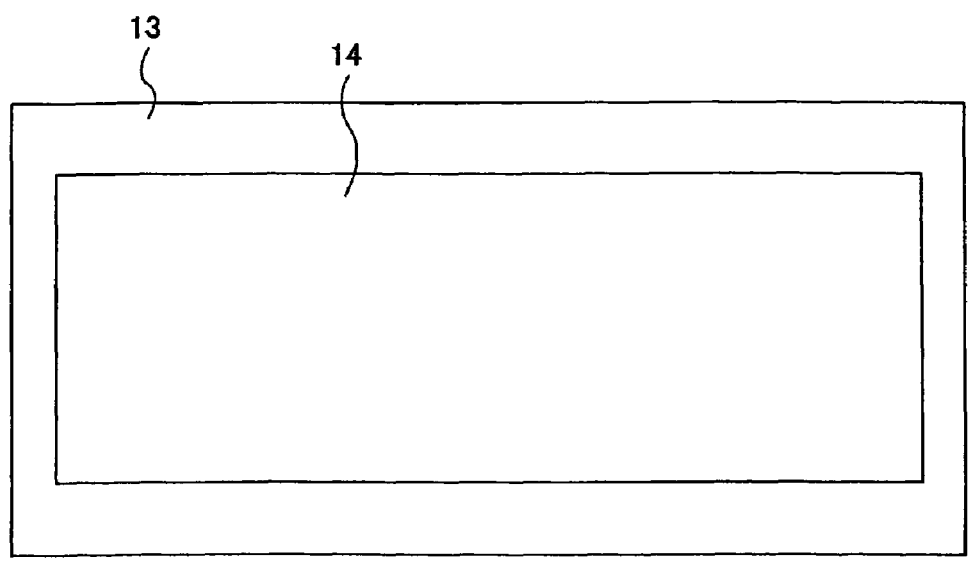
FIG. 15 is a plan view of the substrate placed on the substrate holder.

Holding the substrate 14 horizontally (approximately at 90° with respect to the vertical direction in which gravity force is applied) with the top face upward is effective to minimize deformation of the substrate 14 during fabrication of the functional device mounting board. FIG. 15 is a top view (in which the jet head is omitted) showing how the substrate 14 is placed on the substrate support bench (or holder) 13. The substrate 14 is held on the substrate holder 13 by surface contact with the holder 13, without inclination or floating from the top face of the substrate holder 13. This arrangement allows even a large-sized substrate, applicable to medium screen (approximately 300 mm×450 mm) or large screen (up to approximately 2000 mm×3000 mm) image display apparatuses to be held in a stable manner without causing the substrate 14 to deform or bend due to its own weight. Consequently, highly accurate positioning of droplets 43 is achieved. The upper limit of the thickness of the substrate 14 is preferably set to 15 mm from the standpoint of substrate manufacturing cost, as well as easiness for fabrication, handling, and transportation of the substrate.

Next, another feature of the present invention about the shape and size of the droplet 43 will be described. As has been described above, a solution containing a functional material is applied to the substrate 14 by ejecting fluid droplets from the jet head 11. The droplet flies through the air toward the intended position on the substrate 14. When forming a functional device on the substrate 14 making use of such an inkjet technique, stability in shape of the droplet 43 during the flying through the air has to be considered carefully. If stable flying of droplet 43 is guaranteed, the positioning accuracy of the droplet 43 onto the substrate 14 is also guaranteed. In contrast, if the flying condition of the droplet 43 is unstable, the droplet having reached the substrate is offset from the correct position. During the ejection, the droplet 43 is likely to be affected by disturbance or the air current in the air. Accordingly, it is necessary to shut out such disturbances, or alternatively, to apply a force so as to increase the stability in order to secure stable flying of droplet 43.

The present invention takes the above points into consideration, and it was examined through testing what directionality the droplet 43 should have when flying through the air and what length L the droplet 43 should travel from the jet head 11 to the substrate 14 in order to secure the stability required to form a functional device precisely. The apparatus shown in FIG. 2 is used to moving the jet head 11 by a carriage in the scanning direction, while pushing the droplet to fly through the air by means of liquid ejection of solution containing a functional material.

In the example shown in FIG. 2, the substrate (or the functional device mounting board) 14 is held horizontally, and the jet head 11 mounted on a carriage is placed above the substrate 14 so that droplets are ejected downward in the direction of gravity force. In this case, gravity force acts on the droplet and stabilizes the trajectory of the flying droplets. Consequently, the droplet flies onto the substrate in a stable manner.

However, if the length L (see FIG. 14) from the ejecting surface of the jet head 11 to the substrate 14 is increased, time taken for the droplet to fly to the substrate 14 becomes long. In this case, the droplet is more likely to be affected by disturbance. Accordingly, the optimum distance from the ejecting surface of the jet head 11 to the substrate 14 and the optimum shape of the droplet in the air were found through testing.

The experiment results are shown below. In the experiment, the substrate was held substantially horizontal and droplet 43 was ejected downward from the jet head 11, while varying the distance L from the ejecting surface of the jet head 11 to the substrate to evaluate flying stability of the droplet. Because flying stability cannot be observed directly, the shape of the droplet of solution containing the functional material on the substrate 14 was observed, and flying stability was evaluated from the observed shape.

The conditions of the solution and the jet head used in the experiment are indicated below.

The solution contained 0.1 weight percent (wt. %) solution of polyhexyl oxiphenylene vinylene mixed into o-dichlorobenzene/dodecylbenzene solution.

The jet head used in the experiment is a drop-on-demand inkjet head using piezo elements. The nozzle size of the inkjet head was 23 µm, the input voltage to the piezo element was 26 V, and the drive frequency was 9.6 kHz. Here the initial jet velocity of the droplet ejected downwards was 6 m/s, and the mass of one droplet was 5 pl. The carriage traveling speed in the X direction was set to 5 m/s. The distance between the jet head 11 and the substrate 14 was 3 mm.

A droplet was ejected under the same conditions as the actual device formation, and the shape of the droplet during flying was observed. The driving waveform (or pulse form) was controlled so that the droplet became a substantially round shape immediately before the droplet reached the substrate (in this example, after flying about 3 mm). When a droplet became elongated along the path of flight, without forming a perfectly round shape, then the driving waveform was controlled so as to make the length of the droplet equal to or smaller than three times the diameter. In addition, the driving condition (or the driving waveform) was chosen such that there were no minute droplets trailing behind the flying droplets.

Thereafter, aluminum was deposited upon this to carry out device formation. Lead lines of ITO and aluminum were extended with the ITO lines being positive electrode and the aluminum lines being negative, and upon application of 10 volts, the results shown in table 4 were obtained. This shows evaluation of the status of device formation upon the substrate and device performance for different lengths L between surface of the jet aperture in the jet head and the substrate.

In this table, a circle mark for the status of device formation on the substrate represents the correct positioning of droplet at the target position (which is defined by the barrier walls 3 enclosed with polyimide). A triangle represents the droplet partially offset from the target position. A cross mark represents the droplets offset from the target position. A circle for device performance denotes that a prescribed shape of orange-color light is emitted, and a cross mark denotes that the orange-color light is not emitted or only partially emitted (which means that the device is unsuitable for practical use).

TABLE 4

| L (mm) | Device formation status | Device performance |
| --- | --- | --- |
| 0.05 | x | x |
| 0.1 | o | o |
| 1 | o | o |
| 2 | o | o |
| 3 | o | o |
| 4 | o | o |
| 5 | o | o |
| 6 | o | o |
| 7 | o | o |
| 8 | o | o |
| 9 | o | o |
| 10 | o | o |
| 11 | Δ | x |
| 12 | Δ | x |
| 13 | x | x |

The above results show that when the length L from the surface of the jet aperture to the substrate was 0.05 mm, device formation was unsatisfactory. This is because the ejecting surface having jet apertures was too close to the substrate, and therefore, the droplet reaches the substrate before separating from the jet aperture.

If the fluid was ejected substantially downward from the jet head, and if the length L between the surface of the jet aperture and the substrate was set in the rage between 0.1 mm and 10 mm, then favorable device formation was achieved. If the length L was set larger than 10 mm, satisfactory devices were not obtained. As the length L increases, the flying distance also increases, and the droplet is more likely to be affected by disturbances.

In the present invention, droplets are ejected, while moving the carriage that mounts the jet head 11 in order to improve the productivity. The relative traveling speed between the jet head and the substrate (for example, the moving speed of the carriage in the X direction in FIG. 2) is determined not only from the viewpoint of improving the productivity, but also from the viewpoint of precise device formation on the substrate.

As a result of detailed study regarding the device formation using an inkjet technique, it was found that the ejection speed of the droplet has to be set greater than the relative traveling speed of the jet head 11. Since a droplet is ejected to form a functional device, while moving the jet head unit 11 in the X and Y directions relative to the substrate 14 with a certain distance between them, the velocity of the droplet is defined as a composite vector of the ejection velocity and the relative traveling velocity of the jet head. As for the positioning accuracy of the droplet, it is possible to control the droplet so as to reach the target position by appropriately selecting the jet timing, taking into consideration the distance between the functional device mounting board 14 and the surface of the fluid jet aperture in the jet head unit 11, and the velocity of the composite vector.

Nevertheless, even when the droplet is well-controlled so as to reach the intended location, if the relative velocity is too large, the droplet may be pulled by the relative velocity and run on the functional device mounting board. In this case, a group of functional devices cannot be fabricated in a precise shape of a matrix. The present invention incorporates consideration of this point. The results of this testing are shown below. In this example, an apparatus shown in FIG. 2 was used, and the traveling speed of the carriage 12 in the X-direction and the ejection speed of the jet head unit 11 were varied to study whether or not the droplet reaches the substrate in good condition so as to work as the functional device.

The substrate 14 used in the experiment has polyamide embankments (barrier layer) 3 made on the glass substrate having ITO transparent electrodes. The barrier layer 3 is formed by photolithography. The fabrication apparatus shown in FIG. 2 was used, and a 0.1 wt. % solution of polyhexyl oxiphenylene vinylene mixed in o-dichlorobenzene/dodecylbenzene mixed solution was ejected at different ejection velocities based on inkjet principles. The length between the jet head nozzle and the substrate was 3 mm.

The inkjet head used has a nozzle diameter of 25 μm and is a drop-on-demand inkjet head utilizing piezo elements, wherein the input voltage to the piezo element was varied from 18 V to 30 V in order to change the ejection velocity. The drive frequency was given as 9.6 kHz. With such a drop-on-demand type inkjet head using piezo elements, the ejection velocity can be changed by changing the voltage applied to the piezo elements. However, since the mass of the ejected droplet also changes in accordance with the change in applied voltage, the drive waveform (defined by the rising edge and the falling edge of the pulse, including for ejection while moving backwards) was adjusted so that the mass of the jet droplet was always substantially constant (in this case, 6 pl), and so that only the ejection velocity varied.

Figure 16:
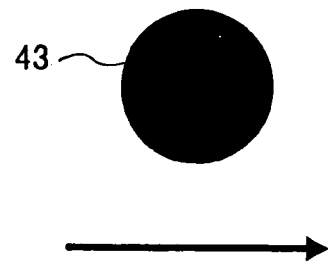
FIG. 16 illustrates a shape of the droplet ejected from the jet head of the droplet ejecting apparatus according to the invention.
Figure 17:
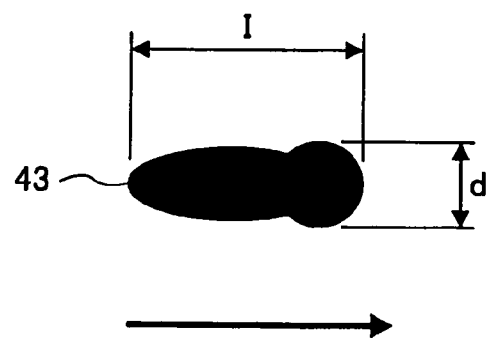
FIG. 17 illustrates another shape of the droplet ejected from the jet head of the droplet ejecting apparatus according to the invention.

A fluid droplet 43 was separately ejected under the same conditions as the actual device formation, and the shape of the droplet during the flight was observed. Then, a droplet was ejected while controlling the drive waveform so that the droplet became substantially round, as shown in FIG. 16, immediately before the droplet reached the substrate surface (in this example, after 3 mm flight). Even if a perfectly round sphere cannot be obtained, and instead, an elongated droplet extending along the path of flight is obtained as shown in FIG. 17, the length of the elongated droplet can be easily set equal to or smaller than three times the diameter (L≦3 d) simply by controlling the driving waveform. The drive conditions (including the drive waveform) were chosen so that there were no minute droplets 43' shown in FIG. 18 trailing behind the flying droplet 43.

Aluminum was deposited thereupon to carry out device formation. Lead lines are formed extending from the ITO and aluminum to make the ITO anode and make and the aluminum cathode, and a voltage of 10 volts was applied. The results shown in table 5 were obtained. In this table, a circle marked for the status of device formation on the substrate denotes that droplet reached the target region (within the barrier walls 3 enclosed with a polyimide), and cross mark denotes the droplet offset from the target region. A circle marked for device performance denotes that a predetermined shape of orange-color light is emitted, and a cross mark denotes that the orange-colored light is not emitted or only partially emitted (which is unsuitable for practical use).

TABLE 5

| Test No. | Jet velocity Vj (m/s) | Carriage traveling velocity in x direction Ve (m/s) | Device formation status upon substrate | Device performance |
| --- | --- | --- | --- | --- |
| 1 | 2 | 1 | ○ | ○ |
| 2 | 2 | 2 | x | x |
| 3 | 2 | 3 | x | x |
| 4 | 4 | 1 | ○ | ○ |
| 5 | 4 | 2 | ○ | ○ |
| 6 | 4 | 3 | ○ | ○ |
| 7 | 4 | 4 | x | x |
| 8 | 4 | 5 | x | x |
| 9 | 6 | 2 | ○ | ○ |
| 10 | 6 | 3 | ○ | ○ |
| 11 | 6 | 4 | ○ | ○ |
| 12 | 6 | 5 | ○ | ○ |
| 13 | 6 | 6 | x | x |
| 14 | 6 | 7 | x | x |
| 15 | 6 | 8 | x | x |
| 16 | 10 | 4 | ○ | ○ |

TABLE 5-continued

| Test No. | Jet velocity Vj (m/s) | Carriage traveling velocity in x direction Ve (m/s) | Device formation status upon substrate | Device performance |
| --- | --- | --- | --- | --- |
| 17 | 10 | 6 | ○ | ○ |
| 18 | 10 | 8 | ○ | ○ |
| 19 | 10 | 10 | x | x |
| 20 | 10 | 12 | x | x |
| 21 | 10 | 14 | x | x |

The above results show that favorable element formation cannot be achieved any longer when the traveling velocity of the carriage in the X-direction becomes equal to the jet velocity or exceeds it. To put it another way, in the case of forming a functional device mounting board using a drop-on-demand inkjet head with piezo elements, the velocity of the fluid droplet 43 ejected from the jet head 11 must be set greater than the traveling velocity of the carriage 12 in the X-direction. By so setting, an excellent functional device and an excellent functional device mounting board can be obtained without any minute droplets 43' attached on the substrate because the droplet flight conditions are chosen so that no minute droplets 43' are caused to trail behind the flying droplet 43.

Figure 18:
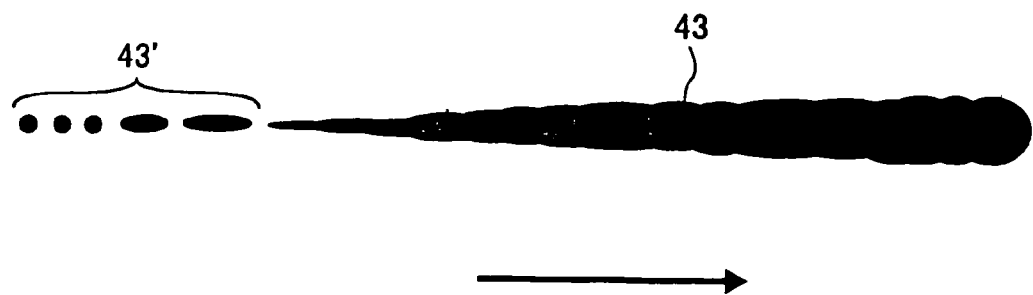
FIG. 18 illustrates still another shape of the droplet ejected from the jet head of the droplet ejecting apparatus by making use of the bubbles.

A comparison experiment was made using a commercially available monochrome head mounted in a printer manufactured by Hewlett Packard and sold under the trade name of DeskJet 970 Cxi as the inkjet head. The monochrome head was filled with the solution described above, instead of ink. The solution was ejected from the monochrome head to form a functional device mounting board in the same manner in order to examine whether or not the functional device formed on the substrate correctly functions. With this monochrome head, the mass of the ejected droplet was a substantially constant quantity of 6 pl. However, unlike the drop-on-demand inkjet head using piezo elements, the shape of the droplet was elongated too much (L=10*d to 20*d) along the direction of flight as shown in FIG. 18. In addition, lots of minute droplets followed the flying droplet.

The monochrome head is of a thermal inkjet type, which is different from the drop-on-demand type inkjet head using piezo elements. In the thermal inkjet head, a bubble is generated instantaneously in the liquid, which acts on the liquid to cause a droplet to be ejected from the inkjet head. There are two types of thermal inkjets, namely, a side shooter, where a fluid droplet is jet in the same direction as the main direction of growth of the bubble, and an edge shooter, where a fluid droplet is jetted in a direction substantially perpendicular to the main direction of growth of the bubble. The monochrome head used in the comparison example is of the former type.

Nevertheless, regardless of the type of the thermal inkjet methods, the ejection force caused by the bubble is too large because the bubble is generated near the ejection port of the nozzle, unlike the drop-on-demand inkjet head. Accordingly, the droplet is excessively elongated accompanied by many particles (minute droplets), as illustrated in FIG. 18.

Table 6 shows the comparison results when the above-described head was used. The ejection velocity of the fluid droplet was changed by varying the voltage applied to the heating element ranging from 22 V to 23 V.

TABLE 6

| Test No. | Spray velocity Vj (m/s) | x direction carriage traveling velocity Vc (m/s) | Device formation status upon substrate | Device functioning |
| --- | --- | --- | --- | --- |
| 1 | 6 | 1 | ○ | ○ |
| 2 | 6 | 2 | ○ | ○ |
| 3 | 6 | 3 | x | x |
| 4 | 6 | 4 | x | x |
| 5 | 6 | 6 | x | x |
| 6 | 6 | 8 | x | x |
| 7 | 6 | 10 | x | x |
| 8 | 6 | 12 | x | x |
| 9 | 6 | 14 | x | x |
| 10 | 9 | 1 | ○ | ○ |
| 11 | 9 | 2 | ○ | ○ |
| 12 | 9 | 3 | ○ | ○ |
| 13 | 9 | 4 | x | x |
| 14 | 9 | 6 | x | x |
| 15 | 9 | 8 | x | x |
| 16 | 9 | 10 | x | x |
| 17 | 9 | 12 | x | x |
| 18 | 9 | 14 | x | x |
| 19 | 12 | 1 | ○ | ○ |
| 20 | 12 | 2 | ○ | ○ |
| 21 | 12 | 3 | ○ | ○ |
| 22 | 12 | 4 | ○ | ○ |
| 23 | 12 | 6 | x | x |
| 24 | 12 | 8 | x | x |
| 25 | 12 | 10 | x | x |
| 26 | 12 | 12 | x | x |
| 27 | 12 | 14 | x | x |

The above results show that favorable element formation is not achieved when the traveling velocity of the carriage in the X-direction becomes greater than one third (⅓) the ejection velocity.

Upon comparative study of the results in table 5 and table 6, the following can be said: Specifically, when a drop-on-demand inkjet head using piezo elements is employed to eject a solution droplet, the carriage traveling velocity can be increased, as compared with the thermal inkjet head, because the droplet becomes spherical according to the principle of liquid ejection, as illustrated in FIG. 16. Even if the droplet becomes elongated in the direction flight, as illustrated in FIG. 17, the length of the elongated droplet is controlled so as not to exceed three times the diameter thereof, without causing minute droplets or particles behind the droplet. Even if the carriage traveling velocity is set faster in the piezo-element drop-on-demand inkjet head than in the thermal inkjet head, a functional device can be formed appropriately, which exhibits satisfactory device performance. In addition, such piezo-element drop-on-demand inkjet head is beneficial in its simple structure, in which the displacement of the piezo element is mechanically propagated to the liquid directly or via the oscillation plate (thereby ejecting a droplet using a force produced by the mechanical displacement). Since no thermal force acts on the liquid, unlike in the case of the thermal inkjet head, a wide variety of liquids can be selected to form a functional device.

In other words, various different types of functional devices can be formed using a drop-on-demand inkjet head using piezo elements, as long as the ejection velocity is set greater than the carriage traveling velocity.

Moreover, the shape of the droplet can be easily controlled so as to be spherical, or even if the droplet is elongated in the direction of flight, the length of the droplet can be controlled so as to be within three times the diameter, without causing undesirable liquid particles trailing behind the ejected droplet. Accordingly, a good functional device mounting board can be obtained without undesirable minute droplets spreading on the substrate.

Of course, a thermal inkjet method may be used to form the functional device. In this case, a good functional device mounting board can be obtained if the carriage traveling velocity is set equal to or smaller than one third (⅓) the ejection velocity. If the carriage traveling velocity suitable for the piezo-element drop-on-demand inkjet head is selected for the thermal inkjet head, it becomes difficult to form a satisfactory functional device mounting board. By selecting appropriate heat-resistant fluids, desirable functional device formation is also achieved even using a thermal inkjet head.

Although the testing results are not specifically mentioned here, a continuous flow method can be equally used, which is capable of creating a uniform droplet as shown in FIG. 16. In this case, the carriage can be driven under the same conditions as in the piezo-element drop-on-demand inkjet head. Accordingly, the carriage traveling velocity is set smaller than the ejection velocity of the fluid droplet.

An electrostatic type drop-on-demand inkjet head may also be used, which uses accumulation and discharge of electrostatic force between two opposed electrodes as the displacement principle, instead of the physical displacement of the piezo element. The accumulation and discharge of electrostatic force causes a mechanical displacement of the oscillation plate, which then creates a droplet similar to that created by the piezo element. In this case, the conditions are selected so that the carriage traveling velocity is slower than the ejection velocity.

Next, another feature of the present invention will be described. As described earlier, with the present invention, functional devices are formed using an inkjet technique to eject a droplet containing a functional material onto a substrate (e.g., a glass substrate or a ceramics-based substrate). The dot shape formed by the application of the fluid droplet between device electrodes becomes important. If a favorable round dot is formed on the substrate, highly precise formation of the functional device can be achieved. However, when the dot shape is degraded, the functional device cannot be formed precisely. For instance, if the dot formed on the substrate is not round, but with dispersed minute droplets, a good functional device cannot be obtained.

Generally, inkjet printers eject ink droplets onto paper to reproduce an image, and the dots of the ink droplets attached to the paper are quickly absorbed into the fibers of the paper when the ink droplet hits the paper. If paper is coated with an ink absorbent material, such as calcium carbonate, the ink droplet is immediately absorbed into the coating film of the ink absorber when the ink droplet reaches the paper. Accordingly, even if a subsequent droplet hits the same position as the previous droplet, no ink dispersion occurs because the previous droplets has already been absorbed into the paper, without causing problems. Consequently, a favorable round dot is obtained, and high-resolution print quality can be obtained.

Meanwhile, the present invention involves the inkjet technique to eject a droplet onto a substrate (such as a glass substrate, a ceramics-based substrate, or a plastic-based substrate) that does not absorb the droplet, but maintains it on its surface. Accordingly, unlike the ejection of ink droplets onto paper, the droplet remains on the substrate with a slightly flattened semi-spherical shape. The volatile ingredients of the fluid droplet vaporize, while other ingredients remain on the, substrate. If the subsequent droplet hits the previous droplet before the solidification of the ingredients, dispersion or splattering of the minute droplets occurs, which disturbs the desired formation of functional devices. This also applies to the first droplet because the droplet is not absorbed in the substrate, unlike the case in which the ink droplet ejected from a inkjet printer is immediately absorbed in the fiber of paper. The first droplet may also disperse unless the optimum conditions are chosen. This is a major difference between the present invention and an ordinary inkjet printer designed for printing on paper.

In other words, because a fluid droplet is ejected onto a substrate (e.g., a glass substrate, a ceramics-based substrate such as alumina, or a plastic-based substrate) having a surface property that holds the fluid without absorbing it, the conditions have to be chosen carefully so as to create a round dot on the substrate, while preventing dispersion of the droplet; otherwise, a good functional device mounting board cannot be produced. Taking this point into consideration, the appropriate conditions for forming a favorable round dot without dispersion upon formation of the dot were found through experiment. The experiment results are shown in table 7.

The test involved ejection of droplets of a solution containing a functional material onto a silica glass substrate with a mirror-polished surface based on the inkjet principle, the impacting fluid containing functional material. The ejection velocity of the droplets was varied, and the dot conditions (including the positioning accuracy and the shape of the dot formed on the substrate) were observed. Dispersion of liquid particles (minute droplets) about the major dot was also examined. Then, aluminum was sputtered to form a functional device in order to check whether the functional devices correctly worked as an organic EL device emitting a prescribed degree of light.

The specific conditions for this experiment are given below.

The solution used was a 0.2 wt. % solution of polyhexyl oxiphenylene vinylene mixed with O-dichlorobenzene/dodecylbenzene mixed solution.

The jet head used in the experiment had a construction similar to the edge-shooter type thermal inkjet head (see FIG. 22). Instead of a rectangular nozzle, a nozzle plate with round nozzle openings in the end face of the fluid channel was attached to this jet head. Instead of ink, the above-mentioned solution was used. The nozzle diameter was 25 μm, and the size of the heating element was 25 μm×90 μm (with a resistance value of 118 Ω). The driving voltage was selected ranging from 20 V to 24 V, and the pulse width was 5 μs to 7 μs. The ejection velocity of the droplet was varied within the range of 0.5 m/s to 12 m/s to examine the positioning accuracy of droplet on the substrate, as well as the dot shape and dispersion of minute droplets. The experiment results are shown in table 7. The carriage scanning speed was set to 0.1 m/s in order to remove the instability factor when ejecting droplets. (The carriage traveling velocity was made slower than the ejection velocity of fluid droplets so that the carriage motion would not degrade the positioning accuracy of the droplets on the substrate).

In Table 7, a circle marked in the droplet positioning accuracy denotes the case in which dot offset was within half the dot diameter, and a cross mark denotes the case in which the dot offset was greater than half the dot diameter. In the cross-marked cases (test Nos. 1 through 3), the dot offset was varied ranging from one dot diameter to five dot diameters. As for the dot shape, a circle represents a favorable round dot. A triangle represents a slightly deformed round dot estimated through sensory evaluation although, in general, almost a round shape was obtained. Concerning dispersion of liquid particles (or minute droplets), a circle indicates the case in which no dispersion was observed, and a cross mark indicated the case in which dispersion of minute droplets (tiny splatters around the major dot) was observed.

Lead lines of ITO and aluminum were extended to make the ITO anode and make the aluminum cathode, and a voltage of 12 volts was applied to check the device performance by examining whether or not favorable orange light was emitted. A circle represents the case in which a predetermined shape of orange light was emitted, and a cross mark denotes the case in which orange light was not emitted or only partially emitted (unsuitable for actual use).

TABLE 7

| Test No. | Ejection velocity (m/s) | Droplet positioning accuracy | Dot shape | Minute droplet dispersion status | Device performance |
| --- | --- | --- | --- | --- | --- |
| 1 | 0.5 | x | Δ | ○ | x |
| 2 | 1 | x | Δ | ○ | x |
| 3 | 2 | x | ○ | ○ | x |
| 4 | 3 | — | ○ | ○ | ○ |
| 5 | 4 | — | ○ | ○ | ○ |
| 6 | 5 | — | ○ | ○ | ○ |
| 7 | 6 | — | ○ | ○ | ○ |
| 8 | 7 | — | ○ | ○ | ○ |
| 9 | 8 | — | ○ | ○ | ○ |
| 10 | 9 | — | ○ | ○ | ○ |
| 11 | 10 | — | ○ | ○ | ○ |
| 12 | 11 | — | Δ | x | x |
| 13 | 12 | — | Δ | x | x |

The experiment result indicates that it is necessary to set the ejection velocity of fluid droplet to the range between 3 m/s to 10 m/s in order to form a good functional device (an organic EL device mounting board, in this case), in view of the positioning accuracy, the dot shape, and the condition of dispersion of minute droplets. In other words, by setting the ejection velocity of the fluid droplet within the above-mentioned range, the ejection becomes stable and the positioning accuracy is improved. In addition, since the droplet reaches the substrate at an appropriate speed, undesirable mist or dispersion of the droplet can be prevented even if a subsequent droplet hits the previous droplet on the substrate. Consequently, a precise pattern of functional devices can be formed without variation in device performance among functional devices.

Figure 19:
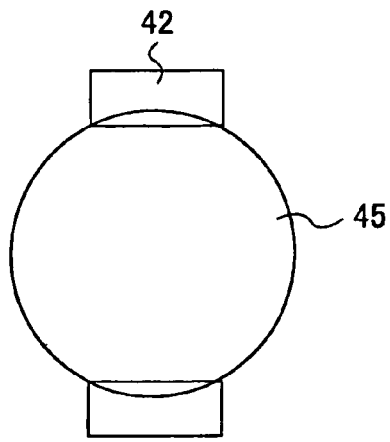
FIG. 19 illustrates an example of the functional device having a functional material formed by one droplet between the electrodes.

Next, another arrangement of the present invention will be described. In FIG. 4, a droplet 43 is ejected onto the space between a pair of device electrodes 42, and the functional device is illustrated as a round dot image 44 placed between the electrodes. If a functional device to be formed requires a not so high degree of precision, a large-sized droplet 43 is placed between the electrodes 42, thereby forming the functional device as a dot image 45, as shown in FIG. 19. For instance, if the distance between the device electrodes 42 is 5 mm to 10 mm, and if the dot diameter is 8 mm to 15 mm, then the functional device can be formed by a single dot application. In this case, only a certain degree of precision can be expected for the functional device; however, as long as ordinary functionality is achieved, application of a single droplet for forming a device is very efficient. The ordinary functionality is, for instance, light emission if the device is a light-emitting device, switching if the device is a transistor, or electron discharge if the device is an electron discharge device.

Figure 20:
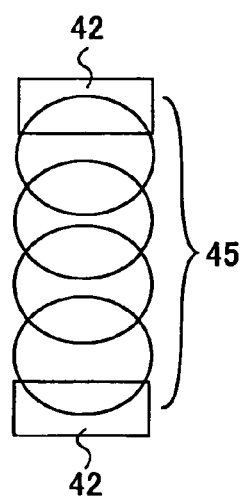
FIG. 20 illustrates another example of the functional device having a functional material formed by several droplets between the electrodes.

Nevertheless, in order to form a more precise functional device, it is desired to form the device with multiple droplets that defines a dot pattern 45 having a smoother outline, as illustrated in FIG. 20. In a preferred example, it is assumed that the distance between the device electrodes 42 is set to 140 μm. In this case, if a functional device is formed with a single droplet, the dot diameter is about 180 μm. If the same device is formed with four dots, as in FIG. 20, the dot diameter is about 65 μm. In the latter case, four dot patterns make an alignment between the electrodes 42, overlapping each other to fill the 140 μm gap. Whether to form the functional device with a single droplet or multiple droplets can be determined appropriately, depending on the intended productivity and precision. The preferred conditions chosen to create the four-droplet dot pattern shown in FIG. 20 are described below.

The solution used to form the functional device was 0.2 weight percent polyhexyl oxiphenylene vinylene mixed in o-dichlorobenzene/dodecylbenzene mixed solution.

The jet head has a structure similar to that used in the edge shooter type thermal inkjet technique (but using the above-described solution, instead of ink). To create a dot with a diameter of about 65 μm, as shown in FIG. 20, the nozzle diameter of the jet head was 28 μm, and the size of the heating element was 28 μm×90 μm having a resistance value of 121 Ω. The driving voltage was 24.6 V, the pulse width was 6 μs, and a driving frequency is 10 kHz. The energy for producing a droplet was approximately 30 μJ, and the ejection speed was about 7 m/s.

Figure 21:
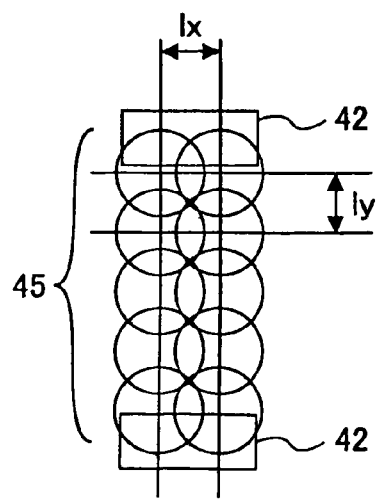
FIG. 21 illustrates still another example of the functional device having a functional material formed in two lines between the electrodes, each line consisting of several droplets.

These conditions were specifically chosen to generate four dots between the device electrodes 42 separated by a distance of 140 μm, and therefore, the present invention is not limited to these conditions. FIG. 21 illustrates another example, in which two lines of droplets, each consisting of five droplets, are placed between the same device electrodes 42 separating by 140 μm. In this example, the dot diameter is 45 μm. To create this size of dot image, the nozzle diameter of the jet head is 20 μm, and the size of the heating element is 20 μm×60 μm with a resistance value of 102 Ω. The driving voltage is 13.5 V, the pulse width is 4 μs, and the driving frequency is 16 kHz. The energy for producing a droplet is approximately 7.1 μJ. The ejection velocity of droplet is 6 m/s.

Of course, the length between the device electrodes 42 is not limited to 140 μm. If the functional device mounting board is used for a high resolution image display apparatus, the functional devices have to be arrayed more densely. In such a case, the distance between the device electrodes 42 may be set to 50 μm. The jet head may have nozzles with a diameter of 20 μm and a corresponding size of heating elements. The driving conditions are also appropriately selected in accordance with the degree of precision. In the present invention, the number of droplets applied between the device electrodes may be suitably chosen from 1 through 30 droplets, and suitable conditions are chosen in accordance with the distance between the device electrodes 42 and the precision requirement. The number of droplets applied between the electrodes also depends on the nozzle diameter of the jet head, but from the standpoint of productivity, it is preferable that the number be at most 30 droplets. (While it is possible to apply a greater number of smaller droplets, productivity decreases and it becomes disadvantageous from the standpoint of cost.)

Next, overlap of the droplets when the functional device is formed by multiple droplets placed between the device electrodes will be described. In the previous example, the length between the device electrodes 42 is 140 μm. If this distance is filled by a single droplet as in FIG. 19, the dot diameter is approximately 180 μm. The 140"m gap between the device electrodes 42 can be filled with ten droplets each with a diameter of 45 μm to create a highly precise pattern, as illustrated in FIG. 21. In FIG. 21, each dot is drawn as a circle line to indicate the outline and how the dots overlap each other.

In the example shown in FIG. 21, the droplets are ejected so that diagonally adjacent dots. are tangent to each other. In other words, the two lines of dots are arranged so that distance $1x$ between the centers of two horizontally adjacent dots, and distance $1y$ between the centers of two vertically adjacent dots each becomes $\frac{1}{2}^{1/2}$ ($1/\sqrt{2}$) times the dot diameter. This condition is the marginal condition necessary to cover the entire underlayer with dots when filling the gap between the electrodes with multiple droplets. Accordingly, in the present invention, the dots are arranged so that the lengths $1x$ and $1y$ in two perpendicular directions between the centers of two dots aligning in the two perpendicular directions become $1/\sqrt{2}$ times the dot diameter or smaller, for the purpose of completely covering the underlayer.

By ejecting the droplet so as to satisfy the above-described condition, the solution containing the functional material completely covers the under layer located between the device electrode, and the quality of each functional device becomes stable. In addition, since a plurality of dots of droplets hit the substrate overlapping each other, the dot pattern becomes smoother, and consequently, a highly precise functional device can be formed.

The specific conditions for forming this sort of fluid droplet and dot are shown below.

The solution used was 0.2 weight percent solution of polyhexyl oxiphenylene vinylene mixed in o-dichlorobenzene/dodecyl benzene mixed solution.

The jet head has a structure similar to that used in the edge shooter thermal inkjet method (but using the above-described solution, instead of ink). The nozzle diameter of the jet head was 20 μm, which was used to create the dot with a diameter of 45 μm as shown in FIG. 21. The size of the heating element was 20 μm×60 μm with a resistance value of 102 Ω. The driving voltage is 13.5 V and the pulse width was 4 "s. The energy required to produce a droplet was approximately 7.1 μJ. The ejection velocity was approximately 6 m/s.

These conditions were chosen to fill the gap of 140 μm between the device electrodes with ten droplets, and the invention is not limited to this example. The number of drops is not limited to ten, and more droplets may be used. Similarly, the invention is not limited to the arrangement of two lines of five dots shown in FIG. 21, and three or more lines of dots may be formed.

Again, the length between the device electrodes 42 is not limited to 140 μm. If the functional device mounting board is used for a high resolution image display apparatus, the functional devices have to be arrayed more densely. In such a case, the distance between the device electrodes 42 may be set to 50 μm. The jet head may have nozzles with a diameter of 20 μm and a corresponding size of heating elements. The driving conditions are also appropriately selected in accordance with the degree of precision.

The number of droplets applied between the device electrodes may be suitably chosen from 2 through 30 droplets, and suitable conditions are chosen in accordance with the distance between the device electrodes 42 and the precision requirement, without being limited to fixed conditions. In short, it is important to place the dots so that the lengths $1x$ and $1y$ between the centers of two horizontally and vertically adjacent dots becomes $1/\sqrt{2}$ times the dot diameter, in order to completely cover the underlayer located between the device electrodes with the dots.

Next, the jet head according to the present invention will be described in conjunction with FIG. 22. In this example, the jet head has four nozzles. This jet head is formed by coupling a thermal element substrate 51 and a cover substrate 52. The thermal element substrate 51 has individual electrodes 54, a common electrode 55, and heating elements (energy, creating members) 56, which are formed on a silicon substrate 53 by a wafer process.

Figure 22A:
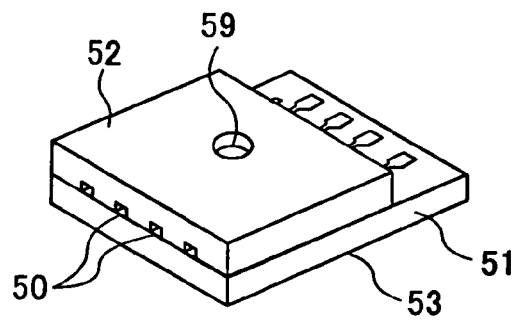
FIG. 22A through FIG. 22C illustrate examples of thermal-type jet head suitably applied to the droplet ejecting apparatus of the present invention.

Meanwhile, the cover substrate 52 has grooves 57, which become channels for guiding the solution containing a functional material, and a recess 58 that configures a common fluid chamber (not shown in the figure) for reserving the solution, which is to be guided through the channels. The cover substrate 52 is combined with the thermal element substrate 51 as shown in FIG. 22A, whereby the channels and the common fluid chamber described above are created.

When the thermal element substrate 51 and the cover substrate 52 are coupled to each other, the thermal elements 56 are positioned in the bottom of the channels. In this state, nozzles 50 are formed at the ends of the channels to eject a portion of the solution guided through these channels as fluid droplets. In addition, a solution inlet port 59 is formed in the cover substrate 52 to allow supply of solution into the solution supply chamber using supply means (not show in the figure).

Figure 22B:
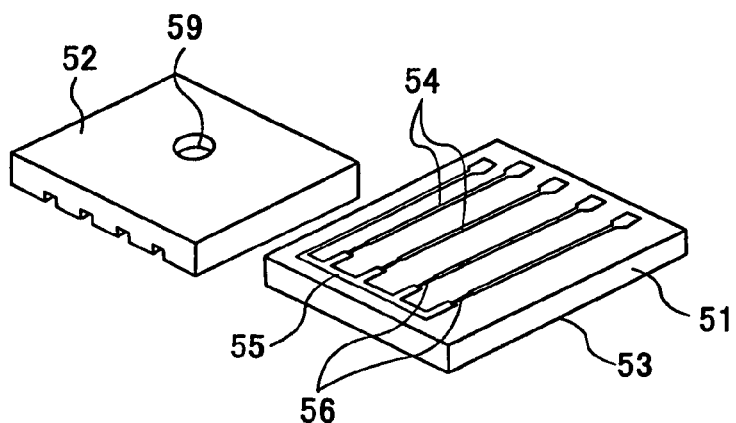
Figure 22C:
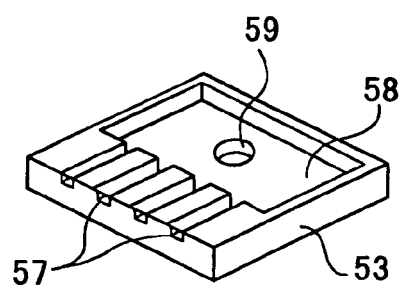

FIG. 22B is a perspective view when the thermal element substrate 51 and the cover substrate 52 are separated, and FIG. 22C is a bottom view of the cover substrate 52 shown in FIG. 22B.

In the example shown in FIG. 22, the ends of the trenches 57 become the nozzles 50 with no additional configuration; however, it is also allowable for nozzle plates in which round nozzles have been opened to be provided at these ends. In this example, a four-nozzle jet head is shown. This type of multi-nozzle jet head is capable of forming a functional device efficiently. Of course, it is not always necessary to have four nozzles. It is naturally understood that a greater number of nozzles will allow functional elements to be formed more efficiently. Nevertheless, this does not mean that the number of nozzles is simply increased. As the number of nozzles increases, the cost of the jet head increases and clogging is more likely to occur in the jet nozzles. Accordingly, the above-described factors should be determined, taking into account the overall balance of the apparatus (including the balance of the cost and the fabrication efficiency).

The same applies to the length of the nozzle array (the effective jet width of the jet heads). Namely, merely increasing the length of the nozzle array (the effective jet width of the jet heads) is inadequate, and the overall balance of the apparatus (balance of apparatus cost and functional device fabrication efficiency) has to be considered.

To give an example, with the present invention, the number of nozzles and the array density thereof are determined so that the length of the multi-nozzle nozzle array (the effective jet width of the jet heads) is equal to or greater than the length between the device electrodes 42. However, it is not intended here for the term "greater" to mean infinitely greater, but rather slightly greater than the length between the device electrodes 42. Therefore, the basic idea of the present invention is that by using a jet head with a nozzle array length (effective jet head jet width) equal to the length between the device electrodes 42, the cost of the jet head can be minimized. This idea also realizes efficient fabrication of functional devices.

To give more specific values, a pattern made of four droplets is formed between the device electrodes 42 with a distance of 140 µm between them. In this case, the length of the four-nozzle array shown in FIG. 22 (which is the effective jet width of the jet heads or the length between the nozzles on each end) is approximately 127 µm. This length can be regarded as substantially the same as the length of 140 µm between the device electrodes 42. The distance between adjacent nozzles is approximately 42.3 µm. When viewed in terms of inkjet printers, this arrangement would correspond to a nozzle array density corresponding to 600 dpi (dots per inch).

The above-described example is directed to the four-nozzle jet head shown in FIG. 22; however, a six-nozzle jet head with an inter-nozzle length of 42.3 µm can also be used. In this case, with the present invention, the length of the six-nozzle nozzle array (the effective jet width of the jet heads or length between the nozzles on each end) is approximately 212 µm, which can be interpreted as larger than the length of 140 µm between the device electrodes 42. The distance between the device electrodes 42 can be sufficiently covered by the length of the nozzle array, which allows functional devices to be fabricated efficiently.

Figure 23:
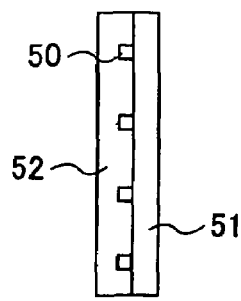
FIG. 23 is a front view of a multi-nozzle type jet head.
Figure 24:
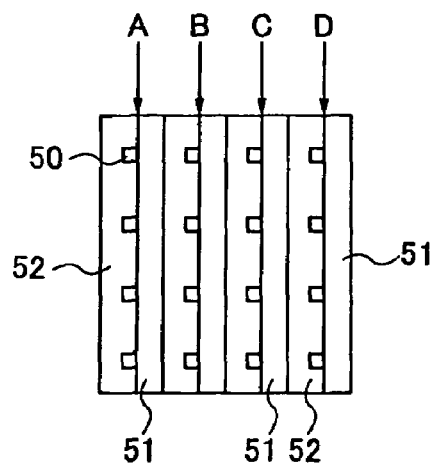
FIG. 24 is a front view of a jet head unit in which several multi-nozzle jet heads are stacked, each multi-nozzle jet head being used for a different type of solution.
Figure 25:
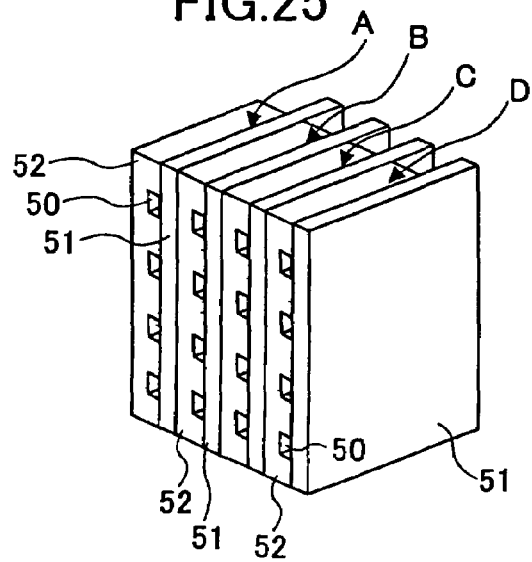
FIG. 25 is a perspective view of the jet head unit shown in FIG. 23.

FIG. 23 shows a view of the multi-nozzle fluid jet head fabricated as described above when seen from the nozzle 50. In the present invention, such a multi-nozzle jet head is provided for each type of solution to be ejected, and a plurality of multi-nozzle jet heads are loaded on the carriage, as illustrated in FIG. 24. FIG. 25 is a perspective view of FIG. 24.

In FIG. 24 and FIG. 25, each of the multi-nozzle fluid jet heads are assigned reference symbols A, B, C, and D. The nozzles of each of the jet heads A, B, C, and D are arranged apart from the nozzles of other jet heads, and these jet heads are filled with solutions containing different kinds of functional materials. For example, each jet head is filled with a solution containing a different organic EL material for emitting light of red, green, or blue, and ejects the solution to predetermined positions.

Figure 26:
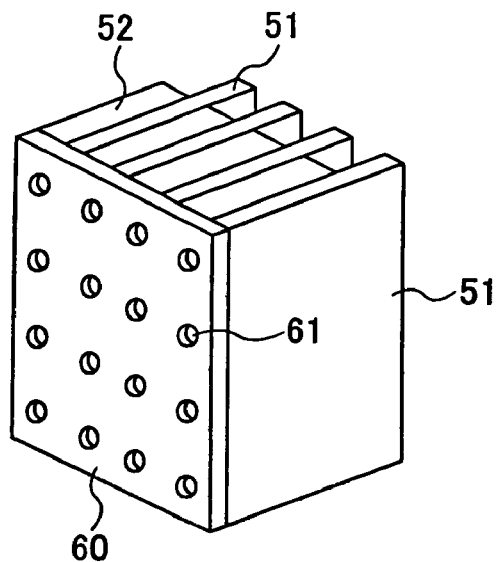
FIG. 26 illustrates still another example of the multi-nozzle jet head unit having a common nozzle plate.

FIG. 24 and FIG. 25 show an example of multi-nozzle fluid jet heads integrated into a single head unit according to the invention. There may be a structure as shown in FIG. 26 as an integrated head unit, which has a common nozzle plate 60 with a number of nozzles 61 formed therein. However, this head unit has a problem. If different solutions filled in the adjacent jet heads flow along the common nozzle plate, and if the mixture of these different solutions is ejected from the nozzles, then the resultant functional device cannot exhibit the intended function. This may degrade the quality of the functional devices.

The example shown in FIG. 26 is an inkjet printer head. In the case of inkjet printing, even if different inks mix with each other on a single, common nozzle plate surface, and even if such mixed ink is ejected onto paper, the problem is not so serious, although the image quality may be slightly degraded. This is because, in the case of inkjet, the image reproduced on the paper is not a functional device, and it does not have to exhibit a specific function, unlike the present invention. Therefore, it is difficult to apply the integrated head unit with a single, common nozzle plate shown in FIG. 26 and used in an inkjet printer head to the present invention. Although the present invention employs the multi-nozzle jet head unit to eject different types of solutions containing different functional materials from the respective jet heads, the ultimate object to be formed is a functional device, such as an organic EL device or an organic transistor. Such a functional device has to exhibit the intended function. If undesirable impurities are mixed in the functional device, the device performance naturally drops, and becomes unsuitable for practical use.

In consideration of the above-described points, the present invention uses a fluid jet head unit as shown in FIG. 24 and 25, in which the nozzle part of each jet head is separate from other jet heads. In other words, with the present invention, each fluid jet head is independently formed, and thereafter assembled into a single unit. Since the nozzle part of each jet head is independent of other jet heads, a solution will not become mixed into other solutions of other jet heads (unlike the structure shown in FIG. 26 having a single, common nozzle plate, where a solution is very likely to flow to the neighbor jet heads and become mixed to the other solutions).

Figure 27:
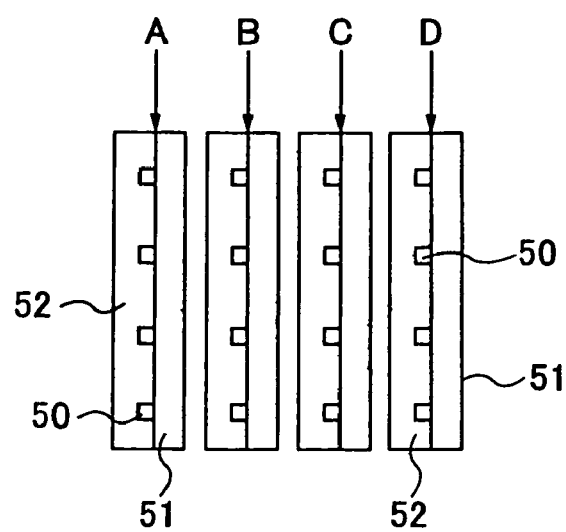
FIG. 27 illustrates yet another example of the multi-nozzle jet head unit having several multi-nozzle jet heads arranged apart from each other.

To implement the above-described concept more effectively, the fluid jet heads may be combined into a unit with each jet head completely separate from each other, as illustrate in FIG. 27.

FIG. 28 illustrates another arrangement of the present invention, showing the relation between the carriage moving direction and the positioning of the multi-nozzle jet head unit. The multi-nozzle jet head unit is loaded on the carriage. The carriage is driven in the scanning direction, while the multi-nozzle jet head unit ejects droplets of solution containing functional materials.

Figure 28A:
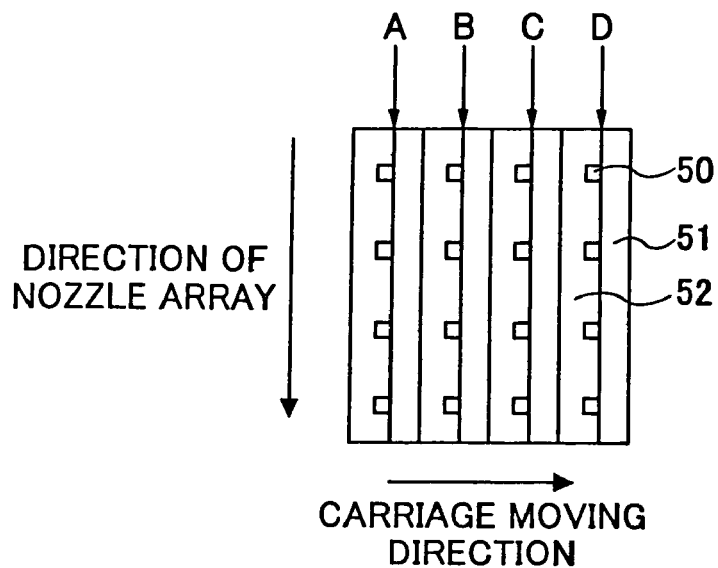
FIG. 28A,B illustrates the relation between the carriage moving direction and the nozzle arrangement of the jet head when the multi-nozzle jet head unit moves along with the motion of the carriage, while ejecting a solution containing a functional material.
Figure 28B:
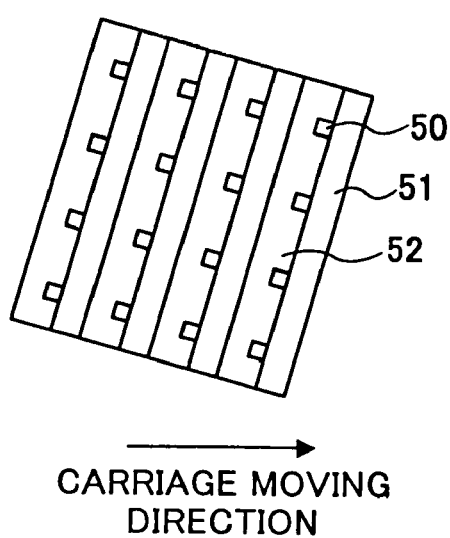

FIG. 28A is an example where the direction of the multi-nozzle array of each jet head is set perpendicular to the carriage moving direction. FIG. 28B is an example where the array direction of the multi-nozzle jet head is inclined with respect to the carriage moving direction, with a certain angle from the vertical.

Figure 29:
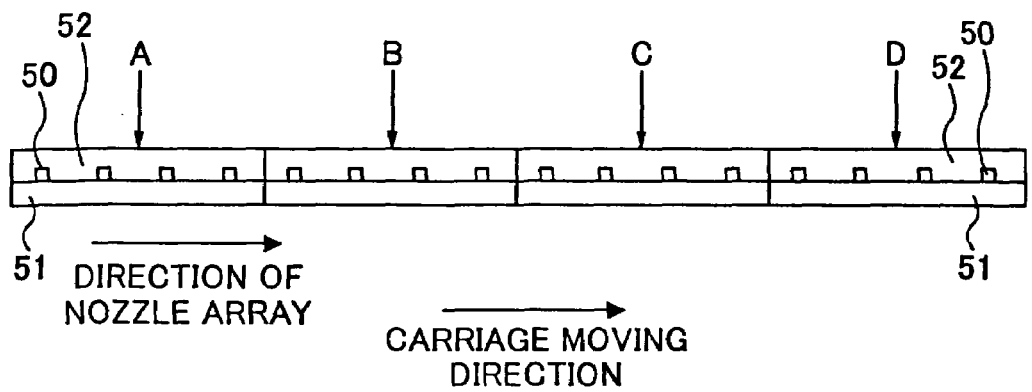
FIG. 29 illustrates another example of the nozzle arrangement, in which the direction of multi-nozzle arrangement is parallel to the carriage moving direction.
Figure 30:
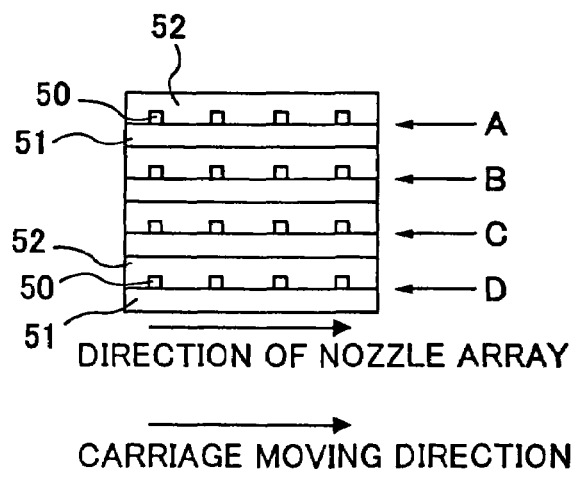
FIG. 30 illustrates still another example of the nozzle arrangement, in which the direction of multi-nozzle arrangement in the stacked jet head unit is parallel to the carriage moving direction.

FIG. 29 and FIG. 30 show comparison examples in which the direction of the nozzle array is parallel to the carriage moving direction, unlike the present invention. The arrangement shown in FIG. 29 is disadvantageous because the multi-nozzle jet head unit cannot be made compact. The arrangements shown in both FIG. 29 and FIG. 30 are disadvantageous because jet efficiency is poor. (In the case of FIG. 29 and FIG. 30, a single type of solution must be shot by four nozzles, and in addition, the carriage has to be driven for each group of nozzles.)

According to the present invention, as shown in FIG. 28, the direction of the multi-nozzle array of the jet head is inclined so as to be non-parallel to the carriage moving direction when the carriage scans, while allowing ejection of droplets from the multi-nozzle jet head unit. Accordingly, the problems in the structures shown in FIG. 29 and FIG. 30 can be resolved, realizing a compact jet head unit. For the continuous scanning motion of the carriage, a single jet head that ejects a single type of solution is appropriately driven as necessary, without requiring the above-described group control.

The configuration shown in FIG. 28B also has an advantage that the shot density becomes higher than the nozzle density of the array. This arrangement is especially advantageous if the jet head cannot have a high-density nozzle arrangement (for example, if a jet head utilizes piezoelectric elements as shown in FIG. 41 and FIG. 42, which will be described later).

Next, another feature of the present invention is described using FIG. 31. As previously described in conjunction with FIG. 2 and FIG. 3, the jet head ejects droplets onto a substrate so as to form a group of functional devices, while performing relative displacement with respect to the substrate (the functional device mounting board) 14. FIG. 31 illustrates the device electrodes 42 formed on the substrate (functional device mounting board) 14, a functional device group formed by applying four droplets in between those device electrodes 42 along the vertical direction. (slow-scanning direction) (see enlarged view of FIG. 31B), and a view of the jet head from the nozzle surface (see FIG. 31C). The lateral direction is defined here as the fast-scanning direction.

For simplification of description, described here is an example of a case where the relative displacement between the jet head and substrate (functional device mounting board) 14 is placed in front of the substrate (functional device mounting board) 14 as in the case of FIG. 2, and the jet head mounted on the carriage applies droplets while moving in the main-scanning direction and sub-scanning direction.

As described above, FIG. 31 shows a group of functional devices, each being formed by applying four droplets between device electrodes 42 along the longitudinal direction (slow-scanning direction). In the present invention, not only a group of an array of functional devices, but also another pattern is formed on the substrate 14 using the jet head during the fabrication of a functional device mounting board. In FIG. 31, the ranges X and Y extending in the fast scanning direction and the slow scanning direction, respectively, define a functional device forming area on the substrate 14. There are additional spaces outside of the functional device forming area, which are indicated by ranges Xa, Xb, Ya, and Yb. The fabrication apparatus is designed so as to allow the carriage to scan over the peripheral areas defined by Xa, Xb, Ya, and Yb. Accordingly, the jet head mounted on the carriage can apply droplets to these peripheral areas as the carriage moves in the fast scanning direction and the slow scanning direction. The substrate (functional device mounting board) 14 has a functional device forming area, and a peripheral area located around the functional device forming area.

By setting certain dimensions of peripheral area on the substrate 14, and by designing the fabrication apparatus so as to allow the carriage or the jet head to be movable in the peripheral area on the substrate, a pattern other than the functional device array can be formed on the substrate 14. In the example shown in FIG. 31, the substrate 14 has a pattern of figures "123", which cab be a product number. A manufacturing date or a serial number can also be formed on every substrate using the jet head. The pattern formed in the peripheral area is not limited to figures, but any symbols or characters can be formed to identify the substrate.

Generally, a serial number or other identification mark is affixed to or imprinted on a finished product. With the present invention, such a number or a mark can be formed directly on the substrate during the formation of the functional devices. This arrangement is advantageous when fabricating a product or a unit (such as a functional device mounting board) that requires high precision and a clean environment. Affixing a plate to the substrate or imprinting a mark in the substrate may cause contamination, which further causes the intrinsic functionality and performance to be degraded. With the present invention, the marks or patterns are formed on the substrate simultaneously with forming an array of functional devices in the clean environment (usually, in a clean room of approximately class 100 to 1000). Consequently, a precise functional device mounting board can be produced without causing a problem of contamination. Furthermore, since no additional apparatus for conducting the subsequent imprinting process is required, the production efficiency is improved, and the manufacture costs can be reduced.

FIG. 32 illustrates another example of the functional device mounting board, which has four extra functional devices formed in the peripheral area defined by the ranges Xa, Xb, Ya, and Yb, near the corners of the substrate 14. Similar to the example in FIG. 31, the array of functional devices is formed in the functional device forming area defined by the ranges X and Y. Each functional device is formed of four droplets of solution applied to the space between the device electrodes 42 in the vertical direction (slow scanning direction). Each of the four extra functional devices is also formed of four droplets during the inkjet process.

Each of the four extra functional devices has the same electrodes and the same thin film of functional pattern as those used in the actual functional device formed in the functional device forming area. These extra functional devices are provided for the purpose of conducting a performance test.

Because checking all the functional devices in the array takes time and increases the cost, test patterns are provided near the corners of the substrate, outside the functional device forming area. With this arrangement, the performance of the functional device array can be checked in a short time, without examining all the devices. As the checking method, if organic EL devices are examined, an ITO lead and an aluminum lead are extended out from the check pattern (or device). A voltage is applied between the ITO as the anode and the aluminum as the cathode to check whether or not light is emitted (to determine pass or fail).

Although, in the example, a test pattern that is the same as the actual functional device is used, a simplified check pattern may be used for the performance test. The number of test patterns is not limited to four. However, forming test patterns at the four corners is preferable rather than forming test patterns at one place when a large-sized substrate is used to fabricate a functional device mounting board. If the substrate is smaller than 200 mm×200 mm, test patterns could be formed at one place on the substrate. However, if the substrate used to fabricate a functional device mounting board has a size larger than the above-mentioned dimensions, it is preferable to arrange test patterns at several different locations on the substrate in order to guarantee a uniform quality of the device over the wide area of the substrate. This is because the purpose of providing test patterns is to check whether a number of functional devices arranged over a wide area of the substrate have been formed uniformly irrespective of the location.

As has been described, the functional device mounting board is manufactured by ejecting droplets of a solution containing a functional material onto a substrate so as to fill the space between each pair of device electrodes. The substrate is larger than the functional device forming area, and therefore, other patterns can be formed in the area outside the functional device forming area by ejecting droplets. To this end, the fabrication apparatus is configured so that the carriage or the jet head is movable to the area beyond the functional device forming area.

FIG. 33, illustrates yet another example of the functional device mounting board having a functional device forming area and a peripheral area outside the functional device forming area. In this example, a second group of functional devices is formed in the peripheral area defined by the range Ya. The second group of functional devices is formed by ejecting droplets of a solution containing a functional material onto the substrate in the same manner as the formation of the first group of functional devices.

For example, the first group of organic EL devices and the second group of organic EL devices are formed on the same substrate to fabricate a functional device mounting board. By placing a transparent cover plate made of glass or plastic so as to face the functional device mounting board. The transparent cover plate and the functional device mounting board can be packaged into a unit to produce an image display apparatus, such as spontaneous light-emission type organic EL display. In this case, signals are input to the second group of functional devices to drive each device, and images are displayed in the second array, in addition to the first array.

By changing the signal information supplied to the second group of organic EL devices for each product, the product serial number and other information can be displayed on the final product. By changing color information supplied to the second group of organic EL array for each lot, a certain set of image displays can be easily distinguished from other product sets, using the color information as the identifier of the lot. This arrangement can also eliminate the necessity of a stamping or imprinting process, which is conducted using a separate apparatus after the fabrication of the product.

In the description above, the second group of functional devices (organic EL devices) is provided separate from the first group of functional devices (organic EL devices). However, the extra information, such as color ID information or product numbers, can be displayed without forming a separate group of functional devices (organic EL devices) For example, by switching signals between the image information and the extra information when supplying them to the functional device array, a color ID or a product number can be displayed on the array of functional devices. Alternatively, the color ID or the product number may be displayed in a portion of the functional device array, together with the image information, without switching the signals.

Since the droplet ejection area of the fabrication apparatus is set larger than the functional device forming area of the substrate, a test pattern or an ID pattern can be formed on the substrate, in addition to the array of functional devices. The peripheral area outside the functional device forming area can also be used to conduct a test shot of the jet head prior to actually forming a functional device. This arrangement is advantageous to guarantee the stable performance of the fabrication apparatus, as well as the reliable characteristics of the functional device mounting board.

Figure 34:
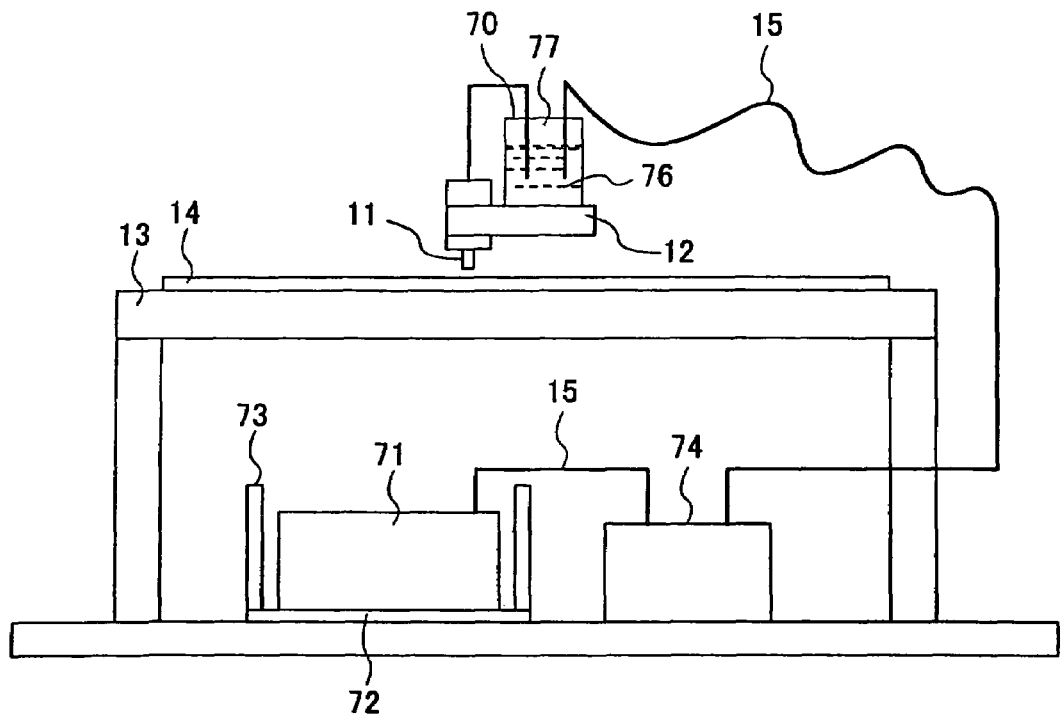
FIG. 34 is a side view of the fabrication apparatus for a functional device mounting board, having a reliable solution supply system according to an embodiment of the invention, showing the positional relation of the major units.

FIG. 34 illustrates another arrangement of the present invention, showing a schematic structure of the fabrication apparatus. This drawing is used to explain the apparatus shown in FIG. 2 in more detail. In FIG. 34, reference numeral 11 denotes a jet head unit (jet head), 12 denotes a carriage, 13 denotes a substrate support bench, 14 denotes a substrate forming a functional device, 15 denotes a supply tube for the solution that includes functional material, 70 denotes an auxiliary container, 71, denotes a fluid container, 72 denotes a container holding member, 73 denotes the rim of the container holding member, and 74 denotes a pump.

As clearly shown in FIG. 34, the fluid container 71 for the solution that includes functional material in the present invention is deployed lower than the substrate 14, which forms the functional device that is mounted onto the substrate support bench 13. In this manner, if by chance the solution overflows or leaks from the fluid container 71, accidents where the functional device group formation surface of the substrate 14 is contaminated by leaking solution are eliminated since the fluid container 71 is deployed lower than the substrate 14. Furthermore, that fluid container 71 is placed and held on top of the container holding member 72. Accordingly, likewise in this case, even if the solution leaks due to an unexpected accident, the leaked solution first remains upon the container holding member 72 without immediately flowing to the floor and contaminating the floor, or wetting nearby electrical systems, thus not inducing serious accidents.

However, in cases where a large amount of solution flow out, it may flow out from the container holding member when that container holding member is simply upon a flat plane. Taking such points into consideration, the present invention has the container holding member 72 having the rim 73 that surrounds the outside of the fluid container 71, and makes the height of that rim 73 to be higher than (greater than) the maximum level (fluid level 78) of the solution in the fluid container 71 (see FIG. 37). With this type of configuration, the solution will never exceed the rim 73 and flow out.

Furthermore, as another configuration, making the container holding member 72 have the rim that surrounds the outside of the fluid container 71, and making the height of the rim 73 be a height such that the capacity of the container holding member 72, which is determined by the height of that rim 73, is greater than the fluid volume of the fluid container 71. With this type of configuration, even if the solution in the fluid container 71 leaks due to an unexpected accident, the leaked solution can be retained and prevented from flowing elsewhere, thus preventing serious accidents. As two configuration examples have been described thus far, with this kind of configuration, even if by chance the entire solution within the fluid container 71 leaks due to an unexpected accident, the container holding member 72 is capable of preventing the solution from flowing elsewhere, thereby damage of the electrical system of the fabrication apparatus of the present invention may be eliminated.

Next, another feature of the present invention is described. With the present invention, as described above, the fluid container 71 for the solution that includes functional material is deployed lower than the substrate 14, which forms the functional devices that are placed on the substrate support bench 13. That solution must then be supplied up to the jet head 11 that is positioned higher than the substrate support bench 13 or the substrate 14, which forms the functional devices placed thereupon. In the case where the amount of solution used is little or the frequency of being jet as droplets is low (for example, several ten Hz to several hundred Hz per nozzle), supplying the solution naturally within the solution supply tube 15 based on principles of the capillary phenomenon is sufficient. However, in the case where the jet head 11 that includes multiple nozzles (several ten to several hundred) is used and the frequency of jetting the solution as droplets is high (for example, several kHz to several ten kHz per nozzle), the solution needs to be supplied by some kind of action rather than naturally. In particular, in case of the present invention, since the fluid container 71 is deployed lower than the substrate 14, which forms the functional devices that are placed upon the substrate support bench 13, and even for compensating for the head difference, supplying fluid by some kind of forcible action is necessary.

With the present invention, as shown in FIG. 34, the pump 74 is made to intervene the jet head 11 and the fluid container 71. Accordingly, even though the aforementioned head difference exists or a large amount of solution is utilized at a high frequency (even if the jet head 11 is operated at a high drive frequency), an empty jet of droplets due to deficient capability of supplying the solution occurs, thereby preventing failure in functional device formation.

It should be noted that with the present invention, this pump 74 is also deployed lower than the substrate 14, which forms the functional devices that are placed upon the substrate support bench 13. Accordingly, similar to the solution leakage of the above fluid container 71, assuming the case where a solution leakage has occurred in the pump 74 due to an unexpected accident, accidents where the functional device group formation surface of the substrate 14 is contaminated by leaked solution are eliminated.

Furthermore, though not shown in FIG. 34, the pump 74 of the present invention is also placed and held on top of a pump holding member (not shown in the drawing) such as the container holding member 72 that holds the fluid container 71, so as to prevent leaked solution to flow out elsewhere.

Next, with such type of pump 74, the solution that includes functional material is transported from the auxiliary container 70 to the jet head 11 via the solution supply tube 15. Here, the jet head 11 is mounted on the carriage 12 and carriage return movement is performed in a position opposing the substrate 14, which forms the functional devices. Thus, flexible material is selected for the solution supply tube 15. For example, a polyethylene tube, polypropylene tube, or Teflon (registered trademark) tube is preferably utilized. Furthermore, depending on the used solution that includes functional material, a tube that cuts off light may be required. For example, in the case of using photosensitive resin or photo-curing adhesive, a supply tube 15 that cuts off light of wavelengths at which that material is exposed should be used.

The solution that is to be supplied to the jet head first enters the auxiliary container 70 before being transported to the jet head 11. Though the auxiliary container 70 has a role of temporarily retaining a solution 76, the solution 76 is not retained to the full capacity of the auxiliary container 70 but is retained in a form such that a layer of air 77 exists as shown in FIG. 34. Namely, since the solution supplied via the pump 74 has the pulsation of the pump 74, it is first enters into the auxiliary container 70 where the pulsation is eliminated using the layer of air 77 as a buffering means, and is then supplied to the jet head 11 through a capillary phenomenon. Through execution of such solution supply, droplet jet performance of the jet head 11 stabilizes, allowing for formation of a favorable functional device group.

Figure 35:
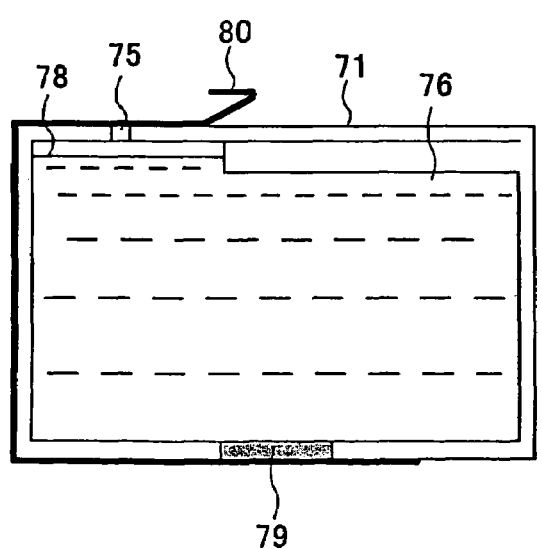
FIG. 35 illustrates an example of solution supply cartridge according to an embodiment of the invention.
Figure 37:
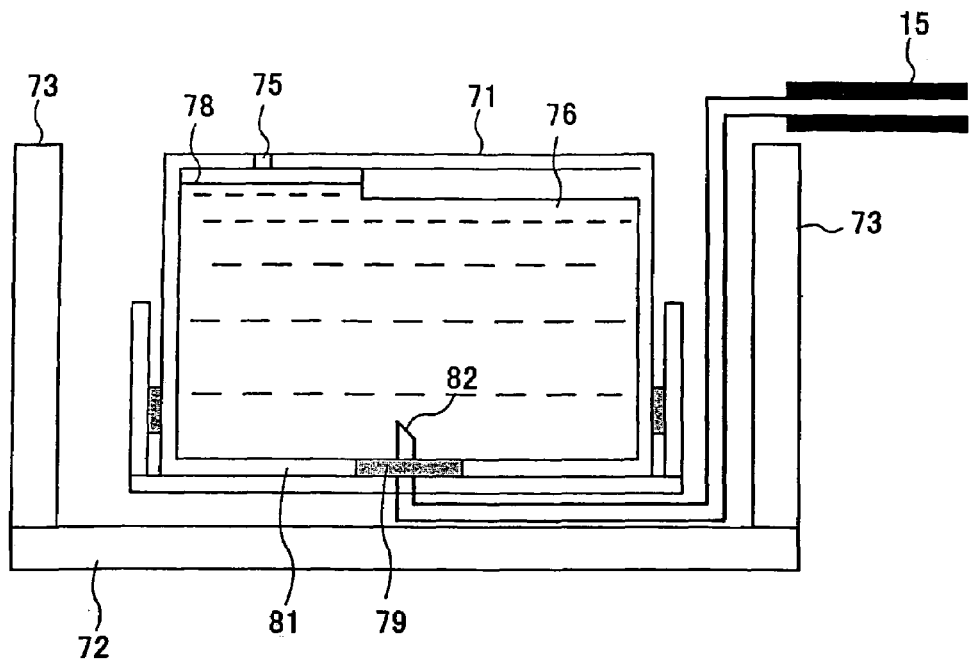
FIG. 37 illustrates the solution supply cartridge fit into the fabrication apparatus.

FIG. 35 through FIG. 37 are diagrams illustrating a further specific example of the fluid container 71 and container holding member 72., which are conceptually shown in FIG. 34. FIG. 35 illustrates the fluid container 7i implemented as a cartridge in a pre-utilized state. It should be noted that in FIG. 35, reference numeral 75 denotes an air communicating hole, 76 denotes the solution, 78 denotes the fluid level, 79 denotes a fluid-flow inlet and 80 denotes a closing object. Such fluid container 71 that is implemented as a cartridge is, for example, set before utilization in an air tight state by the tape-like closing object 80, which is capable of maintaining adherence and airtightness. Immediately before utilization, the tape-like closing object 80 is then removed so as to release the air tight state (FIG. 36), and is pushed down towards (direction indicated by the arrow Y in FIG. 36) the container holding member 72. A fluid-flow entry needle 82, which is capable of pouring fluid into syringe needle-like interior portions, is utilized by inserting into the fluid-flow inlet 79, which is formed with an elastic member of rubber or the like (FIG. 37).

A container holding material 81 of FIG. 36 is a member for holding the fluid container 71, which is implemented as a cartridge, and is made of an elastic member of rubber or the like. This then not only externally supports the fluid container 71 but also functions as a sealing element such as an O-ring, which is capable of sealing even in cases where the solution leaks from the fluid-flow inlet 79 due to unexpected accidents.

Though the aforementioned description is an example of the fluid container 71 with a cartridge structure, being implemented as a cartridge enables. to easily replenish the solution (solution replenishment through cartridge exchange) without soiling the user's hands. It should be noted that the fluid container 71 implemented as a cartridge of the present invention does not contain the solution 76 for the entire capacity of the container, as is shown by the fluid level 78 in FIG. 35 and FIG. 36. Furthermore, the height of the top of the region wherein the air passage hole 75 is formed is made to be higher than the other regions. These are means for preventing the users from dirtying their hands with the solution that overflows from the air passage hole 75 when preparing the container for use by peeling off the closing object 80 and inserting the fluid-flow entry needle 82 into the fluid-flow inlet 79, as shown in FIG. 36 and FIG. 37. The fluid level 78 in FIG. 37 is lower than the fluid level 78 in FIG. 35 or FIG. 36 because the solution moves to the side of the fluid-flow entry needle 82 and supply tube 15 linking therebetween when preparing the container for use by inserting the fluid-flow entry needle 82 into the fluid-flow inlet 79.

Furthermore, as described above, the fluid level 78 is set to be lower than the height of the rim 73, which is provided so as to surround the outside of the fluid container 71 on the container holding member 72, so as to prevent the solution 76 from leaking to the outside due to an unexpected accident, thus preventing accidents with electrical components in the device as well as contamination of the surroundings.

Figure 38:
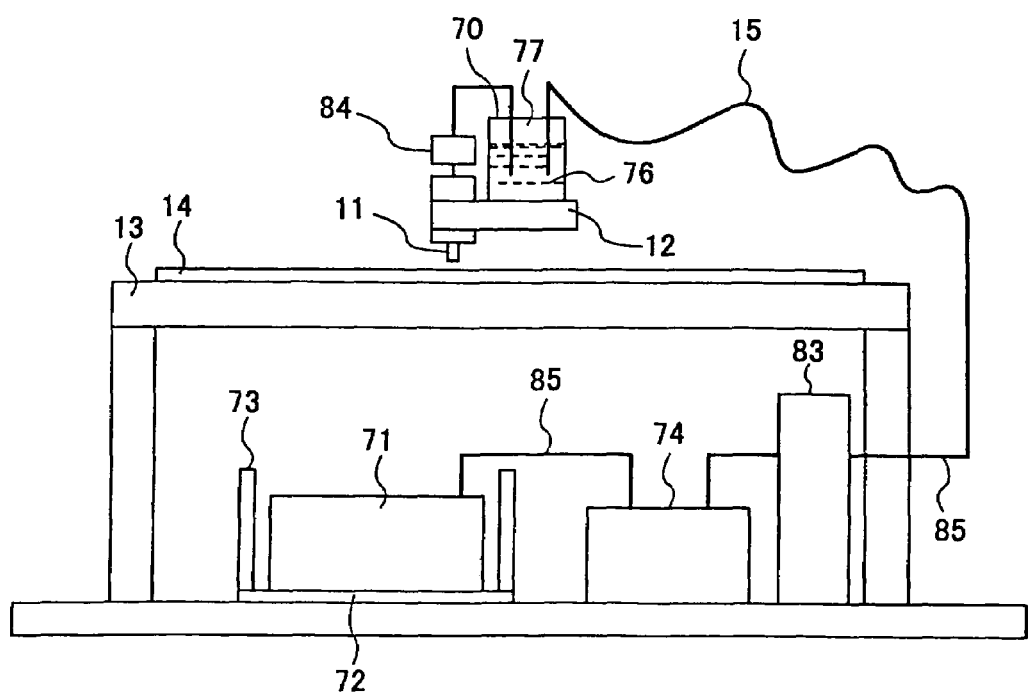
FIG. 38 is a side view of another type of fabrication apparatus having a solution supply system, showing another arrangement of the major units.

Next, another feature of the present invention is described. FIG. 38 illustrates a modified example of the fabrication apparatus of the present invention shown in FIG. 34, and in the drawing, reference numeral 77 denotes a layer of air, 76 denotes a solution, 83 denotes a filter a, and 84 denotes a filter b.

As described above, with the present invention, the pump 74 is made to intervene the jet head 11 and the fluid container 71. Furthermore, with such pump 74, the solution that includes functional material passes through a fluid supply route 85 and the solution supply tube 15, to be transported from the auxiliary container 70 to the jet head 11, however a filter 83 and a filter 84 are made to intervene therebetween. The jet head 11 is mounted upon the carriage 12, and carriage return movement is performed in a position opposing the substrate 14, which forms the functional devices. Thus, flexible material is selected for the solution supply tube 15. For example, a polyethylene tube, a polypropylene tube, or a Teflon (registered trademark) tube is preferably utilized.

Figure 39:
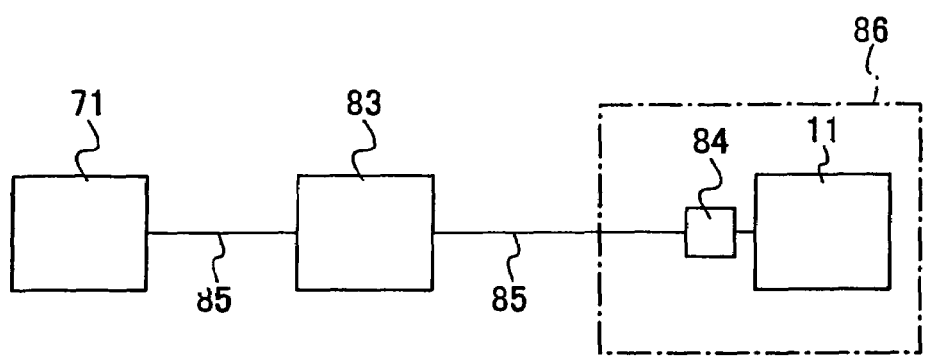
FIG. 39 illustrates an example of the ejection system according to an embodiment of the invention.

FIG. 39 is a system diagram (pump 74 and auxiliary container 70 are omitted) illustrating the solution flow of the present invention. With the present invention, at least two types of filters (filter 83 and filter 84) are provided further downstream than the fluid container 71. This is for preventing the solution from clogging in the nozzles since the solution is jet from a minute nozzle based upon inkjet principles with the present invention.

Here, the filter 83 is the main filter for the jet system of the present invention, and it is a membrane filter with a 0.45 μm pore size (or filter mesh size), which can remove or trap foreign particles of 0.45 μm or greater. The filter material is cellulose nitrate, cellulose acetate, polycarbonate, Teflon (registered trademark), or the like, and is accordingly selected in consideration of compatibility with the solution that includes functional material to be used. It should be noted that a membrane filter with an even smaller pore size (e.g., 0.2 μm) can be equally used; however, when pore size is too small, the filter is quickly clogged and solution flow worsens, whereby the filter must be frequently exchanged. Accordingly, the pore size should be determined in consideration of the exchange frequency. However, a filter of pore size 2 μm or greater is ineffective as a filter function in the jet system of the present invention, thus the pore size must not exceed thereof.

Though the present invention suitably uses a 0.45 μm membrane filter, in the jet system of the present invention, almost all foreign particles in the solution that flows from the fluid container 71 to the jet head 11 are trapped here. Accordingly, the filter trap capacity (trap capacity for foreign particles) of this filter 83 is made significantly greater than that of the filter 84 at bottom stream.

Figure 40:
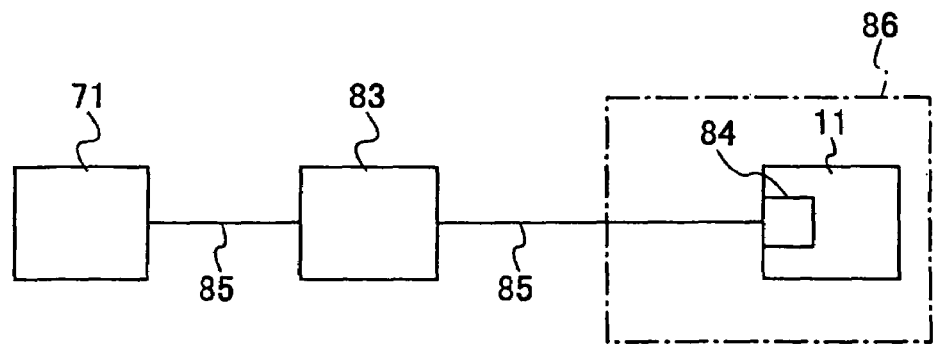
FIG. 40 illustrates another example of the ejection system.

FIG. 40 is another example of a system diagram illustrating the solution flow of the present invention. This example also has at least two types of filters (filter 83 and filter 84) provided further downstream than the fluid container 71, however, here an example is given where the filter 84 is embedded in the jet head 11.

Figure 41A:
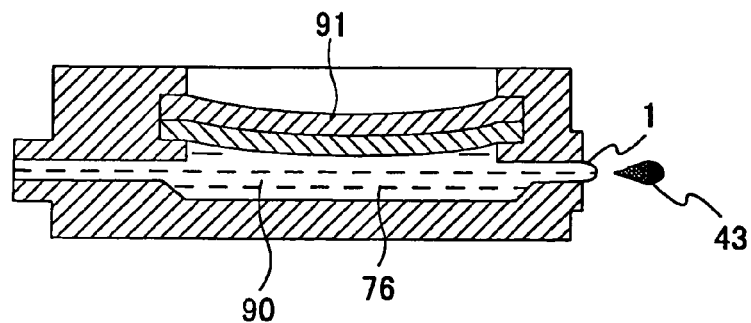
FIG. 41A and FIG. 41B illustrate how the droplet is ejected from the nozzle.
Figure 41B:
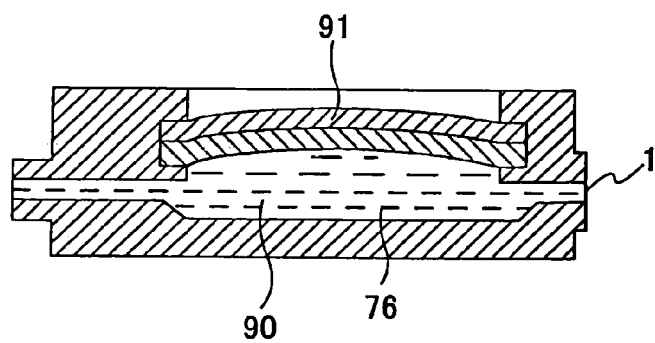
Figure 42:
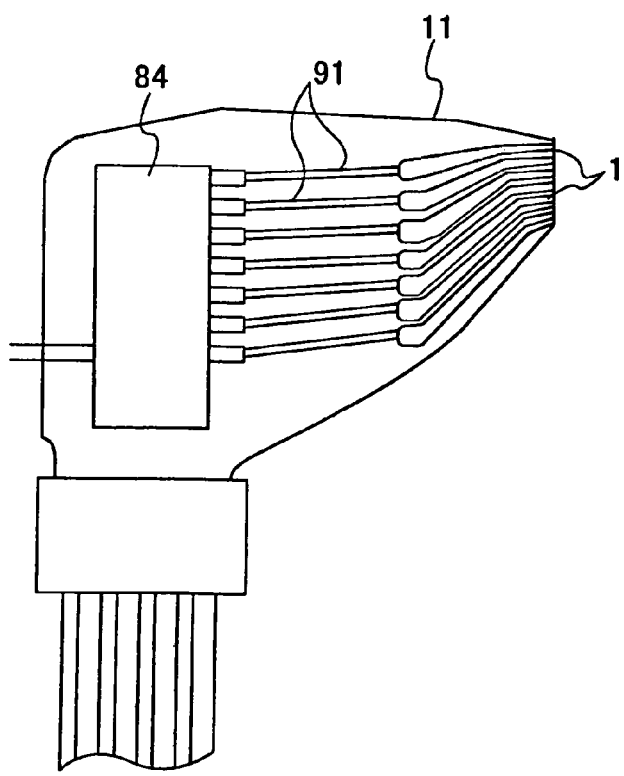
FIG. 42 is a cross-sectional view of the jet head having a filter according to an embodiment of the invention.

An example of a jet unit configured by the jet head 11 and filter 84 with the aforementioned structure is illustrated in FIG. 41 and FIG. 42 along with the principle for jetting solution droplets. This fluid jet head 11 is one provided with piezoelectric devices 91 as an energy action unit within a flow route 90 wherein the solution 76 is introduced. If a pulse signal voltage is applied to the piezoelectric devices 91 to warp the piezoelectric devices 91 as shown in FIG. 41(A), the capacity of the flow route 90 reduces as well as a pressure wave occurs, whereby that pressure wave causes a droplet 43 to be ejected out of the nozzle 1. FIG. 41(B) illustrates a state where the piezoelectric devices 91 are no longer warped and the capacity of the flow route 90 is increased.

Here, the solution 76 that is introduced into the flow route 90 adjacent to the nozzle 1 has passed through the filter 84. As described thus far, with the present invention, the filter 84 is provided within the jet head to realize a filter removing function at the nearest possible location to the nozzle 1. Foreign particles are removed by the aforementioned main filter (filter 83) with nearly 100% accuracy, however foreign particles that are mixed in during main filter (filter 83) exchange cannot be removed by the main filter (filter 83). Therefore the filter 84 is provided nearest to the nozzle 1 in this manner. Accordingly, this filter 84 is made un-detachable since it is provided nearest to the nozzle 1 (since foreign particles will repeatedly mix in during that operation if filter exchange is performed).

However, the main filter (filter 83) predominantly removes foreign particles in the jet system of the present invention, however this filter 84 is strictly a supplementary means. Accordingly, in order to ensure removal of foreign particles as described above, the filter trap capacity of the main filter (filter 83) must be significantly greater than that of the filter 84, and the pore size (filter mesh size) must be less than that of the filter 84. Namely, making the filter 84 be a compact and simple filter with a small filter trap capacity and a pore size (filter mesh size) greater than that of the filter 83 enables it to be embedded in the jet head 11 as shown in FIG. 42. The jet head 11 can then be made compact.

Furthermore, as shown in FIG. 39, even in the case where the filter 84 is provided external to the jet head 11, similar to the above description, using a compact and simple filter enables it to be mounted upon the carriage 12 shown in FIG. 38 and realize a compact carriage. A stainless-steel mesh filter is preferably used for such filter 84, and the pore size thereof (filter mesh size) should be 2 μm to 3 μm. Since this filter 84 is strictly a supplementary compact and simple filter, selecting a small filter mesh size as described above causes the filter to immediately be clogged (since the filter trap capacity is small since it is compact enough to be embedded in the jet head 11) and thus cannot be used. Therefore, the filter mesh size should be greater than that of the filter 83.

An important point of the present invention is for at least two types of filters to be provided downstream from the fluid container. Among these, the filter provided at bottom stream is fixed and un-detachable, and a plurality of filters may also be provided upstream.

Furthermore, another important point is that the filter provided at bottom stream is provided within the jet head, and has a filter mesh size greater than that of the filter provided further upstream. Moreover, the filter provided at bottom stream is provided within the jet head and has a filter trap capacity less than that of the filter provided further upstream. As long as these qualities (filter mesh size and filter trap capacity) are satisfied, a plurality of filters may be provided on the upstream side of the filter that is provided at bottom stream.

Figure 43:
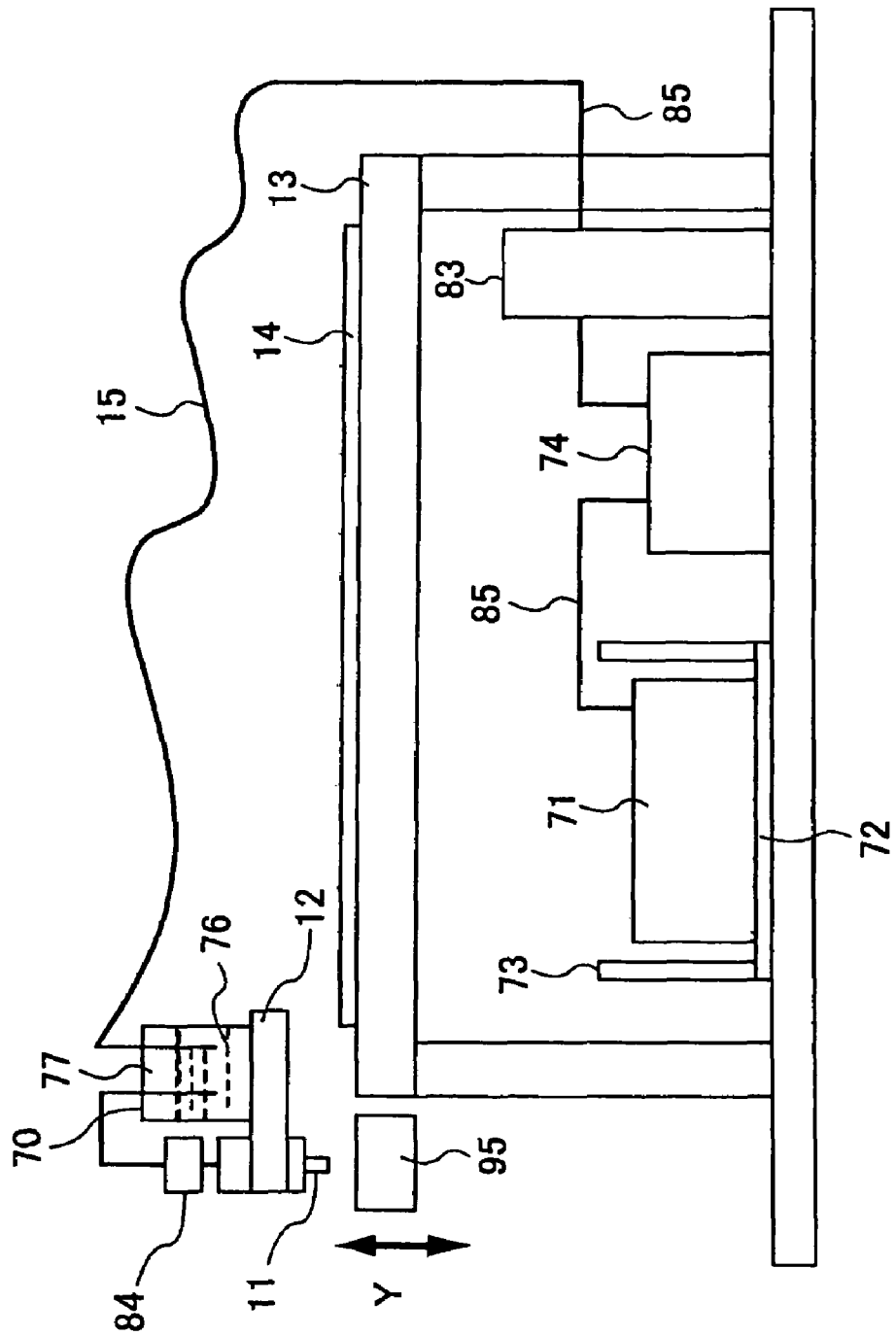
FIG. 43 illustrates a fabrication apparatus for a functional device mounting board, having ejector maintenance equipment according to an embodiment of the invention.

Next, another feature of the present invention is described. In FIG. 43, reference numeral 95 denotes maintenance equipment for maintaining reliable operation of the fabrication apparatus. Reference numeral 12 denotes a carriage, and numeral 11 denotes a jet head. The jet head 11 is placed and held on top of the carriage 12, and ejects droplets onto the substrate to form a desired pattern. Furthermore, the maintenance equipment 95 is installed in a region other than the region wherein the functional device mounting board is set, and is vertically moved along the direction indicated by the arrow Y in the drawing for capping and suctioning the solution ejecting surface of the jet head 11 (non-capped state is shown in the drawing).

Figure 44A:
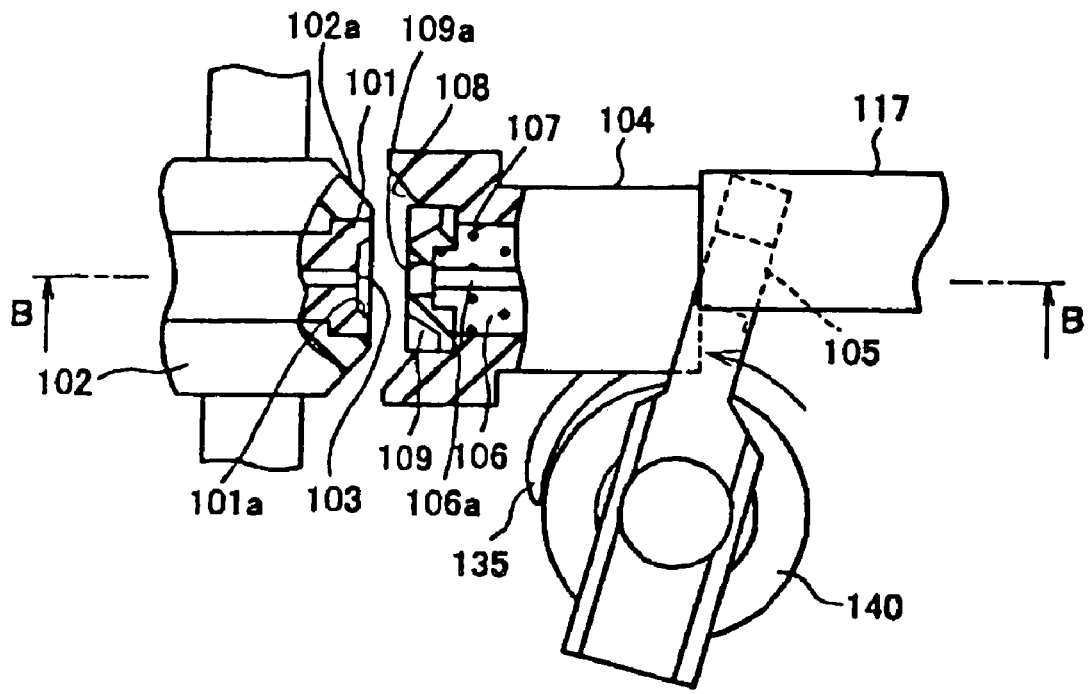
FIG. 44A and FIG. 44B illustrate an example of the ejector maintenance equipment.
Figure 44B:
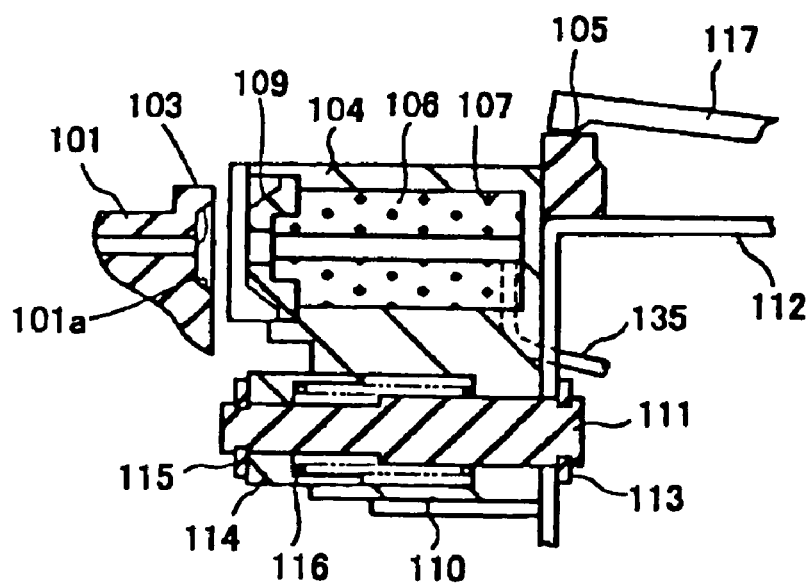

FIG. 43 is a typical diagram illustrating the positional relation of the maintenance equipment 95 of the present invention, and FIG. 44(A) and 44(B) are used for describing the functions and structure of such maintenance equipment 95 for suctioning and discharging the solution and capping the solution ejecting surface.

Figure 45:
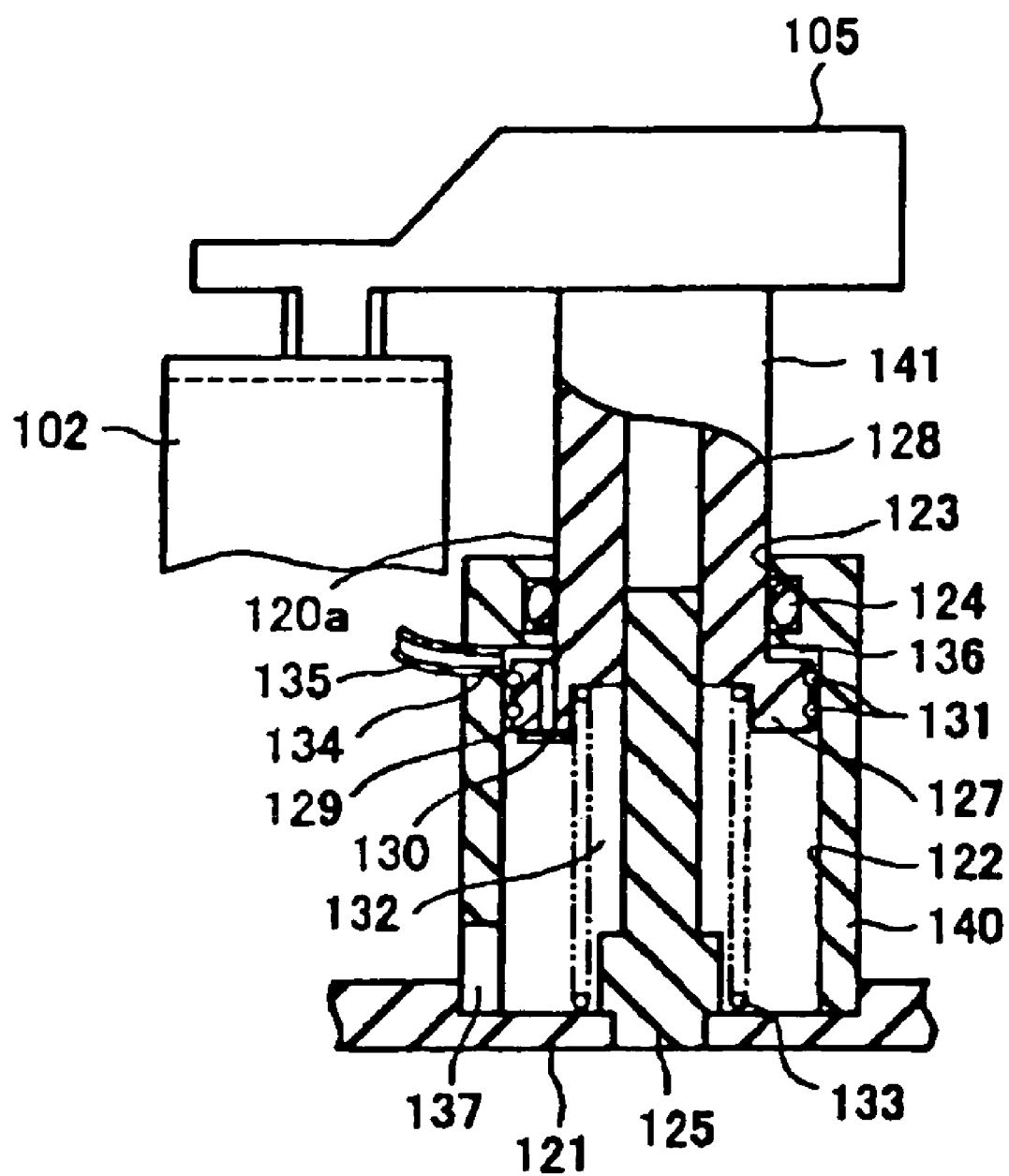
FIG. 45 illustrates an example of the nozzle suction unit provided to the ejector maintenance equipment.

In FIG. 44 and FIG. 45, reference numeral 101 denotes a jet head mounted upon a carriage 102, and reference numeral 103 denotes a nozzle attached to the tip of the jet head 101. A chamfered portion 102a is provided on the left-and-right external walls (upper and lower external walls in FIG. 44(A)) of the carriage 102 near the jet head 101. A recess. 101a is made by notching the tip of the jet head 101. Reference numeral 104 denotes a cap slide and 105 denotes a power lever that presses the slide 104 towards the carriage 102. In the cap slide 104, a deep hole 107 filled with a solution absorbing body 106 is opened at a cap portion that is opposite to the jet head 101. A path 106a is provided at the center of the solution absorbing body 106.

At the tip of the cap portion, a recess 108 to which the chamfered portion 102a can fit therewith is formed opposite the carriage 102. At the center of th4 recess 108 is implanted an elastic cap 109 formed to cover the solution absorbing body 106 and fit together with the recess 101a on the jet head 101 through pressure welding. A hole 109a linking to the path 106a is opened at the center of this elastic cap 109.

On the other hand, in the cap slide 104, a shaft hole 110 is opened parallel to the deep hole 107, and a shaft 111 is inserted into this shaft hole 110 as shown in FIG. 44B. The shaft 111 is fixed with a snap ring 113 or the like to a cap fastening plate 112, which is attached to the main unit of the device. At the other end of the shaft 111, a boss 114 is joined and fitted inside the shaft hole 110 by insertion, and at the other end portion of the shaft 111 is fixed to the tip portion of the boss 114 by a snap ring 115.

Accordingly, when the cap slide 104 is moved towards the het head 101, the shaft hole 110 is capable of sliding along the boss 114 in the direction of the shaft line. A compressed trigger 116 is then mounted between the shaft hole 110 and boss 114 so that the cap slide 104 is slanted towards the fastening plate 112 during such sliding motions. Reference numeral 117 denotes a springy locking member for locking the power lever 105 when it turns counterclockwise. Reference numeral 140 denotes a suction pump main unit of a nozzle suction device, and 135 denotes a suction tube that links the path 106a to the suction pump main unit 140. Still referencing to FIG. 45, details of the suction pump main unit 140 and suction tube 135 are described.

FIG. 45 illustrates an example of a nozzle suction device provided to the maintenance equipment 95 of the present invention, where 140 denotes the cylindrical-shaped main unit of the suction pump fixed to a base 121. The suction pump main unit 140 includes a suction chamber 122 of a large diameter, and a ring-shaped sealing groove 123 that is formed at the top end portion on the other side of the suction chamber 122. In the suction pump main unit 140, an aperture 120a is opened above this sealing groove 123. An O-ring 124 is fit into this sealing groove 123. In the suction pump main unit 140, a shaft 125 that is fixed to the base 121 is extended upwards to reach the vicinity of the tip of the sealing groove 123. Reference numeral 141 denotes a piston of the suction pump, and this piston 141 includes a small-diameter portion 128 of a shape that allows for inserting into the aperture 120a and the sealing groove 123 and then sliding, and its top end portion is fixed to the aforementioned lever 105.

The lower end portion of the piston 141 includes a large-diameter portion 127 to fit together with the suction chamber 122, and a path 129 that runs through the large-diameter portion 127 in the axis direction is opened at a rim portion of this large-diameter portion 127 protruding from the small-diameter portion 128. At the lower end side of this path 129 on the side of the suction chamber 122 is mounted a valve 130 that opens and shuts in accordance with variances in differential pressure at both end aperture portions of the path 129. Furthermore, an O-ring 131 is mounted on the external walls of the large-diameter portion 127 so as to perform sealing between such external walls and the suction chamber 122. Furthermore, a recess 132 is notched at the suction chamber side bottom surface of the large-diameter portion 127 of the piston 141, and a compressed trigger 133 is attached between this recess 132 and the base 121. This compressed trigger 133 is used for the piston 141 to automatically return upwards after the piston 141 is manually pushed downward as needed.

A communicating hole 134 is opened at the upper sidewall of the suction chamber 122, and a suction tube 135 is connected to this communicating hole 134. The other end of the suction tube 135 is linked to the path 106a of the solution absorbing body 106 as shown in FIG. 44(B). Accordingly, relative to a dead air space 136 in a negative-pressure state that is formed between the large-diameter portion 127 of the piston 141 and the upper end portion of the suction pump main unit 140 when the piston 141 is pushed downwards, the path 106a is suctioned into a negative pressure state from the communicating hole 134 via the suction tube 135. Furthermore, opened on a sidewall (on the left sidewall in FIG. 45) at the lower portion of the suction pump main unit 140 is a hole 137 to let out the negative pressure in the dead air space 136 when that dead air space 136 is extended downwards and furthermore, is able to discharge solution.

Figure 46A:
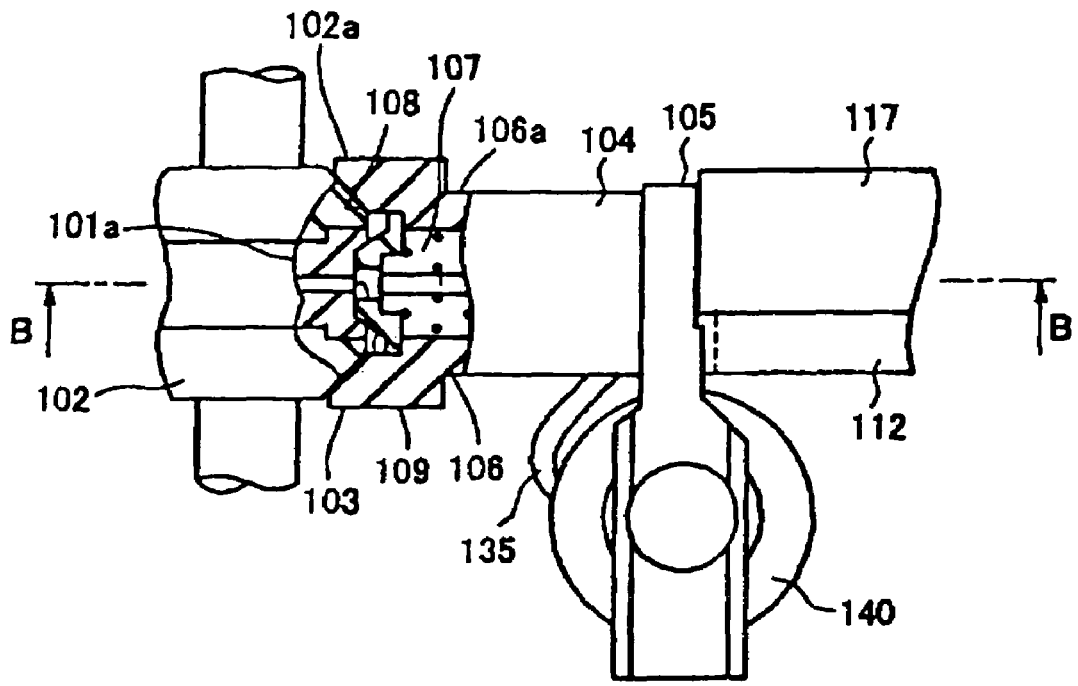
FIG. 46A and FIG. 46B illustrate the nozzle of the jet head, which is fit into the suction hole of the ejector maintenance equipment.
Figure 46B:
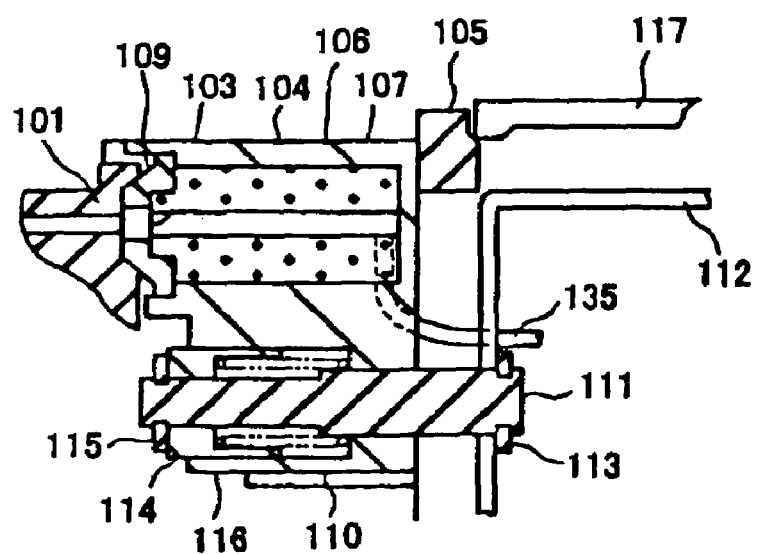

Next, operation of the head maintenance equipment 95 configured as described thus far is described with reference to FIG. 46(A) and (B) and FIG. 47. FIG. 46(A) and (B) illustrate a state where the lever 105 is locked with the locking member 117 by electrically turning the lever 105 counterclockwise (direction indicated by the arrow in FIG. 44 (A)), and the elastic cap 109 at the tip of the cap slide 104 is welded with pressure to the jet head 101, and its nozzle 103 is tightly sealed. Together with that, the nozzle 103 is inserted in the hole 109a so that it faces the solution absorbing body 106 behind the cap 109.

Figure 47:
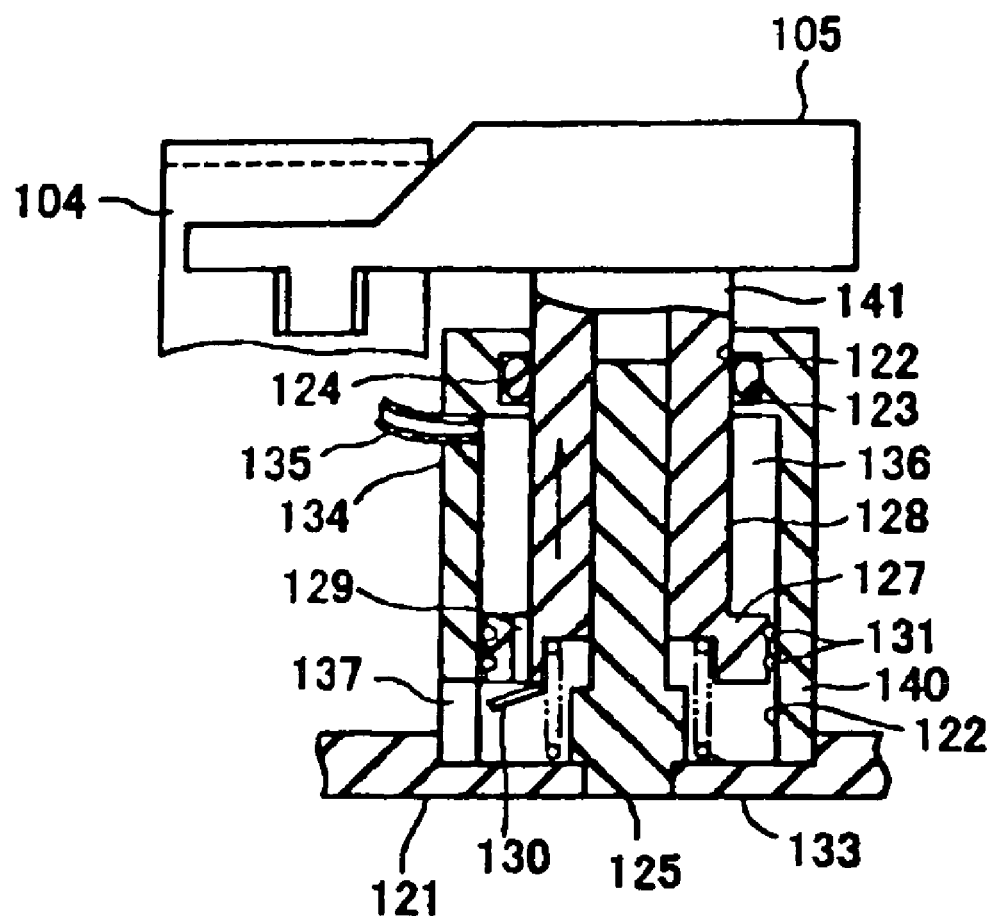
FIG. 47 illustrates how the solution is evacuated from the nozzle by the nozzle suction unit shown in FIG. 45.

In a case where sucking in and discharging the solution, as shown in FIG. 47, negative pressure is generated in the dead air space 136 by pushing the piston 141 downwards, and that negative pressure is used for drawing the tip of the nozzle 103 and ejecting the solution outwards from the nozzle 103. To realize this, first as shown in FIGS. 46(A) and (B) the elastic cap 109 at the tip of the cap slide 104 is welded with pressure to the jet head 103, and in that state the lever 105 is pushed downwards as if being slid between a cap fastening plate 112 and cap slide 104 so as to push down the piston 141. At this time, since the dead air space 136 formed between the large-diameter portion 127 of the piston 141 and the upper end portion of the suction pump main unit 140 becomes negative pressure due to cubical expansion caused by the piston 141 being pushed downwards, the interior of the path 106a also becomes negative pressure. Furthermore, because the tank (not shown in the drawing) that supplies solution to the jet head 101 is a constant air-releasing type, the solution in the nozzle 103 is ejected outwards from the nozzle 103 by the differential pressure at the front and back of the nozzle 103.

Next, if the piston 141 is released, the compressed trigger 133 makes the piston 141 return upwards as shown by the arrow in FIG. 47. At this time, since the valve 130 is configured of a film with a thickness of several 10 μm, it acts sensitively in accordance with variances in the differential pressure at the top and bottom, and the valve 130 is opened so that the solution, which is sucked into the dead air space 136, is discharged to the outside from the hole 137 that is provided below the suction pump main unit 140. It should be noted that making the line resistance of the path 129 smaller than the line resistance of the suction tube 135 enables the solution collected in the dead air space 136 to be easily discharged from the path 129.

The side wall 102a of the tip of the carriage 102 is chamfered, a recess 108 is formed at the cap slide 104 that comes in contact herewith, and a projection is formed at the elastic cap 109, as has been described above. Accordingly, even if some displacement occurs between the carriage 102 and the cap slide 104, such displacement in the positional relation between them is absorbed and corrected by the recess and the projection. Consequently, the jet head 101 is tightly sealed by the cap slide 104 in a reliable manner.

As described thus far, with the present invention, the maintenance equipment 95 is installed outside of the region where the functional device mounting board is set. This is because providing the maintenance equipment 95 between the jet head 11 and functional device mounting board 14 with the present invention is extremely difficult since a functional device group is formed by the jet head unit (jet head) 11 jetting solution while performing carriage displacement in the X direction (or Y direction or both X and Y directions) in parallel to the functional device mounting board 14 while maintaining a fixed distance (for example, 0.1 mm to 10 mm) in relation to the functional device mounting board 14.

It is not impossible to insert a thin-plate cap in the narrow range of 0.1 mm to 10 mm, which is the distance between the jet nozzle surface and the functional device mounting board 14, if only to allow the maintenance equipment 95 to simply function as a cap for the jet nozzle surface of the jet head. However, even in this case, high-precision techniques for inserting a thin-plate cap are required, where a single misstep would hurt the jet nozzle surface and damage it, thus impairing the function of the fabrication apparatus for manufacturing functional device mounting boards.

Though it is possible to assume that the maintenance equipment 95 is beneath the functional device mounting board 14, in other words, that it is configured to be embedded in the substrate support bench 13, the functional device mounting board 14 must be removed or moved whenever capping or suction is performed, and is extremely inefficient. Furthermore, there is a risk of damaging the functional device mounting board 14.

The reason for installing the maintenance equipment 95 in a region other than the setting region for the functional device mounting board is derived from consideration of this point. By installing the maintenance equipment 95 in a region other than the region where the functional device mounting board is set, the jet head is well maintained without clogging and guarantees stable operation without degrading the functions of the fabrication apparatus, or without reducing the manufacturing efficiency.

Figure 48A:
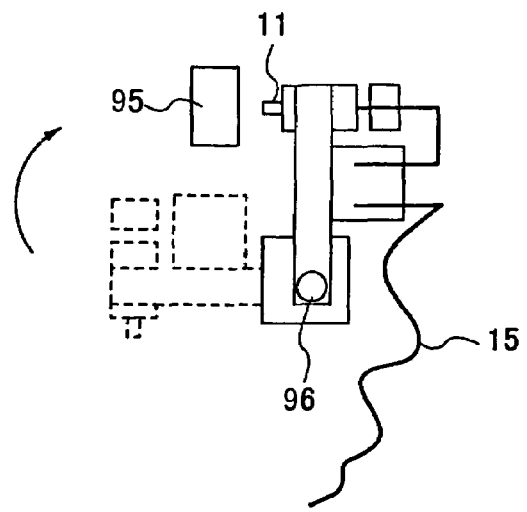
FIG. 48A and FIG. 48B illustrate another example of the fabrication apparatus having ejector maintenance equipment that functions inside the droplet ejection area.
Figure 48B:
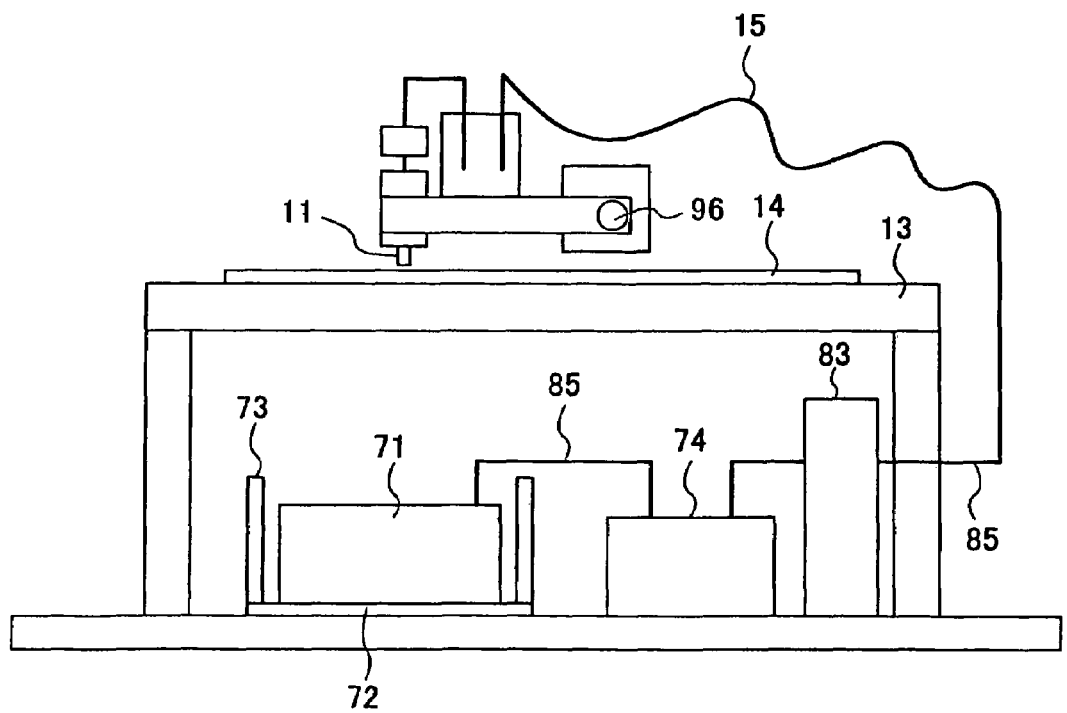

Next, another example of the present invention is described using FIG. 48. In this example, the maintenance equipment 95 operates in the region where the functional device mounting board is placed, in other words, in the region where droplets are ejected for forming functional devices. The carriage is designed so that the jet head 11 is pivotable about the rotational shaft 96. When the maintenance equipment 95 is attached to the jet head, the jet head 11 is turned away (rotated 90 degrees to the right in the drawing) from the droplet ejecting direction, as illustrated in FIG. 48A.

With this type of structure, the device can be configured without even installing the maintenance equipment 95 in a region other than the region where the functional device mounting board is set, thus allowing for reduction in projected floor space of the fabrication apparatus of the present invention and size.

Incidentally, as for the amount of solution sucked by the maintenance equipment 95 in the fabrication apparatus of the present invention, with the present invention, the amount of solution suctioned is equivalent to at least the internal volume of the jet head and channels in the regions further downstream than the filter 84 shown in FIG. 40 and FIG. 41, namely the filter provided at bottom stream. In FIG. 42, the solution of at least the internal volume from downstream from the filter 84 to the nozzle 1 is to be suctioned. This is because, with the present invention, the filter 84 is deployed at bottom stream to trap foreign particles thereat such as described. Therefore, as long as the solution in the head fluid chamber therebeyond is suctioned by the maintenance equipment 95, clogging may be avoided.

As described thus far, with the present invention, since the minimum required amount of the solution to be suctioned for maintaining reliability has been clarified, low-cost and speedy stable operation without jet head clogging is possible without unnecessarily sucking or discarding large amounts of solution.

It should be noted that though the above description was for an example that includes two filters, filter 83 and filter 84, the present invention is not one to be necessarily limited to two filters. In addition to these two filters a third and fourth filter may be provided.

Next, another feature of the present invention is described. According to the present invention, as described thus far, for forming a functional device group, droplets of a solution are jet to jet through the air so as to adhere to a substrate. At that time, the problem is the yield for manufacturing such type of functional device or that functional device mounting board. As described above, the functional device mounting board of the present invention is formed based on the inkjet principle, thus is preferably applied to the manufacture of relatively large (200 mm×200 mm to 4000 mm×4000 mm) functional device mounting boards. At that time, the problem is a defective device (namely, the reduction in yield for device manufacture) generated by foreign particles that are floating in the air, such as dust, adhering to the portion where a functional device is formed. Such problem with dust also applies to the LSI manufacturing field, where countermeasures of its own kind are taken. However, in the present invention, the substrate size is larger compared to the Si wafer (6 to 8 inches) used in the LSI manufacturing field, thus exponentially increasing the probability of dust to be adhered from, whereby the rate of a defective device occurring is enormously high.

Furthermore, with the present invention, since the jet head mounted upon the carriage constantly plies utilizing the inkjet principle, an adverse environment where floating dust constantly flutter is self-created. This point is also a problem of technique unique to the present invention, and is one of the large reasons for reduced yield.

FIG. 49 is a diagram for describing an embodiment of the present invention. In one aspect of the present invention, a system for fabricating a functional device mounting board is provided. Such a system comprises a fabrication apparatus 157 for fabricating a functional device mounting boar by ejecting and applying droplets of a solution that contains a functional material onto the substrate, and a clean air supply unit for supplying clean air to the fabrication apparatus. The fabrication apparatus 157 may be placed in a room, a building, a booth, or any other housing. In FIG. 49, reference numeral 151 denotes a ceiling, 152 denotes an outside wall, 153 denotes an internal ceiling, 154 denotes an inside wall, 155 denotes a floor, and 156 denotes a column of the floor 155. FIG. 49 does not show the detailed configuration of the building, but shows only showing the major parts of it.

In FIG. 49, a HEPA filter 158 (High Efficiency Particulate Air Filter) is installed on the ceiling, and substantially cleaned air that has passed through the HEPA filter flows downward from the ceiling into the room. In addition to air passing down through a hole opened in the floor 155, even if foreign particles such as dust generate or exist in the room for some reason, they are then discharged beneath the floor together with the cleaned air, thereby inside the room is continually maintained a cleaned environment. With the present invention, a system is configured by arranging in such kind of room a fabrication apparatus 157 for the functional device mounting board (shown as a rectangular drawing in FIG. 49 to simplify the description) as illustrated in FIG. 2.

Concerning the surrounding environment wherein such fabrication apparatus for the functional device mounting board is arranged, a rough standard for cleanliness, for example, is class 100 (100 pieces or less of dust with diameter 0.3 µm or greater per cubic foot) with the present invention. This is a million times cleaner than the environment of a normal room that is not regarded as such cleaned environment.

With the present invention, by intentionally creating such environment and cleaning the entire surrounding environment, the region wherein droplets are applied is made into a cleaned state and then application of solution droplets is performed. Accordingly, with the present invention, as described above, though the device itself is creating a less than favorable environment where dust is constantly floating in the air due to the repetitive carriage return movement, cleaning the environment to a greater degree allows for device manufacturing without dust coming near the region wherein droplets are applied. This allows defect ratio due to dust for the functional device manufactured in the environment of the present invention to approach a negligible incidence.

It should be noted that an example where a fabrication apparatus for the functional device mounting board as shown in FIG. 2 is arranged in a room where an air cleaning system is operating has been explained thus far. However, as another example, the air cleaning system may be made to simply operate in such manner in only a certain area of the room without cleaning its entirety. For example, in a case where only a certain area in a normal room is covered with an anti-dust curtain and HEPA filter is installed on the ceiling of that area, if a fabrication apparatus for the functional device mounting board as shown in FIG. 2 is arranged within that area, a similar cleanliness can be secured though the frequency of exchanging filters increases. In this case, such environment can be configured at a far lower cost than cleaning the entire room.

Furthermore, in the case where the size of the functional device mounting board to be manufactured is small (200 mm×200 mm to 400 mm×400 mm) and the fabrication apparatus such as that shown in FIG. 2 is also compact, a similar cleanliness can be secured even though this fabrication apparatus is arranged within a large clean work station. In this case, such environment can also be configured at a far lower cost than cleaning the entire room.

Figure 50:
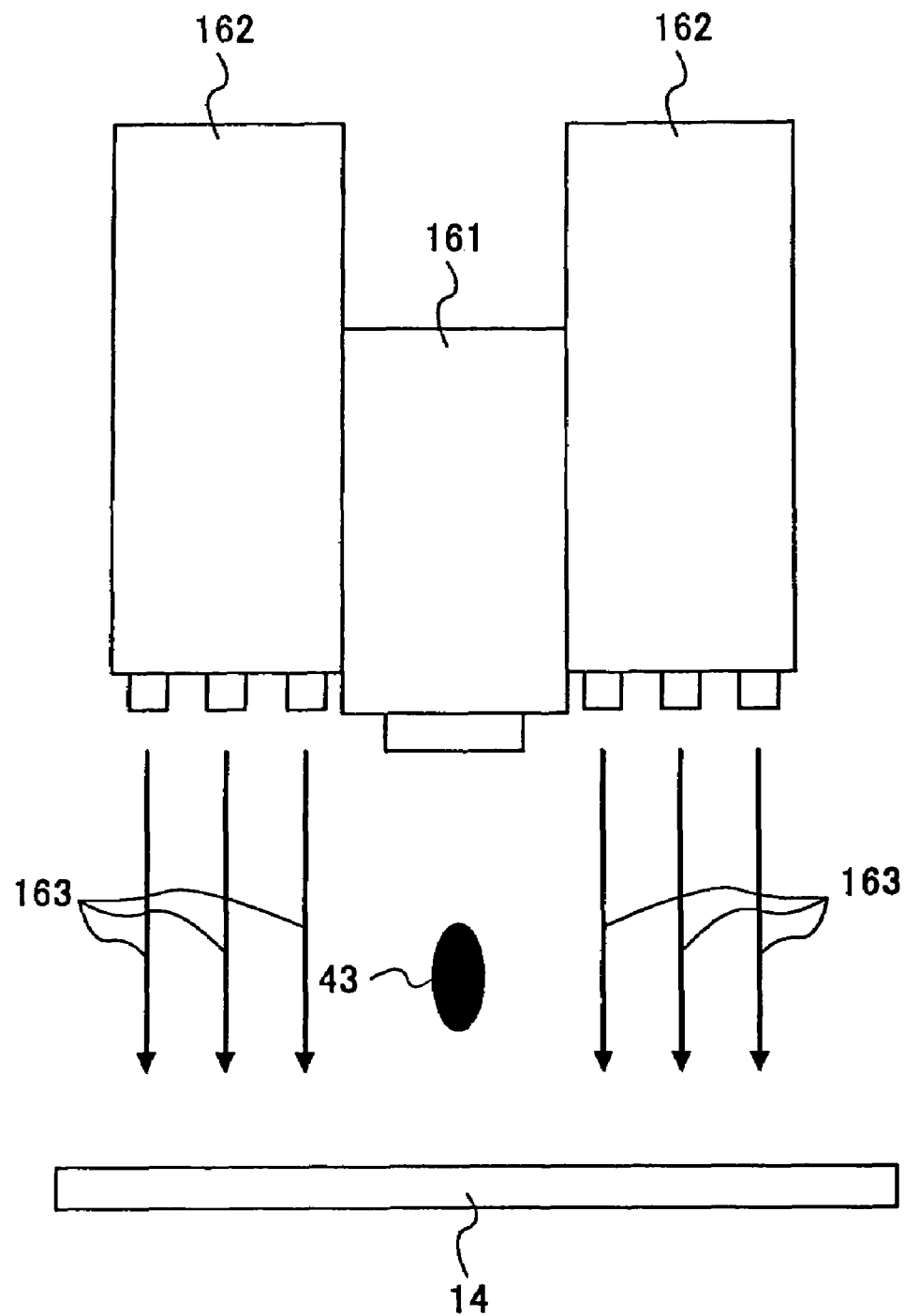
FIG. 50 illustrates an example of the jet head having a clean air supply unit

Next, yet another example of the present invention is described. FIG. 50 is a diagram showing a jet head that is suitably used in the present invention, and a cleaned air applying head 162 is placed around the jet head 161. It should be noted that for both the jet head 161 and cleaned air applying head 162, a fluid supply tube or gas supply tube or the like that is to be connected thereto is omitted in the drawing. This cleaned air applying head 162 is integrated with the jet head 161 and mounted on the carriage, and the repetitive return movement is carried out in the same manner as the jet head 161. In short, the region wherein droplets are applied by the jet head 161 is continuously cleaned by the cleaned air applying head 162. As the gas 163 to be used here, in addition to air cleaned by a filter, for example, nitrogen gas cleaned by a filter may also be suitably used.

Incidentally, substantially cleaned air that flows via the aforementioned HEPA filter or gas that flows out from such cleaned air applying head 162 is for cleaning the surface of the substrate 14 to form a favorable functional device, and is definitely not for blocking a droplet 43 from being adhered to the location for droplet application on the substrate. To be specific, the stability of jettison for the droplet 43 must not be adversely affected by the flow of this gas 163, lest the impact precision of the droplet 43 to the location where a droplet is applied be impaired.

For explaining this with the example of FIG. 50, upon contact with the substrate 14, the cleaned air 163 (indicated by downward arrows, and has a downward velocity vector component) is reflected, and flows upstream or forms a vortex (has a velocity vector component other than downwards). This must not disturb jettison (has a downward velocity vector component) of the droplet 43.

With the present invention, in consideration of this point, such apparatus as shown in FIG. 49 is used to perform functional device formation by varying velocity of flow for the cleaned air 163 and velocities for jetting the droplet 43 so as to examine the conditions under which the droplet favorably adheres to the functional device mounting board to form a favorable functional device.

The substrate used is configured with the barrier wall 3 made of polyimide formed through photolithography on the glass substrate with ITO transparent electrodes. On this substrate, using a fabrication apparatus utilizing the inkjet principle as shown in FIG. 2, a 0.1 wt. % solution polyhexyloxy phenylene vinylene of into a mixed solution of o-dichlorobenzene/dodecyl benzene is applied based on the inkjet principle with the jet velocity changed. The distance between the jet head nozzle and substrate is assumed to be 3 mm.

The used inkjet head is a drop-on-demand inkjet head utilizing piezo elements, in which the nozzle diameter is 23 µm, the voltage input to the piezo elements is changed from 16 V to 28 V for changing the jet velocity, and the drive frequency is 9.6 kHz. It should be noted that in such kind of drop-on-demand inkjet head utilizing piezo elements, the jet velocity can be changed by changing the voltage input to the piezo elements. However, since the mass of droplets to be jet is simultaneously changed at this time, the mass of droplets to be jet is made to be approximately constant (set at 5 pl) all the time through control of the drive waveforms (rising waveform and falling waveform including hit), thus only changing the jet velocity.

Furthermore, drop shape when a droplet is jetting is observed through a separate jettison under the same conditions as device formation, and the drive waveform is controlled such that that shape is nearly a round drop immediately before adhering to the substrate surface (3 mm in the present invention examples). It should be noted that even if a perfectly round spherical shape is not achieved, but is columnar extended in the jetting direction, the drive waveform is controlled to keep it under three times the length of that diameter. Furthermore, at that time, drive conditions (drive wave form) that do not involve a plurality of minute droplets trailing behind the flying droplet is chosen.

Device formation is subsequently performed through deposition of aluminum hereupon. The results given below are obtained when a 10V voltage is applied between the ITO anode and aluminum cathode, which are prepared by extending lead wires out from ITO and aluminum, respectively.

In this table, a circle marked for the status of device formation upon the substrate denotes that droplet impact has occurred in the intended region (within the barrier walls 3 enclosed with a polyimide), a triangle denotes that impact is partially outside of the intended region, and an "x" denotes that impact is completely outside of the intended region. A circle marked for device performance denotes that a predetermined shape of orange-colored light is emitted, and an "x" denotes that the orange-colored light is not emitted or only partially emitted (showing that device usage is not possible).

TABLE 8

| Test No. | Jet velocity $V_j$ (m/s) | Velocity of cleaned air stream $V_c$ (m/s) | Flow velocity difference $V_j - V_c$ (m/s) | Device formation status upon substrate | Device performance |
|---|---|---|---|---|---|
| 1 | 2 | 0.5 | 1.5 | Δ | x |
| 2 | 2 | 1 | 1 | Δ | x |
| 3 | 2 | 2 | 0 | x | x |
| 4 | 2 | 3 | −1 | x | x |
| 5 | 2 | 4 | −2 | x | x |
| 6 | 5 | 1 | 4 | ○ | ○ |
| 7 | 5 | 3 | 2 | ○ | ○ |
| 8 | 5 | 5 | 0 | x | x |
| 9 | 5 | 7 | −2 | x | x |
| 10 | 7 | 2 | 5 | ○ | ○ |
| 11 | 7 | 5 | 2 | ○ | ○ |
| 12 | 7 | 7 | 0 | x | x |
| 13 | 7 | 9 | −2 | x | x |
| 14 | 10 | 4 | 6 | ○ | ○ |
| 15 | 10 | 6 | 4 | ○ | ○ |
| 16 | 10 | 8 | 2 | ○ | ○ |
| 17 | 10 | 10 | 0 | x | x |
| 18 | 10 | 12 | −2 | x | x |

Accordingly, to the aforementioned results, a favorable device cannot be formed on the substrate with a slow jet velocity such as 2 m/s, and furthermore, favorable device performance can also not be obtained (usage of light-emitting qualities are also not possible). On the other hand, it can be known that in a case where the jet velocity is as fast as 5 m/s or more, though a favorable device can be formed on the substrate, a fast velocity of flow for the cleaned airflow may inhibit device formation. From the above results, it can be known that making the jet velocity of droplets to be at least 2 m/s greater than the velocity of flow of the cleaned air flow enables favorable devices to be formed, and furthermore a favorable device performance to be obtained.

Next, another feature of the present invention is described.

As described above, the present invention is for manufacturing various functional device mounting boards through formation of a functional device group by jetting and applying droplets of a solution that includes functional material onto a flexible substrate, such as a plastic substrate or a polymer film, and letting the volatile ingredients contained in the solution vaporize such that solid contents remain upon the substrate. At that time, the substrate 14 is installed on the substrate support bench 13 as shown in FIG. 2, which is installed in a flat state when forming a device by jetting solution. The state thereof after completion is shown in FIG. 51.

Such functional device mounting board is subsequently used as a functional device such as a display or transistor or the like according to application thereof. Furthermore, in some cases it may be manufactured largely and then cut into small sizes before utilization. Here, an example of manufacturing an organic EL display, for example, is described.

Figure 51:
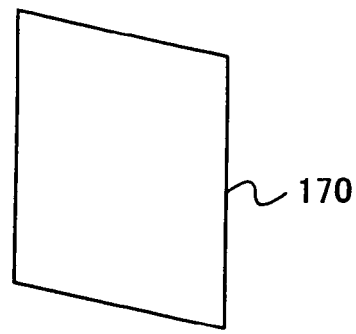
FIG. 51 illustrates an example of the organic EL display board fabricated by the fabrication apparatus according to the invention, which is used in a flat state.
Figure 52:
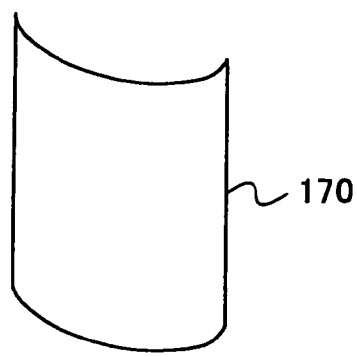
FIG. 52 illustrates an example of the organic EL display board, which is bent in a convex state toward the viewer.

FIG. 51 is a diagram for typically illustrating a display substrate 170 upon which organic EL devices of the present invention are formed, and which is manufactured by an apparatus such as shown in FIG. 2. This display is assumed to be viewed along the direction indicated by the arrow in the drawing. To begin with, as shown in FIG. 51, an organic EL display substrate 170 is manufactured. It is then used in a curved state by utilizing the flexibility of the substrate so as to appear convex when viewed in the direction as shown in FIG. 52, for example. Alternatively, it is used in a curved state so as to appear concave when viewed in the direction as shown in FIG. 53.

Whether to make convex or concave is determined depending on application and actual use. For example, in the case where such organic EL display substrate of the present invention is used as an advertising board in a spacious area, it should be made convex as shown in FIG. 52 in order to be seen wider angles.

Figure 53:
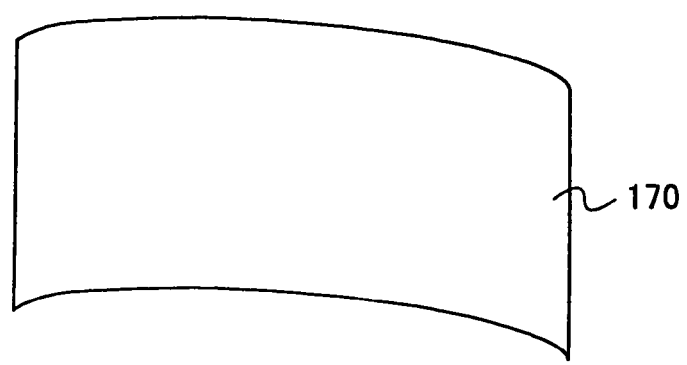
FIG. 53 illustrates an example of the organic EL display board, which is bent in a concave state with respect to the viewer.

Furthermore, in the case where such display is made large and used so as to be easily seen by people gathered in a specified area, it should be made concave as shown in FIG. 53.

In either case, during manufacturing, the functional device mounting board of the present invention is manufactured in a plain plate form, and is then curved in such manner for utilization.

At that time, to use a substrate that was originally in a plain plate form to begin with as a curved plate, a means to maintain that substrate constantly curved is necessary. With the present invention, that status can be maintained by using, for example, a curve holding guide provided as a holding means for holding the functional device mounting board of the present invention.

Figure 54A:
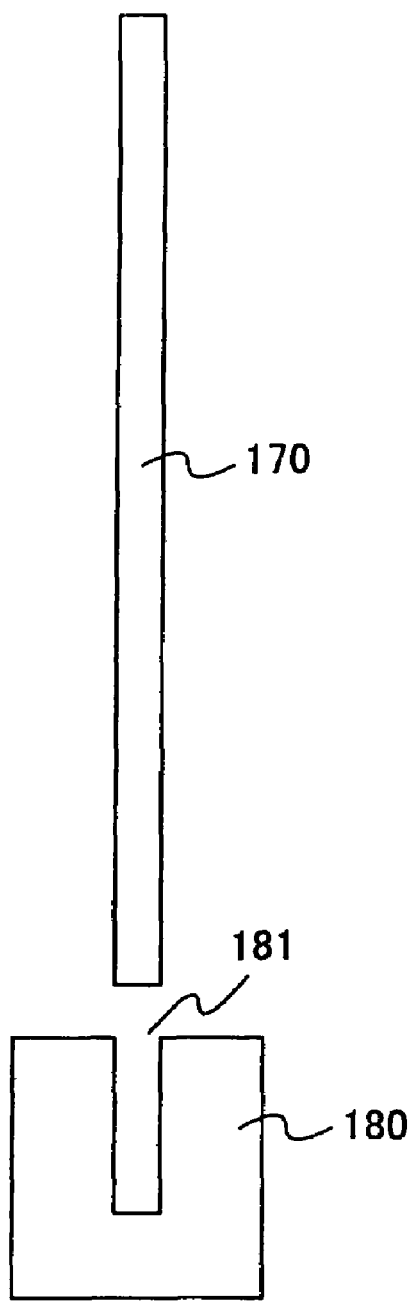
FIG. 54A and FIG. 54B illustrate how the organic EL display board is held by a guide having a curved guide groove.
Figure 54B:
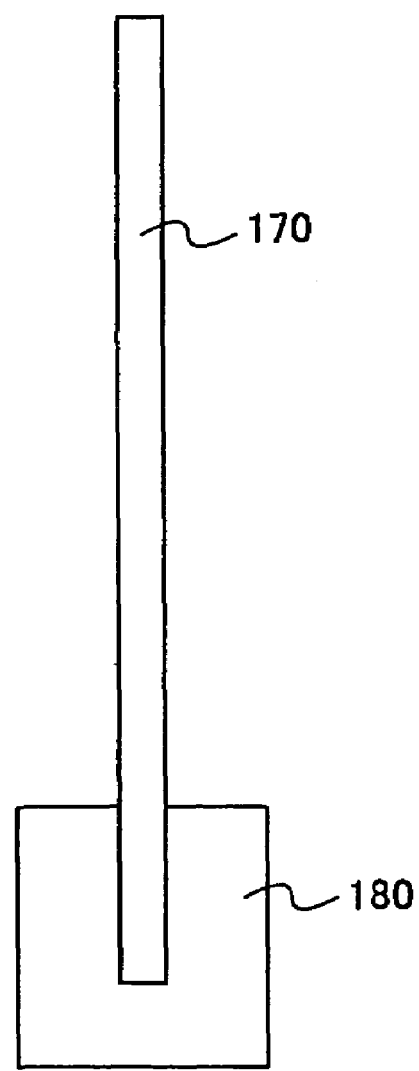

FIG. 54 is a diagram for describing the aforementioned curve holding guide. FIG. 54(A) shows a state prior to where the organic EL display substrate 170 is held in a guiding groove 181 of a guide member 180, while FIG. 54(B) shows a state where the organic EL display substrate 170 is inserted into the guiding groove 181. Furthermore, this guiding groove 181 is bent in the vertical direction (direction along the depth) of the paper surface, and is able to achieve such curved states as shown in FIG. 52 or FIG. 53.

It should be noted that for simplification, only the lower portion of the guide member is given in the example of FIG. 54, however, the curved state is actually maintained by installing such kind of guide member to the lower and upper portions. Furthermore, these upper and lower guide members are linked with left and right holding members (not shown in the drawing) that provide support in the vertical direction so as to form a frame structure that surrounds and supports the contour of the organic EL display substrate of the present invention, and form such curved state.

As another possible method for forming a curved state, for example, installing a support on the back surface of the organic EL display substrate of the present invention, and then bending that support so the organic EL display substrate copies thereafter may be considered.

An alternative method is to bend the wall and set the organic EL display substrate 170 of the present invention thereat such that it curves after that wall. Irrespective of structure, with the present invention, the flexibility of the substrate 170 allows that curved state to be easily achieved.

Next, yet another feature of the present invention is described. As described thus far, by deploying a transparent cover plate made of glass or plastic or the like opposite to the functional device mounting board (for example, an organic EL display substrate) of the present invention and then casing (packaging) them, a self-luminous image display, device may be achieved.

Figure 55A:
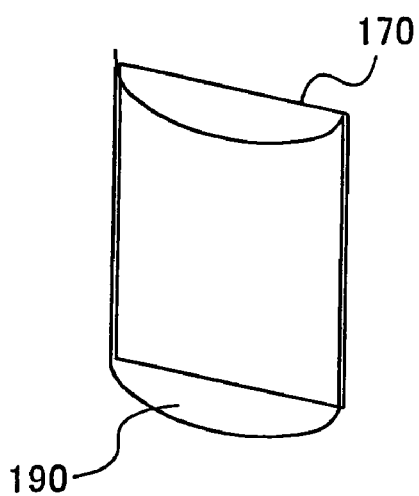
FIG. 55A and FIG. 55B illustrate examples of the combination of the organic EL display board and the cover plate.

FIG. 55 is a diagram illustrating the aforementioned cover plate. FIG. 55(A) shows an example where a cover plate 190 is bent so as to appear convex when viewed from the direction (indicated by an arrow in the drawing) that the display 170 (for example, an organic EL display substrate) is viewed. By this means, unwanted light (sunlight, fluorescent light, unwanted reflected light slanting in from a window, and the like) and unwanted reflected images for the display that reflect against the cover plate surface can be reduced even if not removed since the cover plate surface is convex, thus realizing a more eye-friendly display.

Figure 55B:
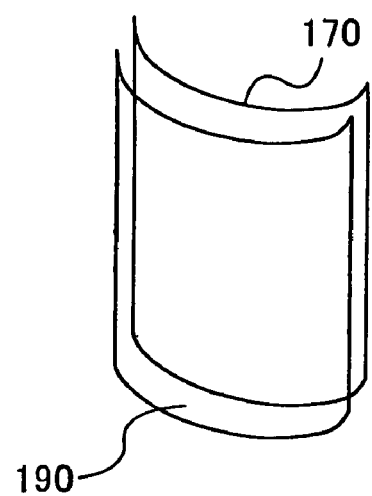

As described thus far, FIG. 55(B) shows an example where the cover plate 190 is bent in accordance with the display 170, which has been bent utilizing the flexibility of the substrate of the present invention.

Such curved cover plate 190 is formed of glass or plastic or the like, and manufactured by molding glass or plastic in a state that has been curved with that curvature in advance.

Alternatively, similar to the functional device mounting board of the present invention, various plastic substrates including PET or a polymer-based film may be bent utilizing their flexibility.

In such case, such a state can be maintained by means of the aforementioned curve holding guide, which is used to bend and hold the functional device mounting board. Namely, there are two rows of guiding grooves made of the guide member shown in FIG. 54, and should hold the functional device mounting board (display substrate) and cover plate.

It should be noted that two rows of guide groove are not necessarily required, where a single guide groove may hold the functional device mounting board (display substrate) and cover plate through close contact. A spacer may alternatively be interposed to make a little space therebetween.

Incidentally, the example where droplets are jet and applied to the barrier wall 3 is illustrated in FIG. 1 at the beginning, however, such kind of barrier wall 3 shown in FIG. 1 is not necessarily required for forming the functional device group of the present invention, and the bottom line is that electrode patterns can be directly formed on the flat plate substrate, or functional devices can be formed by applying droplets. Furthermore, FIG. 4 shows a diagram where droplets are jet obliquely to the substrate surface. This diagram was illustrated to show droplets jetting obliquely in this manner to show both the detection optical system 32 and jet head 33 in the drawing, however, droplets are actually jet and applied so as to hit the substrate almost vertically.

The description thus far is focused on the case where a light-emitting device is formed as the functional device, however, the formed light-emitting device substrate is subsequently utilized as a display device by deploying opposite to the transparent cover plate made of glass or plastic or the like, and then casing (packaging) them.

Application is not limited only to the display apparatuses. An organic transistor or the like is suitably manufactured as a functional device by utilizing the means of the present invention. Furthermore, a functional device group can be manufactured on a large functional device mounting board and then be subsequently made into small functional device mounting boards or be cut into small chips before utilization. Moreover, the present invention can also be applied in the case where a resist pattern or resist material is used to form a three-dimensional structure by means of the use of resist material or the like as the jet solution. In this case, a functional device of the present invention may be a film pattern or even a three-dimensional structure formed with a resin material such as this kind of resist material.

Furthermore, a solution, in which minute metal particles (with diameter of 0.001 µm to 1 µm) of Au or Ag or the like are dispersed in the organic solvent, can also be used as a solution containing a functional material. Such solution is preferably used for forming an aforementioned light-emitting device or an electrode pattern in an organic transistor or the like.

The functional device mounting board fabrication apparatus ejects and applies droplets of a solution containing a functional material onto a substrate, and lets volatile ingredients of the solution vaporize, while allowing the solid contents remaining on the substrate to form a functional device on the substrate. Since the droplet ejection area of the jet head can be set larger than the functional device forming area of the substrate, another pattern can be formed outside the functional device forming area, by ejecting and applying the droplets of solution onto the area outside the functional device forming area.

With the fabrication apparatus for the functional device mounting board that is used for an image display device, the region wherein the functional device group is formed is arranged at a fixed distance from the solution ejecting surface of the jet head, and since droplet application of a solution that includes functional material is performed by merely performing relative displacement of the functional device mounting board and jet head in parallel to a functional device mounting board surface, or in two mutually orthogonal directions, such functional device mounting board can be manufactured with high-precision in a simple configuration.

The jet head ejects the solution making use of an acting force created by mechanical displacement. The jet head produces a droplet so that the droplet becomes almost spherical immediately before it reaches the substrate. Alternatively, the droplet is controlled so that even if it is elongated in the direction of the flying path, the length of the droplet does not exceed three times the diameter, and no liquid particles or minute droplets follow the flying droplet. Accordingly, a high-quality functional device and a high-quality functional device mounting board can be obtained without undesirable adhesion of liquid particles.

A jet head is mounted on a carriage that faces the substrate and is movable relative to the substrate. During the motion of the carriage, the distance between the droplet ejecting surface of the jet aperture and the top surface of the substrate is maintained constant. With this simple configuration, the jet head ejects droplets onto the substrate to form a functional device mounting board.

The thickness of the substrate installed in a fabrication apparatus for a functional device mounting board is set to the range between 2 mm and 15 mm. The substrate holder holds the substrate so as to be horizontal with a surface on which the droplets are applied upward. Accordingly, a group of functional devices can be formed precisely with a simple structure.

The substrate positioning/holding means is capable of angle adjustment. This arrangement also contributes to fabrication of a group of functional devices formed on the substrate at high precision, and a high-quality functional device mounting board can be provided with a simple configuration.

The jet head is positioned above the substrate on which a functional device is to be formed. The jet head is moved by carriage scanning with respect to the substrate with a constant distance between the jet head and the substrate, while ejecting droplets downward to the substrate. The constant distance is set between 0.1 mm and 10 mm. With this arrangement, stable ejecting operation is realized with a simple structure, and highly precise positioning of the droplet on the substrate is achieved.

The solution supplied to the jet head is retained in a container provided independently of the jet head, the container and jet head are linked via a flexible supply path and the container is deployed lower than the substrate. Therefore, if by chance the solution leaks from such container, the solution does not contaminate the substrate or the region wherein the substrate is held in the fabrication apparatus since the solution flows only below the region wherein the substrate is set. Particularly, accidents of solution leakage occur only in the lower portion so that damage to the fabrication apparatus can be kept to a minimum. Furthermore, even if such accident occurs during manufacturing the substrate (during jetting), manufacturing of the substrate can be continued and the problem handled later. Accordingly, the substrate is not contaminated in the middle of manufacture nor is the process interrupted so that a partially manufactured substrate is not wasted.

Solution is supplied to the fabrication apparatus simply by replacing the empty container cartridge with a new one. The cartridge is changed easily, without causing contamination interior or exterior of the fabrication apparatus.

A pump is arranged between the jet head and the container, and a large quantity of solution is transported appropriately, preventing shortage of the solution. Ink is generally supplied based on principles of the capillary phenomenon in an inkjet printer, without any particular mechanical force externally applied. However, with the industrial fabrication apparatus, such as that proposed by the present invention, a large quantity of solution is consumed during the fabrication, and therefore, solution supply based on the capillary phenomenon is insufficient. If the solution is supplied based only on the capillary phenomenon in the industrial fabrication apparatus, the drive frequency (frequency at which solution is ejected) of the jet head must be reduced. This results in decreased manufacturing efficiency. To overcome this problem, a pump is employed to supply adequate quantity of solution, preventing the fabrication efficiency from falling. Even if the container is placed under the substrate (or under the jet head) for unexpected accident, adequate quantity of solution can be supplied by the pump from the container located at a lower position.

The solution supplied to the jet head is retained in a container provided independently of the jet head, and the container and jet head are linked via a flexible supply path as well as at least two types of filters are provided further downstream than the container. Among these filters, the filter provided at bottom stream is made un-detachable so as to eliminate foreign particles flowing to the nozzle portion in the jet head that is further downstream than that filter and induce clogging.

The most downstream filter is provided within the jet head, and the filter mesh size of the most downstream filter is greater than that of the other filter(s) provided upstream. This arrangement prevents the solution from clogging at the downstream filter, which is easy to be clogged, thereby guaranteeing stable operation.

The most-downstream filter is provided within the jet head, and has a filter trap capacity smaller than that of the other filter(s) provided upstream. This arrangement allows the jet head unit to be made compact because the most-downstream filter is small, while maintaining the clog preventing function.

Maintenance equipment is provided outside the substrate setting area. When the jet head is not used, the maintenance equipment caps the droplet ejecting surface (in which nozzle apertures are formed), and evacuates the solution out of the jet head. This arrangement prevents the jet head from clogging, and maintains the jet head in good conditions, thereby guaranteeing stable operation, without impairing the functionality of the fabrication apparatus or the manufacture efficiency.

The angle or the orientation of the jet head is adjustable with respect to the ejecting direction. When the jet head is not used, the jet head is pivoted or turned toward the maintenance equipment so as to face the maintenance equipment. This arrangement allows the fabrication apparatus to be made compact, while maintaining the jet head in good condition. Accordingly, clogging of solution in the jet head is prevented, and reliable and stable operation can be guaranteed.

A quantity of solution suctioned by the maintenance equipment is equivalent to at least the internal volume of the regions extending further downstream the most-downstream filter. Consequently, stable operation of the apparatus can be maintained without causing clogging in the jet head, by the low-cost and short-time maintenance operation.

The ejection means (jet head unit) for ejecting a solution containing a functional material onto the substrate can be comprised of a plurality of multi-nozzle jet heads that ejects different types of solutions independently of each other. In the jet head unit, the nozzles for ejecting the respective solutions are arranged separately from each other. The jet head unit is mounted on the carried so as to face the substrate. The direction of the nozzle array is non-parallel to the carriage scanning direction when the jet head unit ejects droplets onto the substrate during the carriage scanning. This arrangement realizes a novel and compact fabrication apparatus which is capable of fabricating a high-performance functional device mounting board efficiently at a low cost.

Since the jet velocity of the solution is set faster than the relative moving velocity between the jet head and the substrate, a functional device mounting board having a precise pattern of functional device array can be manufactured without deformation of the functional devices.

Since the jet velocity of the solution is set faster than the carriage scanning velocity, a highly precise functional device mounting board can be manufactured without deformation of the functional devices.

A single device can be formed by a plurality of droplets ejected from the multi-nozzle type jet head in order to efficiently form a group of precise pattern of functional devices.

Since the ejection velocity of the droplet ejected form the jet head is set within a prescribed range, stable ejecting operation is realized and the positioning accuracy of droplet is improved. Moreover, since a droplet reaches the substrate overlapping the previous droplet at an appropriate velocity, undesirable droplet mist will not be generated, without causing stains on the substrate. Thus, a pattern of functional device can be formed precisely, without variation in device performance among the devices.

In a manufacturing system using a fabrication apparatus for fabricating a functional device mounting board, droplets are ejected by an inkjet mounted on a carriage onto the substrate, while keeping the droplet application space on and near the substrate clean with a simple configuration.

In this manufacturing system, the fabrication apparatus is placed in a room in which an air cleaning system is operating in order to keep the droplet application space clean. Therefore, even with a simple configuration, defective devices due to adhesion of undesirable particles or dust can be significantly reduced, and a high-quality functional device array can be fabricated at high yield.

In this system, the ejection velocity of droplet is set faster than the velocity of the gas flow supplied from the air cleaning system. Consequently, a functional device mounting board can be fabricated at high precision, without causing deformation.

A functional device mounting board has a matrix of functional devices formed by ejecting droplet of solution containing a functional material onto a substrate, and letting volatile ingredients vaporize, while allowing solid components to remain on the substrate. The functional device mounting board has two mutually orthogonal sides. The two mutually orthogonal directions of the functional device matrix are set parallel to the two mutually orthogonal sides of the substrate. By simply positioning the sides of the substrate, the positional offset (or shift) in the horizontal or vertical direction, as well as rotational offset, of the functional device forming the matrix can be eliminated. Consequently, a highly precise functional device mounting board can be obtained.

With the functional device mounting board, functional devices of strip patterns are arrayed in a matrix, so that the lines and columns of the strip-shaped functional device are parallel to the mutually orthogonal sides of the matrix. Accordingly, by simply positioning the strip-shaped patterns, a matrix of functional devices can be formed on the substrate without rotational offset of the angle component or positional offset in the horizontal or vertical directions. Consequently, a highly precise functional device mounting board can be obtained.

By ejecting and applying solution droplets onto the area outside the functional device forming area of the substrates, a desired pattern, such as an identification pattern, a manufacture date, or a manufacturing number (product serial number), can be simultaneously formed during the formation of the functional devices. The resultant functional device mounting boards can be identified easily. A group of functional device mounting boards can also be distinguishable for each lot by forming a lot identification pattern on the substrate.

Particularly, forming a manufacture number or other patterns simultaneously with the formation of the functional devices is efficient because it does not require a separate imprinting process using specific tools or equipments, unlike the prior art techniques. This arrangement can also eliminate the problem of contamination, which is caused in the prior art technique when a subsequent imprinting process is carried out using specific equipment after the fabrication of the functional device mounting board.

In the functional device mounting board, forming a plurality of device electrode pairs on the outside of the functional device group formation regions together with jetting and applying droplets of a solution that include functional material between those device electrodes forms a pattern for checking the performance of the functional devices. This performance check can be performed after the functional device mounting board is manufactured, and since the performance check can be performed for only this pattern portion without checking the functional device groups, it is extremely efficient. Furthermore, for example, in a case where a light-emitting device is formed as the functional device, this pattern portion can be used for performing a performance check for the functional device mounting board before it is finally completed as an image display device and is therefore extremely efficient.

Since the solution that includes a plurality of functional material types is a solution wherein organic EL materials that emit different colors are dissolved, a functional device mounting board capable of color-light emission can be easily realized.

Since the surface roughness of the back surface is made rougher than the surface forming the functional device group of the functional device mounting board, a highly precise functional device group pattern can be formed, and substrate-manufacturing costs can be lowered.

Since the surface roughness of the surface forming the functional device group is set to 0.5 s or less, a highly precise functional device group pattern can formed and a high-performance functional device mounting board can be obtained.

Since the problem during manufacturing where the substrate back surface adheres to the fabrication apparatus during the manufacturing process of the functional device mounting board and thus cannot be moved may be avoided by making the surface roughness of the back surface be 1 s or greater, manufacturing yield is improved, and manufacturing costs are reduced.

Through providing linear forms on the back surface of the region where the functional device group is formed of the functional device mounting board so as to form a thin layer of air between the back surface and the substrate supporting table of the functional device mounting board fabrication apparatus, the situation has been avoided where the substrate adheres to the substrate supporting table of the functional device mounting board fabrication apparatus whereby becoming immobile while securing the substrate onto or removing it from the functional device mounting board fabrication apparatus during functional device mounting board manufacturing. Accordingly, smooth substrate removal as well as movement due to positioning, etc. becomes possible, and the manufacturing efficiency for the substrate can be significantly improved.

In particular, in the case where the substrate size is small (for instance, approximately 100 mm×100 mm), even if such difficulties (problems relating to sticking and being hard to move) develop, its elimination can be easily accomplished without requiring a significant amount of energy. However, in the case of a large size substrate (300 mm×300 mm or larger) to which the present invention can more effectively applied, although it is difficult to eliminate adherence once falling into an adhered state, or while trying to eliminate adherence the substrate becomes damaged or other accidents occurr, by physically providing a linear pattern on the back surface, and forming a thin layer of air between the back surface and the substrate support bench in the functional device mounting board manufacturing device, falling into an adhered state can be avoided, and it becomes possible to improve functional device mounting board manufacturing efficiency and eliminate damage-related accidents.

Since the two (vertical and horizontal) chamfered ridgeline portions are also chamfered at the right angle-forming portion, accidents where workers are injured at only that right angle portion during functional device mounting board manufacturing (during substrate transporting, exchanging, mounting onto the fabrication apparatus, and the like) may also be eliminated.

Since the shape of the substrate is made rectangular and the shape of the angular portion of at least one of the four corners is made to differ somewhat so as to be distinguishable from the other corners, the workers may identify substrate orientation during functional device mounting board manufacturing, allowing for accurate performance of substrate installation, improvement of substrate installation efficiency and significant reduction in operational errors.

Since the shape of the substrate is made rectangular and a notch in at least one side of the four sides is provided, workers may determine substrate orientation when manufacturing the functional device mounting board to make accurate substrate installation possible. In addition, not only is the worker able to verify substrate orientation, improve substrate installation efficiency, and significantly reduce operational errors, but also accurate substrate installation onto the fabrication apparatus and accurate substrate positioning have been made possible.

Since the ridgeline region that crosses with the front surface of a substrate becomes the cover plate, and surfaces along the thickness and perpendicular to that front surface are chamfered or the ridgeline region that crosses with a back surface of a substrate becomes the cover plate, and the surfaces along the thickness and perpendicular to that back surface are chamfered, accidents can be avoided such as workers cutting themselves during functional device mounting board manufacturing (during substrate transporting, exchanging, mounting onto the fabrication apparatus, and the like).

By implementing chamfering in the ridgeline portion, careless accidents by workers during functional device mounting board manufacturing can be prevented, and in addition, since the surface roughness of the chamfering portion is made rougher than the surface roughness of the surface of the region where the functional device group is formed, but not formed with high precision surface roughness as with the surface of the region where the functional device group is formed, low cost manufacture of the functional device mounting board becomes possible.

In other words, with the present invention, using a substrate where the surface roughness of the back surface is made rougher than the surface forming the functional device group of the substrate allows for a highly precise functional device group pattern to be formed, and substrate manufacturing costs can be reduced.

Since on the functional device mounting board, a single device of the functional device group is formed from a dot image with multiple liquid droplets applied on the substrate, dots neighboring in the two perpendicular directions overlap, and each of the distances between the centers of dots neighboring in the two perpendicular directions is equal to $1/\sqrt{2}$ ($\frac{1}{2}^{1/2}$) the dot diameter or less, the roughness level of the line pattern formed with a dot image is low so that a high accuracy functional device pattern can be formed, and favorable functional device properties without variance among devices can be provided.

Further, since all these dots neighboring in the vertical, horizontal, and angle direction are in contact with each other or overlap, there is no region where functional material is not applied in the functional device portions, and therefore a functional device mounting board with high precision functional devices are provided.

By using a flexible substrate, a flexible functional device mounting board may be produced a low cost.

Making use of such flexibility of the substrate, the functional device mounting board can be used in a curved state in actual use, which allows a wide variety of use of the functional device mounting board.

When the functional device mounting board is used in a curved state, it is held by a curving guide provided to the holding means that holds the functional device mounting board. The intended curved state is maintained with a simple configuration and thus applied for various uses.

Multiple species of solution containing different types of organic EL materials that emit different colors are used in the fabrication apparatus to fabricate a functional device mounting board having ability of color light emission.

Since highly precise functional device patterns can be formed with less variation among the devices can be assembled into in an image display device, a high-resolution image display apparatus can be achieved.

The edge lines along the sides of the top surface of the cover plate used in an image display apparatus are chamfered. Accordingly, when attaching the cover plate onto the functional device mounting board to assemble the image display apparatus, the workers are protected from unexpected accidents, such as cutting themselves at the edges of the glass plate.

The edge lines along the side of the rear surface of the cover plate may also be chamfered. This arrangement can also protect workers from unexpected accidents.

The edges of the cover plate used in the image display device are chamfered. Accordingly, the workers are protected from unexpected accidents during the assembling process of image display apparatuses. Since the surface roughness of the chamfered portion is set greater than that of the top and rear surfaces of the substrate, without strict control on the degree of roughness, the cost of the substrate can be kept low. Consequently, the manufacturing cost of the image display apparatus can also be maintained low.

A highly precise functional device mounting board is covered with a cover plate. Since the cover plate is thicker than the functional device mounting device, a high-resolution image display with a mechanical strength can be provided.

Since reinforced glass is used for the cover plate of the image display, the display panel of the image display apparatus has mechanical strength so as to be hardly broken.

This patent application is based on and claims the benefit of the earlier filing dates of Japanese patent application No. 2002-068033 filed Mar. 13, 2002 and Japanese patent application No. 2002-316419 filed Oct. 30, 2002, the entire contents of which are hereby incorporated by reference.

What is claimed is:

1. A functional device mounting board fabricating system comprising:
   a fabrication apparatus; and
   a booth in which the fabrication apparatus is placed and a clean air supplying unit which supplies clean air around a substrate,
   wherein the fabrication apparatus comprises,
      a holder configured to support the substrate on which a functional device is to be formed, the substrate and the holder are configured to remain stationary with respect to the functional device mounting board fabrication system while a droplet containing a functional material is ejected onto the substrate;
      a jet head configured to eject the droplet onto the substrate so as to form the functional device, which functions under the application of voltage, in a functional device forming area of the substrate, by allowing a volatile ingredient of the droplet on the substrate to vaporize by heating process, while allowing a solid component to remain on the substrate; and
      a data input unit configured to supply droplet ejection information to the jet head, the jet head ejecting the droplet onto the substrate based on the droplet ejection information so as to form the functional device in the functional device forming area, wherein the droplet ejection speed of the jet head is faster than the relative moving speed between the jet head and the substrate and faster than a clean air flow speed supplied by the clean air supplying unit by 2 m/s or more.

2. The system of claim 1, wherein the jet head has a chamber containing a solution containing an organic electroluminescent material as the functional material.

3. The system of claim 2, wherein the jet head ejects the droplet to form an organic EL device on the substrate.

4. The system of claim 1, wherein the jet head has a chamber containing a solution containing an organic material used to form an organic transistor as the functional material.

5. The system of claim 1, wherein the jet head has a chamber containing a solution containing metal particles as the functional material.

6. The system of claim 5, wherein the jet head ejects the droplet to form an electrode pattern on the substrate.

7. The system of claim 1, wherein the jet head has a chamber containing a solution containing an electron-emitting material as the functional material.

8. The system of claim 1 further comprising an exchangeable cartridge containing a solution of the functional material.

9. The system of claim 8, wherein the exchangeable cartridge contains a solution of an organic electroluminescent material as the functional material.

10. The system of claim 8, wherein the exchangeable cartridge contains a solution of an organic material used to form an organic transistor as the functional material.

11. The system of claim 8, wherein the exchangeable cartridge contains a solution of metal particles as the functional material.

12. The system of claim 8, wherein the exchangeable cartridge contains a solution of an electron-emitting material as the functional material.

13. The system of claim 1, wherein the jet head is positioned at a distance of 0.1 mm to 10 mm from the substrate.

14. A functional device mounting board fabricating system comprising:
- a fabrication apparatus;
- a booth in which the fabrication apparatus is placed and a clean air supplying unit which supplies clean air around a substrate, said fabrication apparatus containing,
  - a holder configured to support the substrate on which a functional device is to be formed;
  - a first filter and a second filter; and
  - a jet head configured to eject a droplet containing a functional material onto the substrate so as to form the functional device, which functions under the application of voltage, in a functional device forming area of the substrate, by allowing a volatile ingredient of the droplet on the substrate to vaporize by heating process, while allowing a solid component to remain on the substrate, the jet head configured to pass the functional material through the first filter and the second filter before ejecting the functional material; and
- a data input unit configured to supply droplet ejection information to the jet head, the jet head ejecting the droplet onto the substrate based on the droplet ejection information so as to form the functional device in the functional device forming area, wherein the droplet ejection speed of the jet head is faster than the relative moving speed between the jet head and the substrate and faster than a clean air flow speed supplied by the clean air supplying unit by 2 m/s or more.

15. The functional device mounting board fabricating system according to claim 14, wherein the first filter is a membrane filter with a pore size of 0.45 μm.

16. The functional device mounting board fabricating system according to claim 14, wherein the second filter is a mesh filter with a pore size of 2 to 3 μm.

* * * * *